United States Patent [19]

Kosaka et al.

[11] 4,405,242
[45] Sep. 20, 1983

[54] ELECTRONIC DEVICE AND METHOD OF FABRICATING THE SAME

[75] Inventors: Hideki Kosaka, Kodaira; Tsutomu Mimata, Akikawa; Tsuyoshi Shimizu; Hideharu Yamamoto, both of Tokyo; Kaoru Itoh, Kodaira; Yasuhusa Shima, Sayama, all of Japan

[73] Assignee: Hitachi, Ltd., Tokyo, Japan

[21] Appl. No.: 315,155

[22] Filed: Oct. 26, 1981

Related U.S. Application Data

[62] Division of Ser. No. 916,923, Jun. 19, 1978, Pat. No. 4,348,751.

[30] Foreign Application Priority Data

| Jun. 20, 1977 | [JP] | Japan | 52-72041 |
| Aug. 10, 1977 | [JP] | Japan | 52-95020 |
| Aug. 10, 1977 | [JP] | Japan | 52-95021 |
| Aug. 10, 1977 | [JP] | Japan | 52-95022 |
| Dec. 9, 1977 | [JP] | Japan | 52-147084 |
| Dec. 19, 1977 | [JP] | Japan | 52-151762 |
| Dec. 19, 1977 | [JP] | Japan | 52-151763 |
| Dec. 23, 1977 | [JP] | Japan | 52-154442 |
| Dec. 23, 1977 | [JP] | Japan | 52-154443 |
| Dec. 23, 1977 | [JP] | Japan | 52-154480 |
| Jan. 20, 1978 | [JP] | Japan | 53-4365 |
| May 15, 1978 | [JP] | Japan | 53-56697 |

[51] Int. Cl.³ ............. G04C 19/00; G04C 23/02
[52] U.S. Cl. .................................. 368/82; 368/88
[58] Field of Search ........................ 368/82–84, 368/88, 87, 155, 156, 223, 276, 309, 319–321

[56] References Cited

U.S. PATENT DOCUMENTS

| 3,986,335 | 10/1976 | Harper | 368/276 |
| 4,051,665 | 10/1977 | Arn | 368/319 |
| 4,064,689 | 12/1977 | Yasuda et al. | 368/88 |
| 4,142,287 | 3/1979 | Grabe | 368/239 |
| 4,196,577 | 4/1980 | Ohno et al. | 368/82 |
| 4,232,515 | 11/1980 | Yoshikawa et al. | 368/82 |
| 4,238,848 | 12/1980 | Yamaguchi et al. | 368/276 |
| 4,272,841 | 6/1981 | Nickles | 368/88 |

*Primary Examiner*—Vit W. Miska
*Attorney, Agent, or Firm*—Antonelli, Terry & Wands

[57] ABSTRACT

An electronic device having an indicator element and a plurality of other electronic parts for electrically driving the indicator element compactly assembled one another, which includes, as fundamental structure, lead conductors for electrically connecting the indicator element and the electronic parts to one another, and resin member completely embedding the lead conductors except the electrical contact portions between each electronic part and the lead conductors and having sections for receiving the electronic parts. This invention may be applied to the module for an electronic wrist watch using the LCD indicator element to thereby enable easy and compact assembly of the indicator element and the other electronic parts into the module.

10 Claims, 111 Drawing Figures

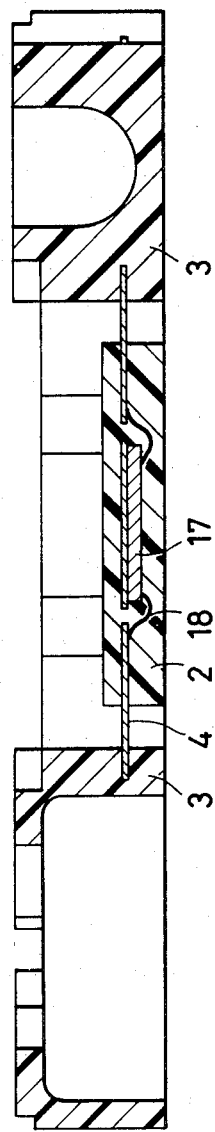
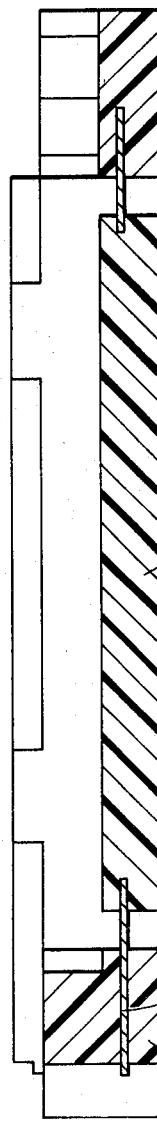
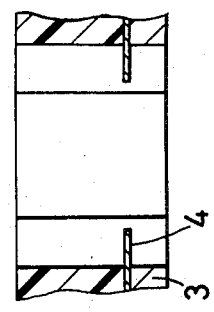
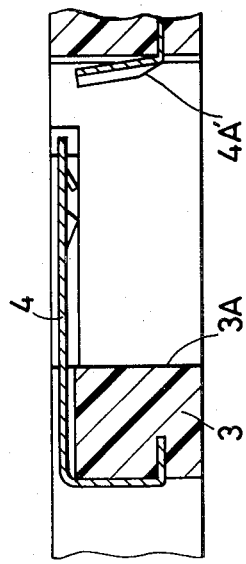

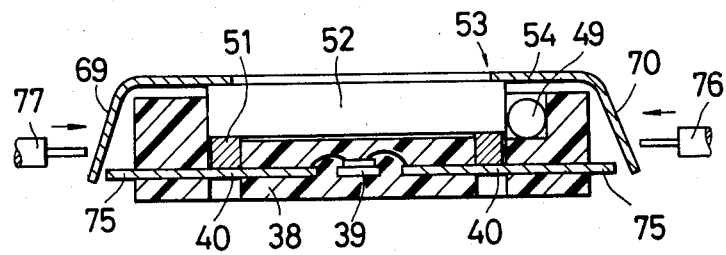
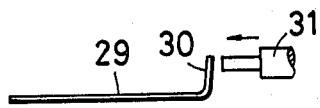
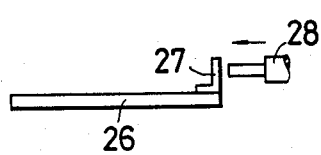
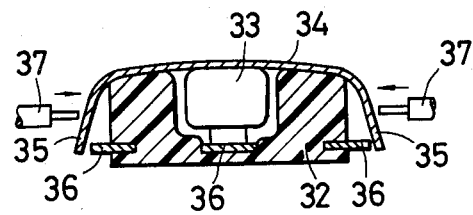
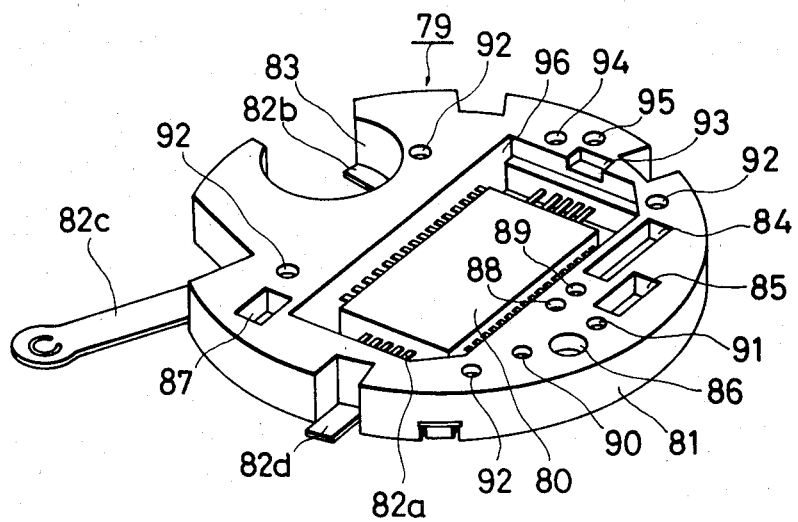

FIG. 73
FIG. 75
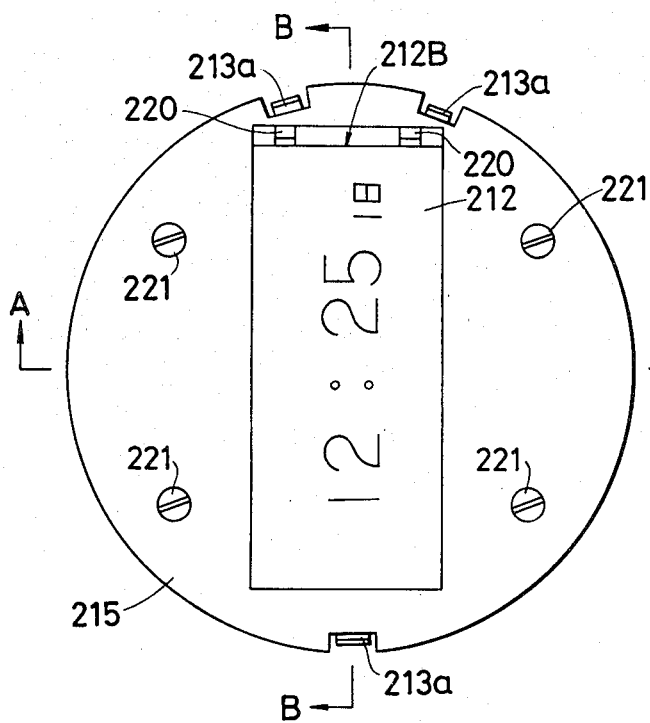
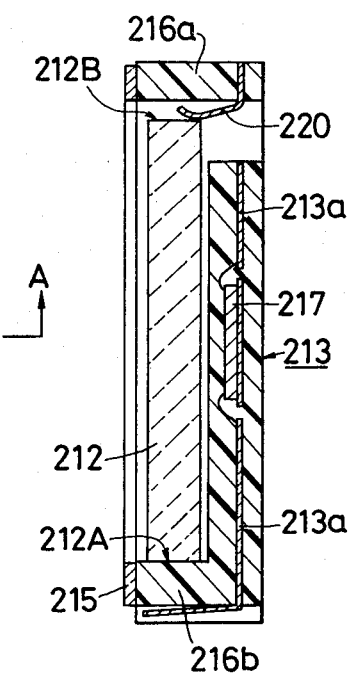
FIG. 74
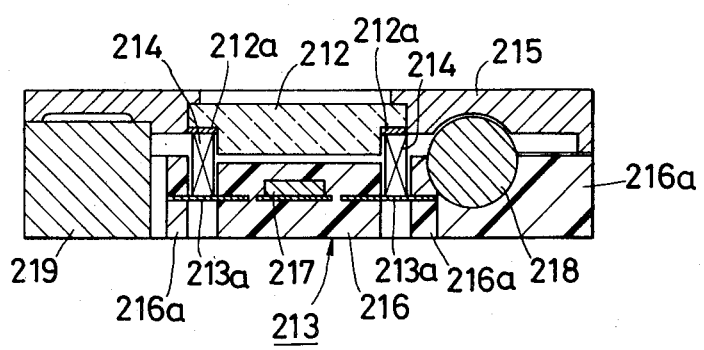

ELECTRONIC DEVICE AND METHOD OF FABRICATING THE SAME

This is a division of application Ser. No. 916,923, filed June 19, 1978 now U.S. Pat. No. 4,348,751.

DETAILED DESCRIPTION OF THE INVENTION

This invention relates to an electronic device assembled compactly in a small electronic watch and the like and the fabricating method thereof.

Generally in the electronic device like electronic watch a problem is encountered which concerns how to diminish a space occupied by the so-called module comprising indicator elements such as LCD, LED, etc. and electronic parts for driving them, such as semiconductors, capacitors, battery, etc. On the other hand, another problem is also encountered which concerns how to simplify the assembly of such electronic device or module and how to reduce the number of parts for the assembly of them.

Though, to overcome these problems, several attempts have been recently made which utilize effectively semiconductor integrated circuit element (hereinafter called IC) comprising a plurality of active and passive elements and interconnecting them therein, still said problems are presented to be overcome by various piled-up efforts.

For example, in an electronic watch using IC and disclosed in U.S. Pat. No. 3,986,335, IC is enclosed by resin and the resin enclosure is provided with a portion receiving electronic parts (LED as indicator element, crystal oscillator, variable capacitor and battery as power source) which are attached externally of IC. A compact module is made by electrically interconnecting these electronic parts and said IC with lead conductor.

This type of electronic watch, however, has defects which will be hereinafter described.

(1) In this type of module, LED is received into the cavity in the resin enclosure of IC from the surface side of the enclosure and other electronic parts such as crystal oscillator, variable capacitor and battery received from the rear side of the enclosure. Also the electronic parts attached externally of IC are inserted from both the front and rear sides of the resin enclosure of IC and the outside terminals of said electronic parts are fixedly soldered to the lead conductor on the opposite side to the inserted side.

Accordingly this type of module is disadvantageously constructed to complicate the mounting operation and increase the number of man-hour.

Also since this type of module is constructed to mount the externally attached electronic parts individually on the resin enclosure of IC, the inspection after assembly work consumes disadvantageously much time to provide many obstucles against massproduction, while high reliability products can not be produced at low cost.

The complexity of this type of assembly and the intricacy of the inspection work after the assembly apply similarly to the module for electronic watch of the type that ceramic wiring base plate is used and various electronic parts are received in a housing formed by ceramic and the like.

(2) Since each of said electronic parts in this type of module are large-sized, the area for receiving these parts is enlarged, resulting in the large size of the resin enclosure. Hence in the enclosure of IC in the resin and after the enclosure by resin, the stress produced by the thermal expansion coefficient difference between the resin of the electronic part receiving portion and the lead conductor and the thermal strain during the setting of resin is directly transmitted to IC to disadvantageously degrade the property and reliability of IC.

Also while this type of module needs for use high-reliability resin with excellent moisture proof, shock resistance, chemical stability, etc. for enclosing IC, the resin having this kind of property has disadvantageously inferior molding property and mold releasing property so that intricate-shaped mold for receiving intricate-shaped electronic parts can not be precisely worked nor provide molding property suitable for mass-production. On the other hand when resin for enclosure is used which has excellent mechanical strength, molding property and mold releasing property under the consideration of intricate-shaped mold for receiving electronic parts, the resin having these properties is inferior in the moisture proof and chemical stability so that it disadvantageously degrades the performance of IC. Hence the conventional type of module is difficult to have an enclosure satisfying said two contradictory requirements.

(3) In this type of module, when the indicator elements like LED, etc. are received in the cavity of resin enclosure of IC and connected electrically to the exposed lead conductor, an problem is encountered which makes the easy assembly of high reliability module difficult. Since the lead conductor is fixedly embedded only on one end in the resin enclosure of IC electrically connected to the outside terminal of the indicator elements like LED, etc. and is floated on the other end (in a cantilever condition), its mechanical strength is to low that it may be disadvantageously bent, misaligned, make this kind of work difficult or even cut off when the indicator elements like LED, etc. are mounted on it to be adhered to ohmic by press-bonding or soldering for electric connection to the external terminal.

Also when LCD capable of indicating time at any time with small power consumption is built in as indicator element for this kind of IC resin enclosure, LCD disadvantageously can not be integrated into module as indicator element since the lead conductor electrically connected to the external terminal of LCD is in the cantilever condition with low mechanical strength and further displaced from each proper position. Since LCD is different from LED in the problem of life, the bonding of ohmic to the lead conductor in the resin enclosure by soldering and the like as in the case of LED needs to be avoided, when LCD is applied to this type of module. It is necessary to interconnect them electrically through an elastic conductor like zebra-connector with mechanical pressure (depressing force) for permitting the replacement by new LCD after the life of old one. However in the mounting of LCD with such depressing force, each lead conductor in the resin enclosure is in the cantilever condition, has bad flatness and is bent by the depressing force so that the indicator element like LCD disadvantageously cannot be built in with high-reliability ohmic contact.

Also since the conventional type of module needs a large space for receiving indicator element like said LED, it provides an obstucle against obtaining compact module.

(4) Since this type of module has said electronic parts which are respectively large-sized, the area for receiving these parts is enlarged, resulting in said large-sized resin enclosure. Hence during and after the enclosure of IC by resin the stress caused by the thermal expansion coefficient difference between the resin portion receiving electronic parts and the lead conductor and the thermal strain in the setting of resin is disadvantageously transmitted directly to IC and degrades the property and reliability of IC.

Also this type of module for use needs to have high reliability in moisture proof, shock resistance, chemical stability, etc as resin for enclosing IC. However the resin having these kinds of properties is inferior in molding property and mold releasing property so that the intricate-shaped mold formed by the resin disadvantageously cannot be precisely worked for receiving intricate-shaped electronic parts nor provide moulding property suited for massproduction. On the other hand when resin having the excellent molding property and mold releasing property is used for enclosure under the consideration of intricate-shaped mold for receiving electronic parts, the resin having these properties is inferior in the moisture proof and chemical stability so that it degrades disadvantageously the performance of IC. Accordingly it is difficult for the conventional type of module to obtain the enclosure which satisfies said two contradictory requirements.

(5) This type of electronic watch receives in its case the module integrally and electrically interconnecting LED and IC, battery, capacitor, crystal oscillator, etc for driving LED.

However, since the module is completely separated from the case made of metal, plastics or the like in this type of watch, the whole size of the watch, particularly the thickness thereof, is enlarged, while the weight and cost are increased.

As countermeasure against these defects a proposal has been presented in which the frame of the module and the case of watch are formed by resin and integrated with each other.

However in this type of watch a block receiving the enclosure of IC chip and the externally mounted electronic parts such as capacitor, battery, crystal oscillator, etc. and the case of watch are formed by the same resin so that the resin for enclosing the IC chip needs to have high reliability in moisture proof, shock resistance, etc. On the other hand the resin satisfying these kinds of properties is inferior in molding property and mold releasing property so that the block receiving intricate-shaped electronic parts and the case of watch can not be precisely worked and disadvantageously the molding property suited for mass-production is not obtained. Further when resin superior in molding property and mold releasing property is used under the consideration of the intricate-shaped mold for the block and the case of watch, the resin satisfying these properties is inferior in moisture proof and chemical property and disadvantageously degrades the performance of IC. Accordingly it is difficult for the conventional type of electronic watch to obtain the resin which satisfies said two contradictory requirements and it is impossible to obtain high performance and high reliability resin.

Accordingly the object of this invention is provide a new electronic device for electronic watch and the like and the fabricating method thereof which overcome at least one of said prior disadvantages (1) to (5).

Hereinafter this invention will be detailed concretely with reference to the preferred embodiments.

FIGS. 4 to 14 are respective sectional views of the package as viewed in the direction of arrows of FIG. 2.

FIG. 35 is a sectional view of main portions similar to FIG. 34.

FIG. 36(*a*), (*b*) are explanatory views showing switch portion of liquid crystal display type of electronic watch.

FIG. 37 is a sectional view of main portions showing the switch portion and battery fixing portion in an embodiment of luminous diode type of electronic watch.

FIG. 38 is a perspective view showing the package in an electronic watch of an embodiment of this invention.

FIGS. 39 to 45 are plan views or rear views showing the process for fabricating the package according to this invention.

Figure 46:
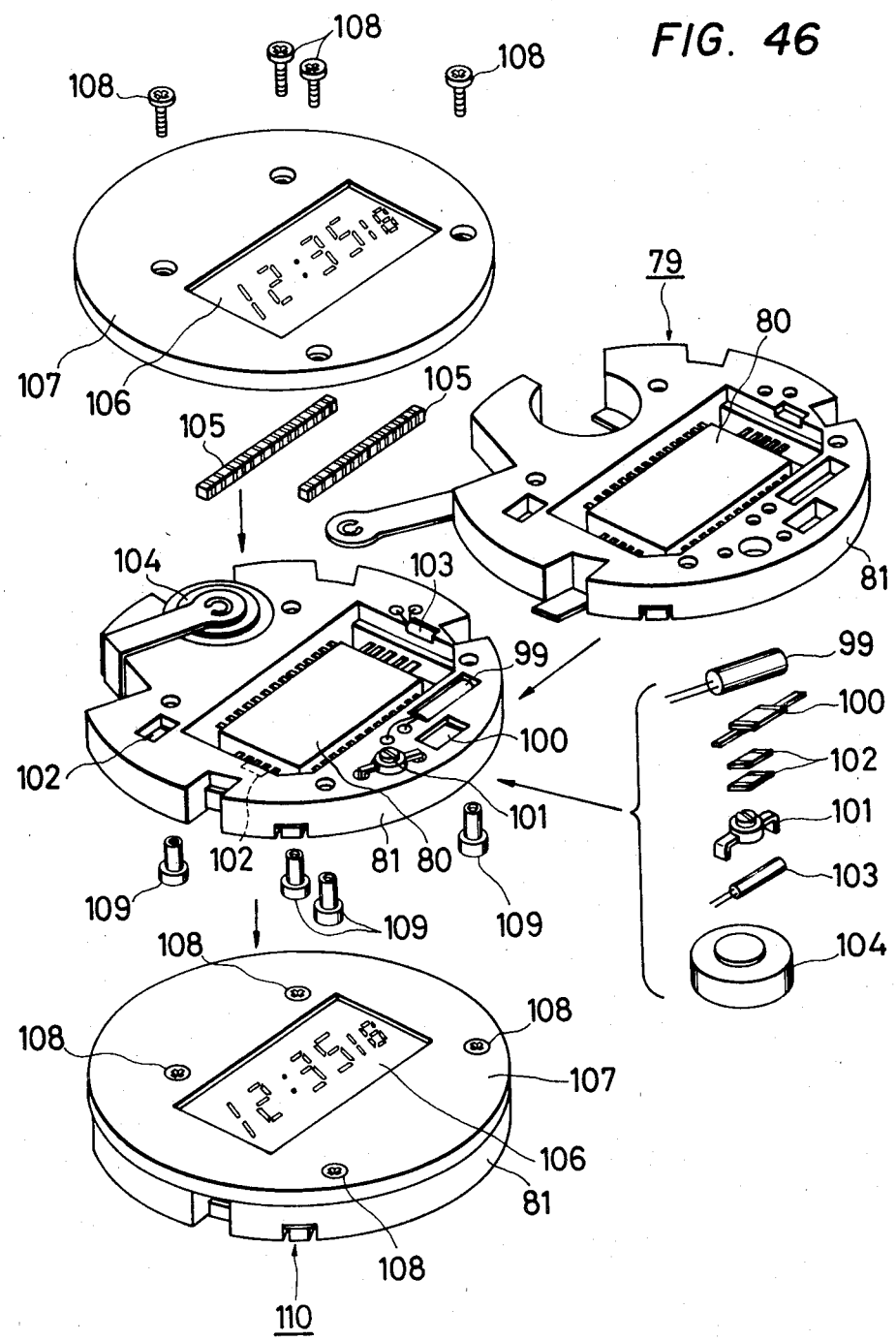

FIG. 46 is a schematic assembly drawing showing the assembly of electronic watch (module) according to this invention.

Figure 47:
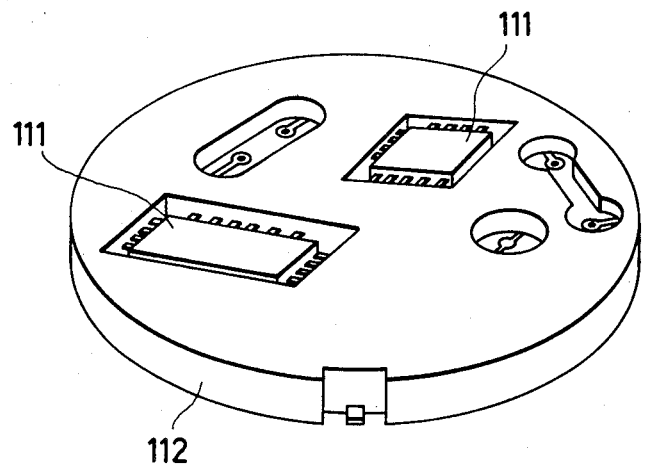
Figure 48:
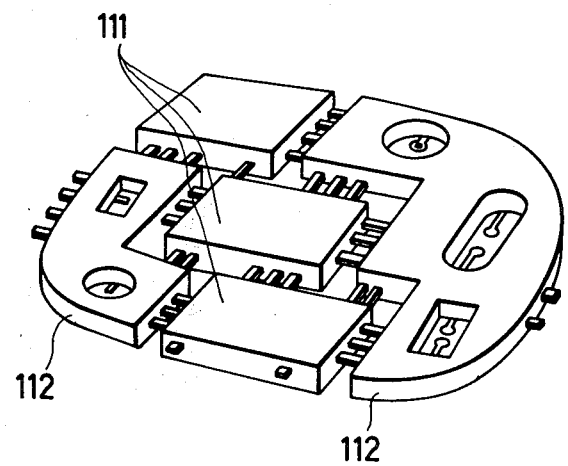
Figure 49:
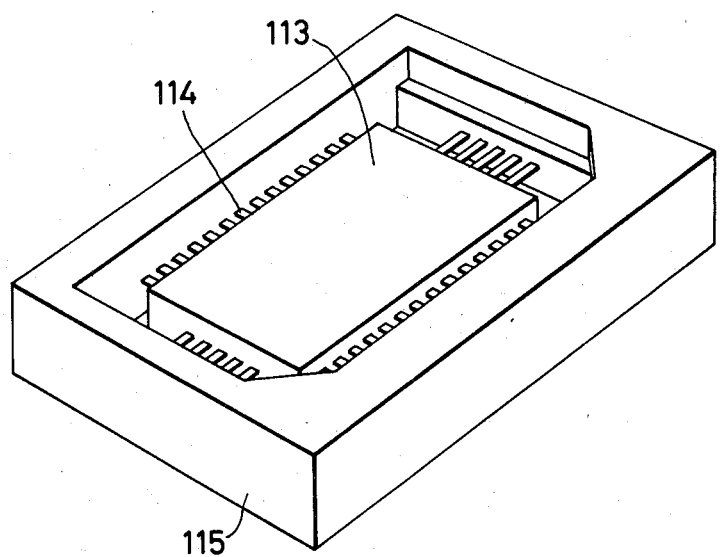

FIGS. 47 to 49 are schematic perspective views showing other embodiments of this invention.

Figure 50:
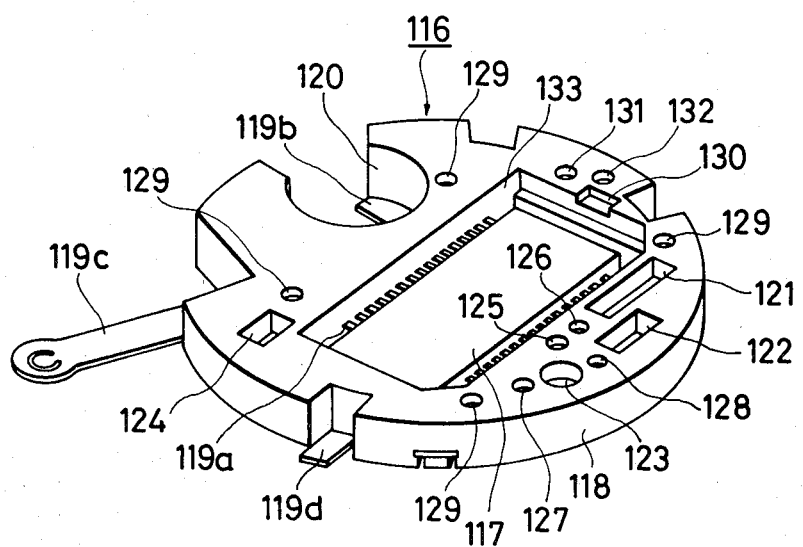
Figure 56:
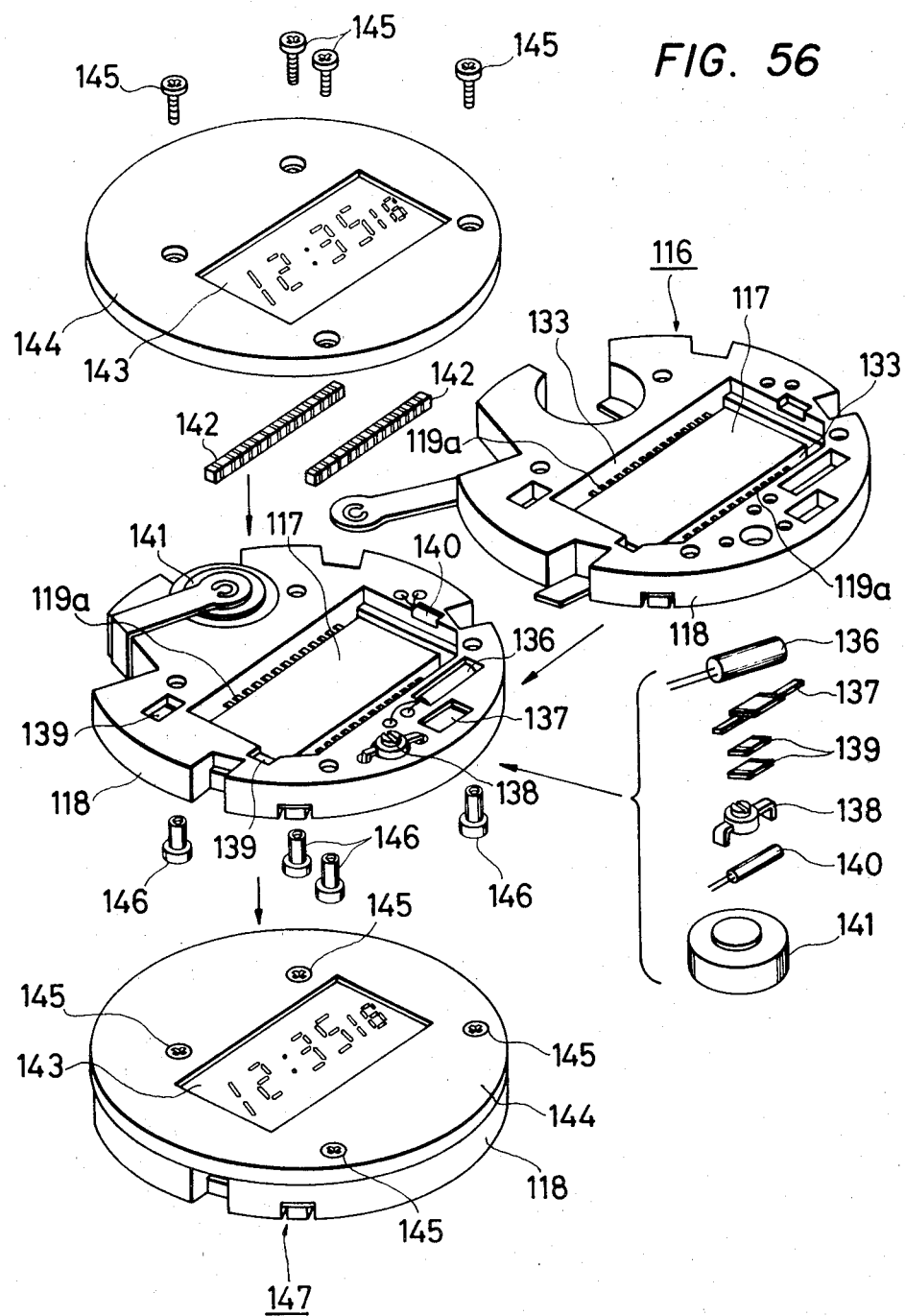
Figure 57:
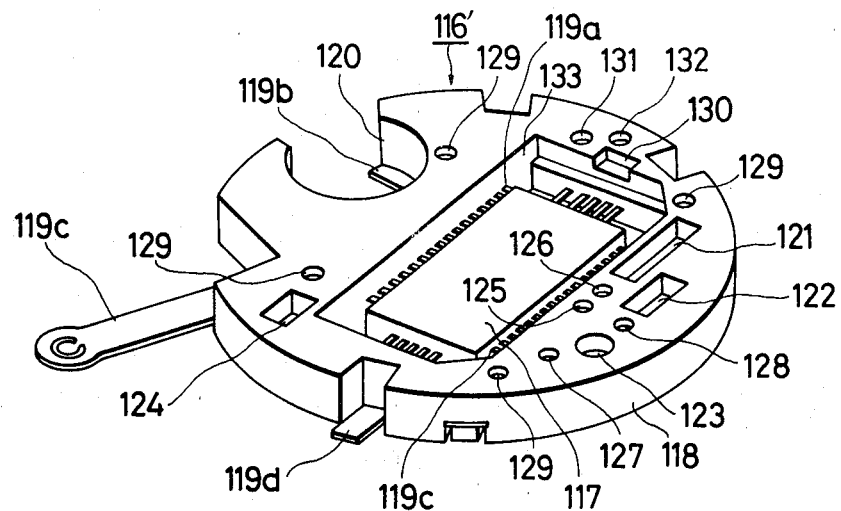
Figure 58:
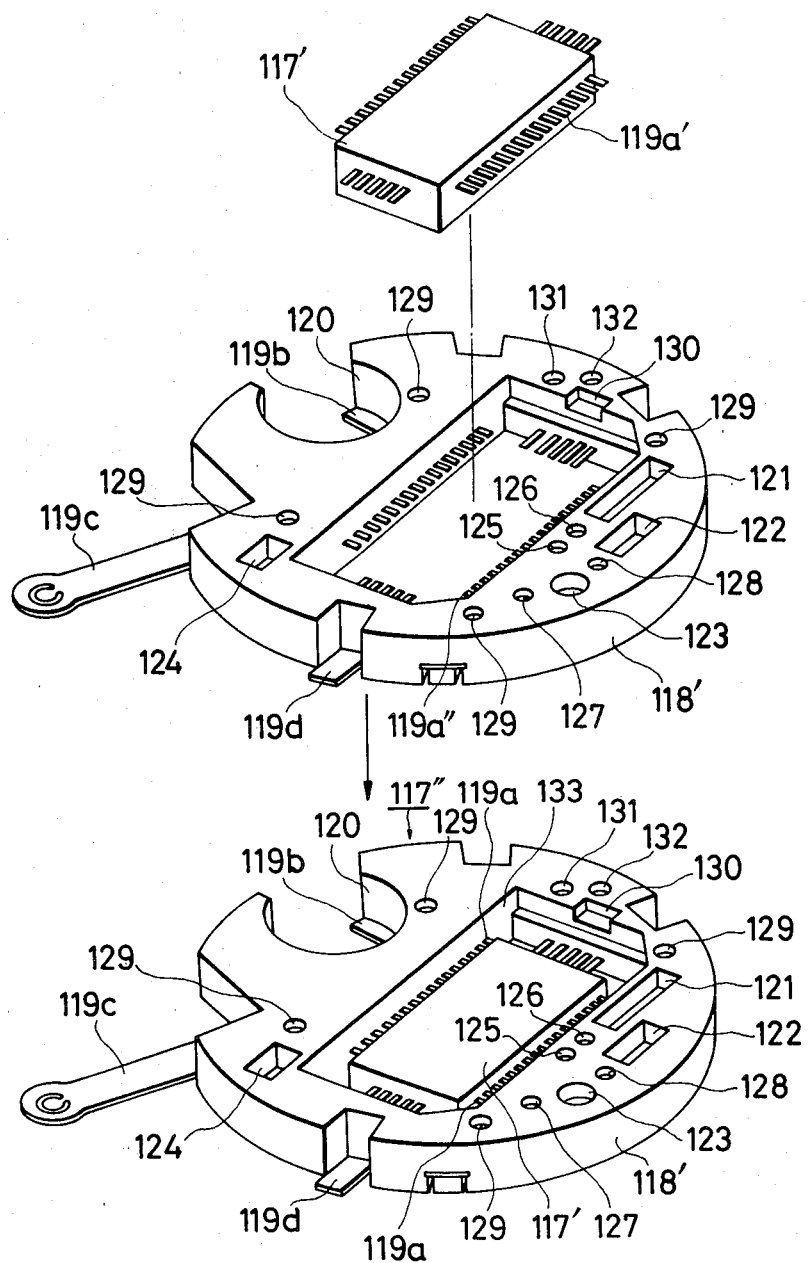

FIGS. 50 to 56 and 57 to 58 are explanatory views of electronic watch according to this invention, FIG. 50 being a perspective view showing package, FIGS. 51 to 55 being plan views or rear views showing the process for fabricating the package, FIG. 56 a schematic assembly drawing showing the assembly of module for electronic watch and FIGS. 57 and 58 schematic perspective views showing other embodiments of this invention.

Figure 59:
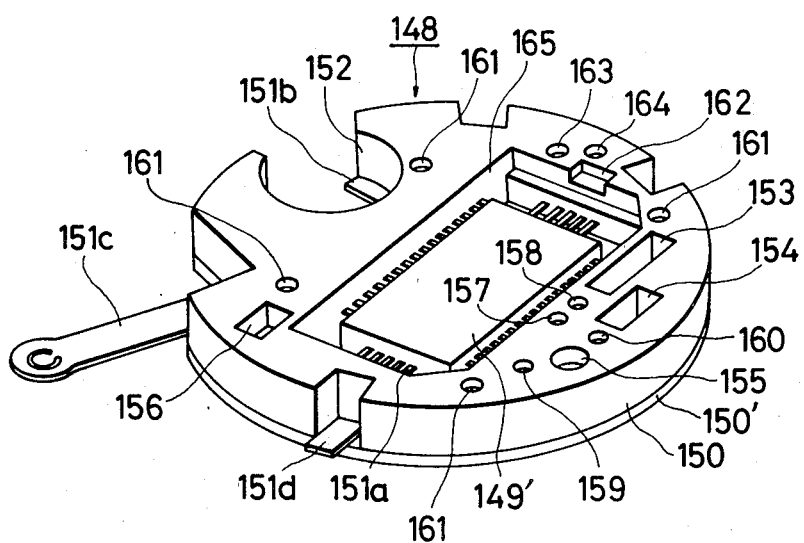

FIG. 59 is a perspective view showing the package in the electronic watch on an embodiment of this invention.

FIGS. 60 to 63 are plan views by process showing the fabricating method of IC having lead frame according to this invention.

Figure 64:
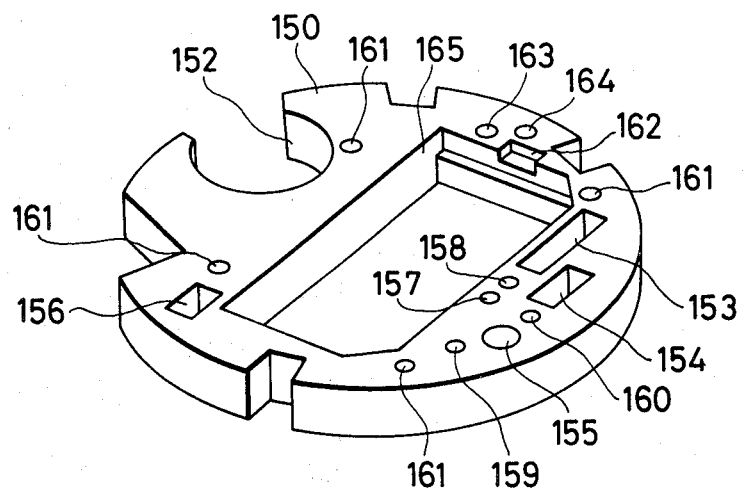

FIG. 64 is a perspective view showing the upper surface resin block according to this invention.

Figure 65:
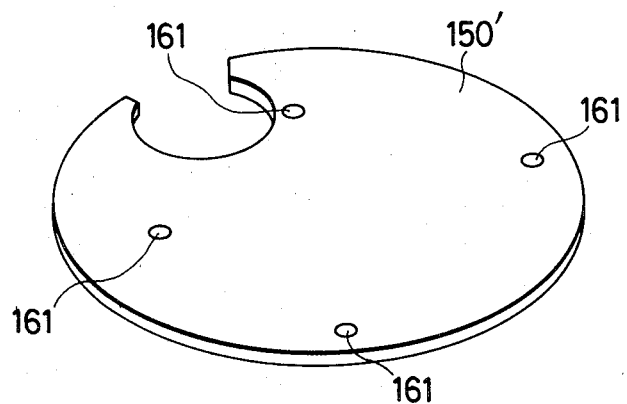

FIG. 65 is a perspective view showing the lower surface resin block according to this invention.

Figure 66:
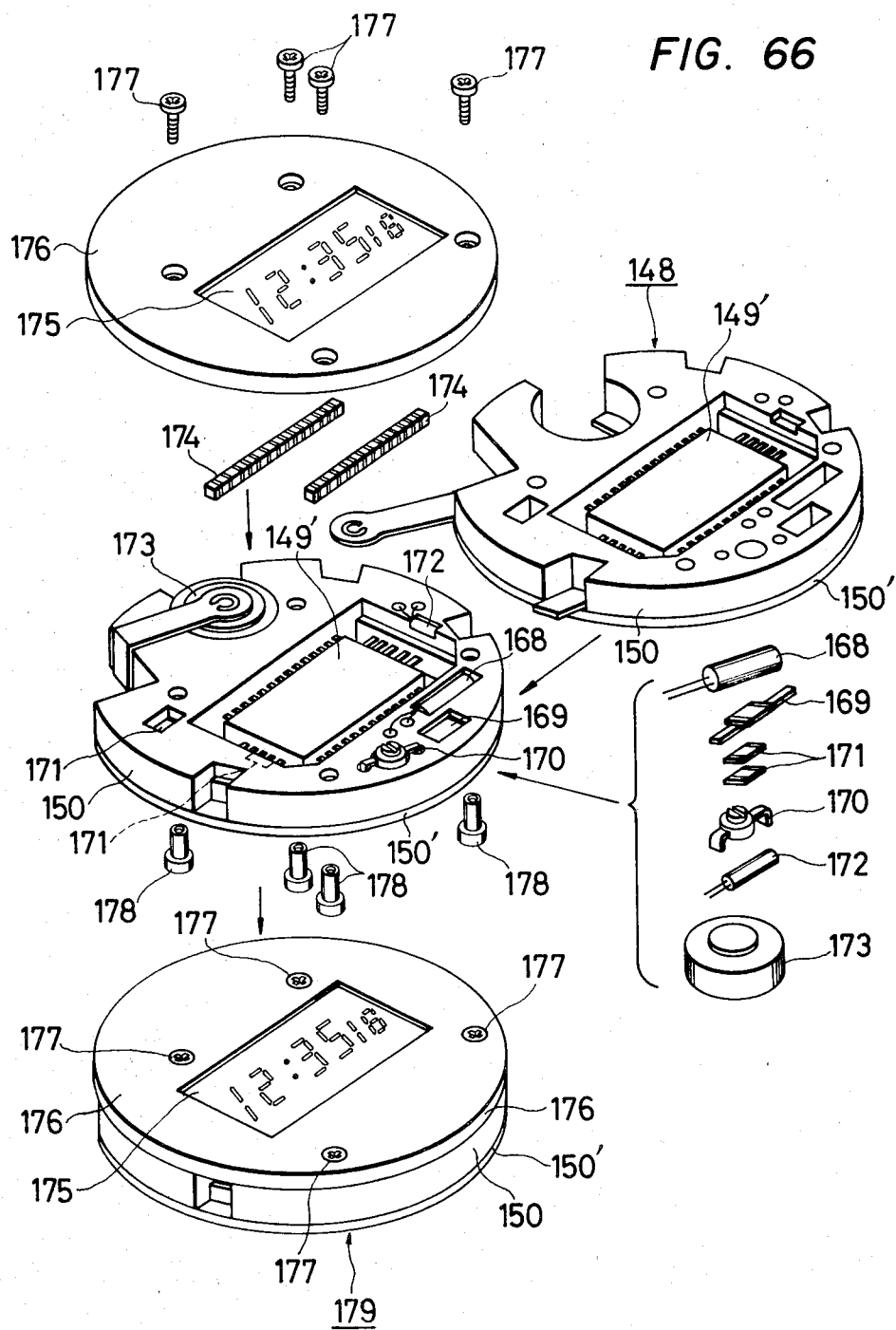

FIG. 66 is a schematic assembly drawing showing the assembly of electronic watch (module) according to this invention.

Figure 67:
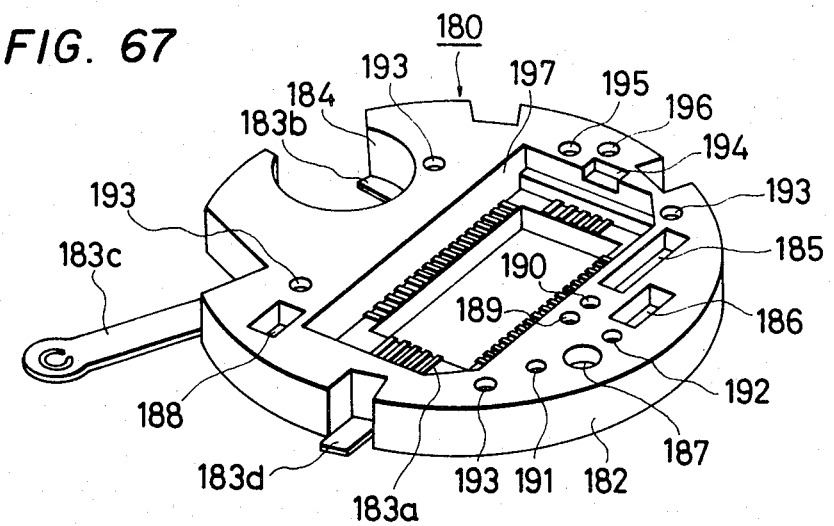

FIG. 67 is a perspective view showing a package in the electronic watch of an embodiment of this invention.

FIGS. 68 to 71 are plan views or rear views showing the process for fabricating the package according to this invention.

Figure 72:
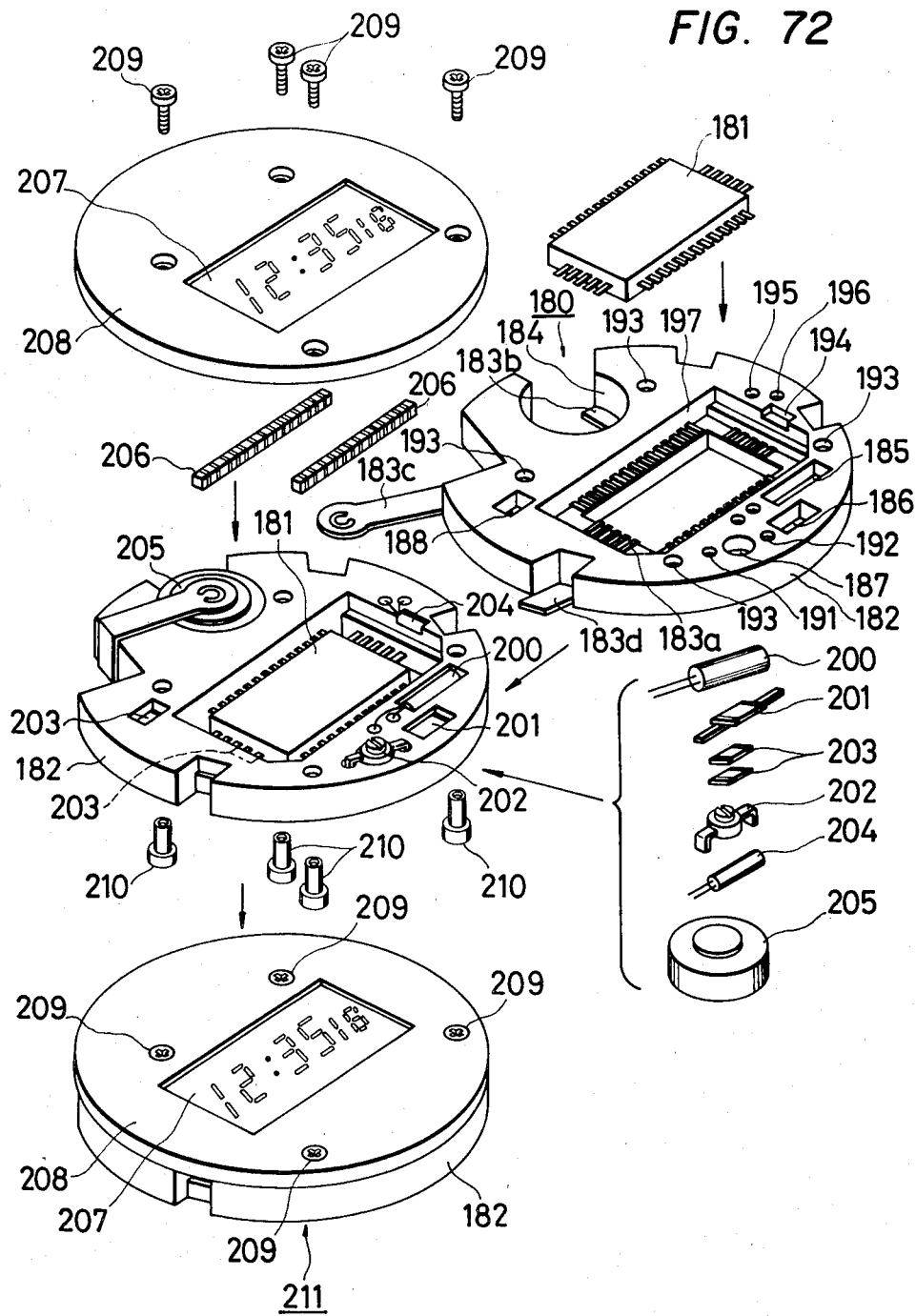

FIG. 72 is a schematic assembly drawing showing the assembly of electronic watch (module) according to this invention.

FIG. 73 is a plan view showing the watch module in the electronic watch of an embodiment of this invention.

FIG. 74 is a longitudinal sectional view taken along the arrow A—A of FIG. 73.

FIG. 75 is a longitudinal sectional view taken along the arrow B—B of FIG. 73.

Figure 76:
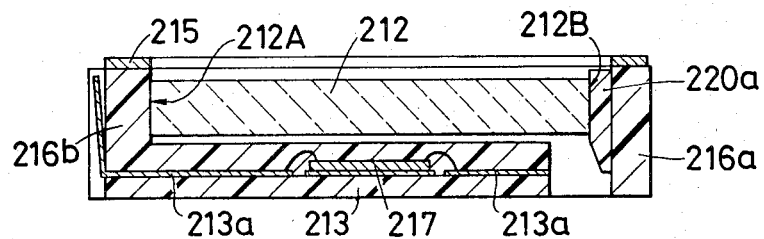
Figure 77:
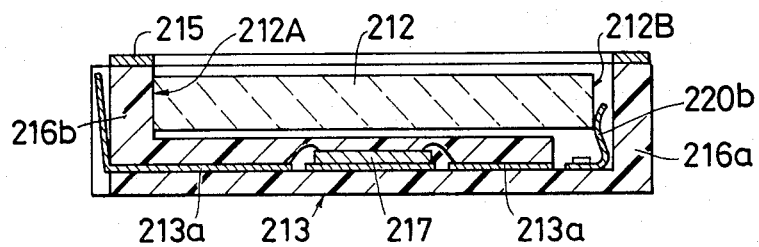

FIGS. 76 and 77 are longitudinal sectional views showing the watch module in the electronic watches of other embodiments of this invention.

Figure 78:
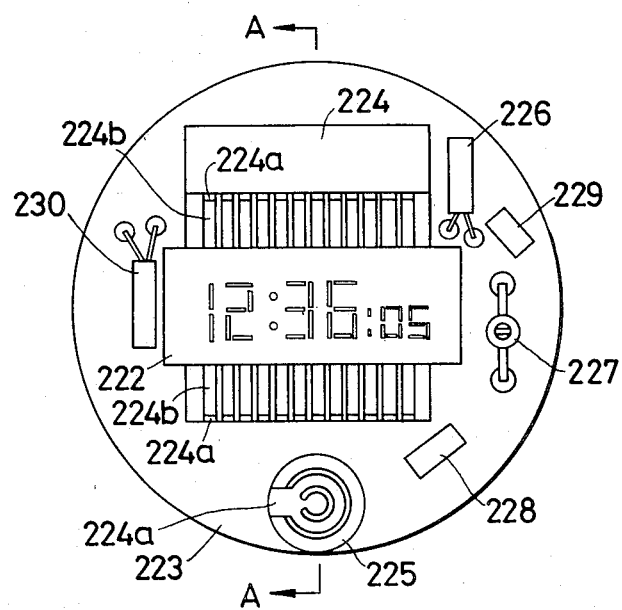

FIG. 78 is a plan view showing a watch module in the electronic watch of an embodiment of this invention.

Figure 79:
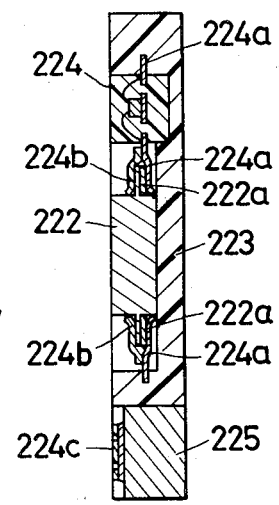

FIG. 79 is a longitudinal sectional view taken along the arrow A—A of FIG. 78.

Figure 80:
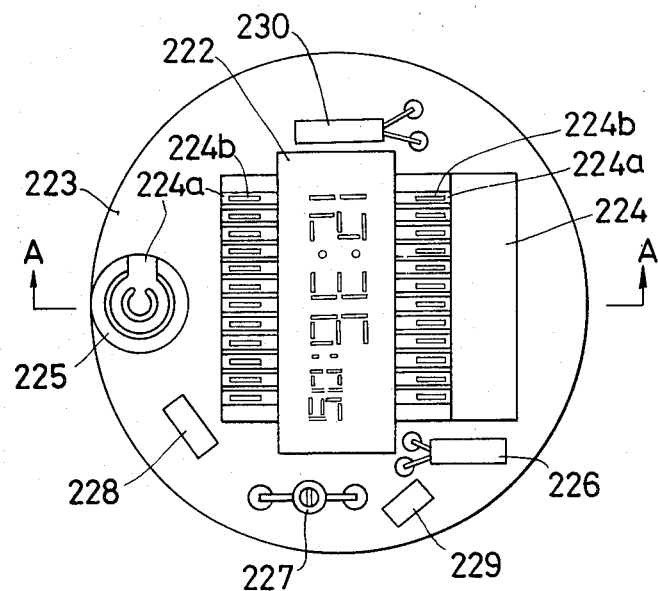

FIG. 80 is a plan view showing a watch module in the electronic watch of another embodiment of this invention.

Figure 81:
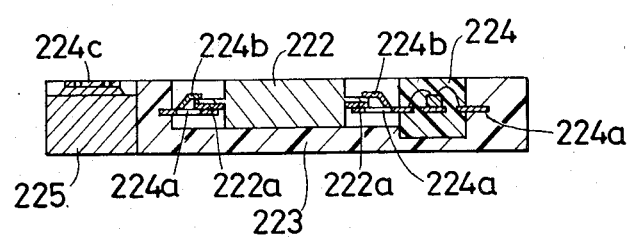

FIG. 81 is a longitudinal sectional view taken along the arrow A—A of FIG. 80.

Figure 82:
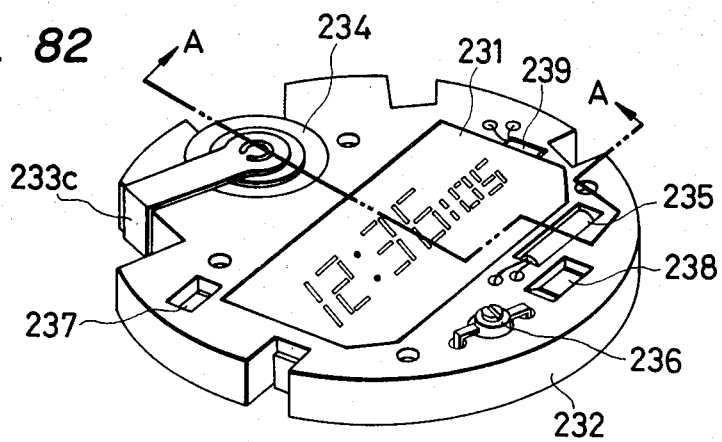

FIG. 82 is a perspective view showing a watch module in the electronic watch of an embodiment of this invention.

Figure 83:
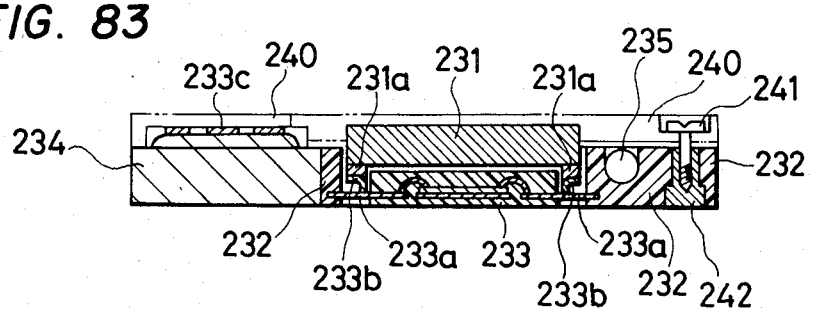

FIG. 83 is a longitudinal sectional view taken along the arrow A—A of FIG. 82.

Figure 84:
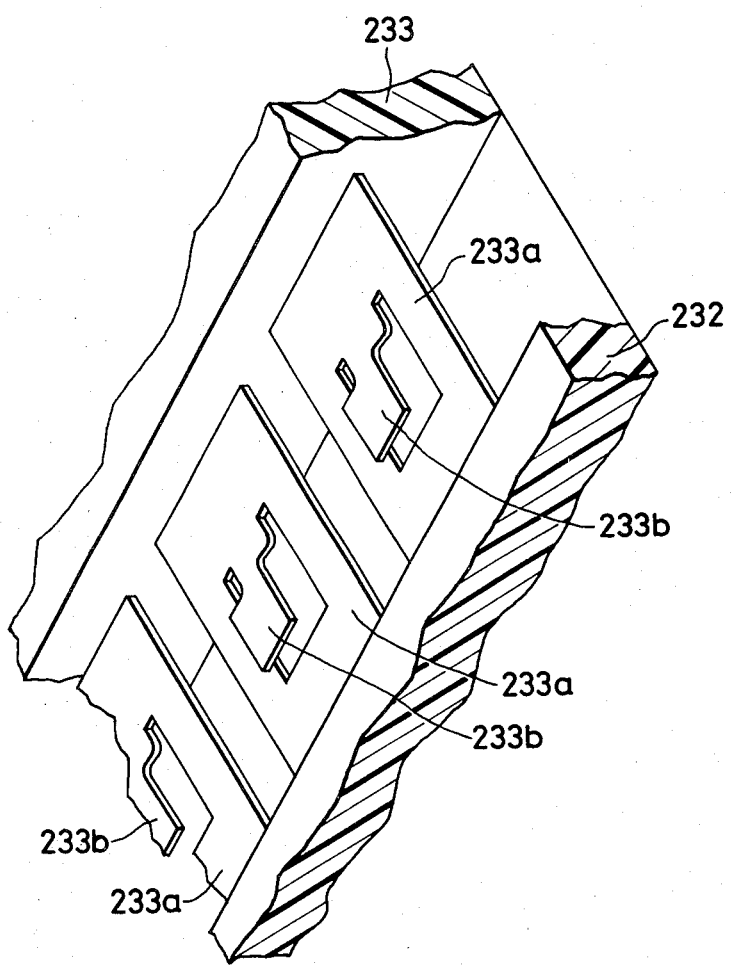

FIG. 84 is a perspective view showing the neighbourhood of the external lead conductor of IC according to this invention.

Figure 85:
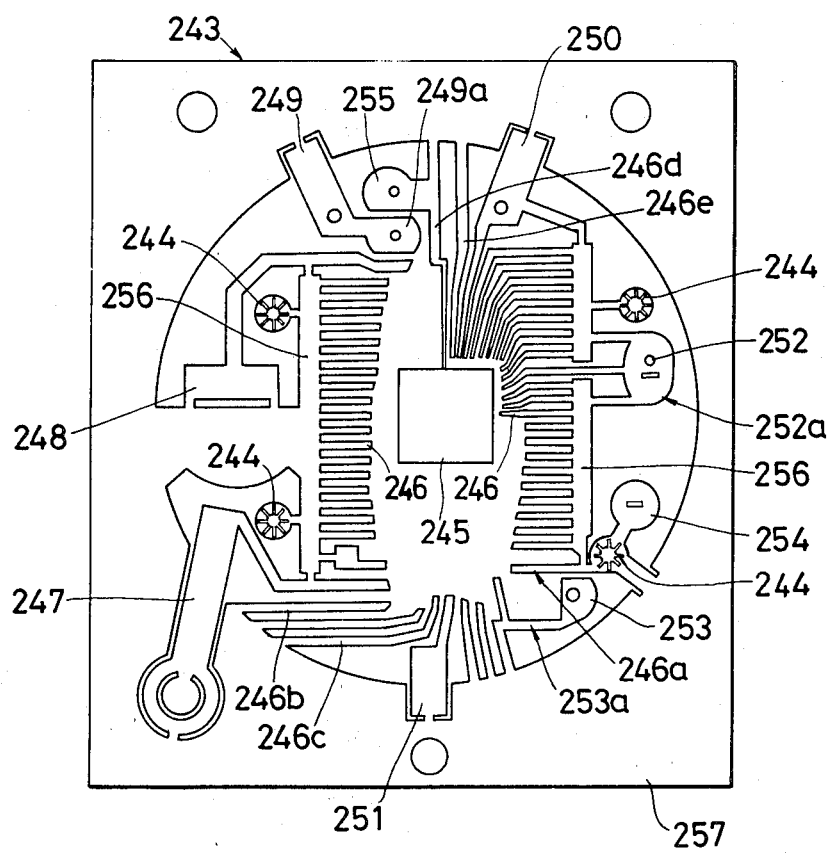

FIG. 85 is a plan view showing a lead frame of an embodiment of this invention.

Figure 86:
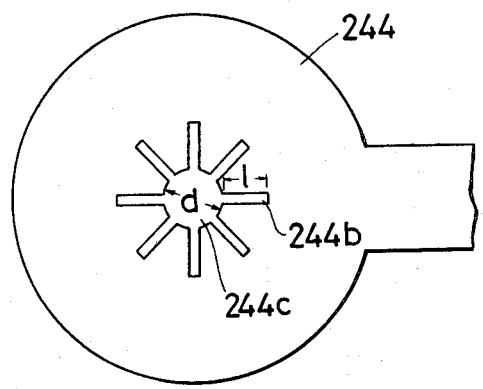

FIG. 86 is an enlarged view of the neighbourhood of a plate nut in FIG. 85.

Figure 87:
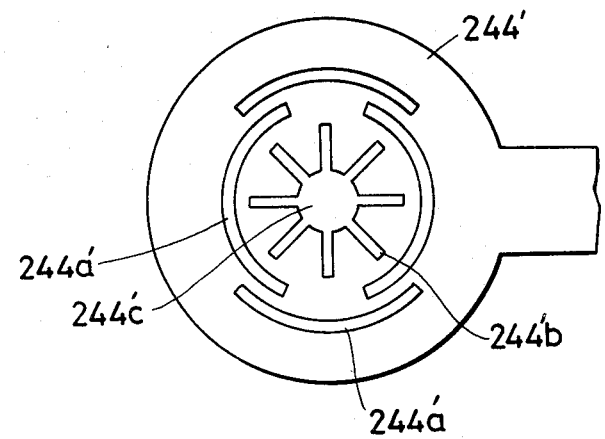
Figure 88:
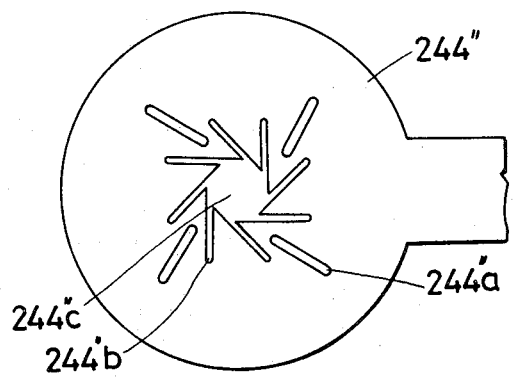

FIGS. 87 and 88 are plan views showing a plate nut of another embodiment of this invention.

Figure 89:
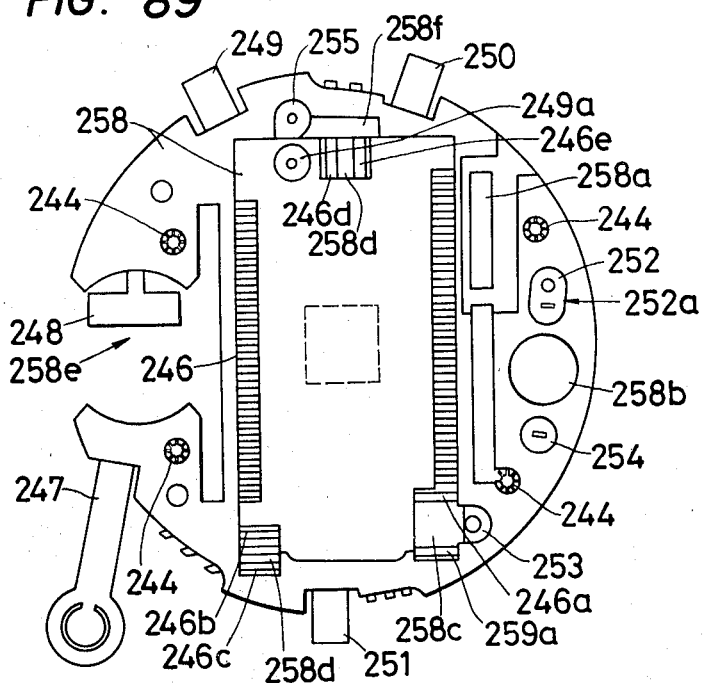

FIG. 89 is a plan view showing IC chip and others bonded to the lead frame shown in FIG. 85 and enclosed by resin.

Figure 90:
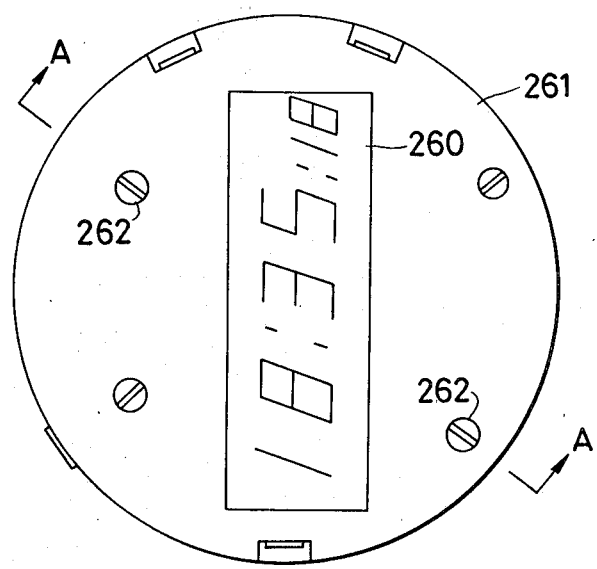

FIG. 90 is a plan view showing a module for electronic watch in which electronic parts are mounted on the frame shown in FIG. 89.

Figure 91:
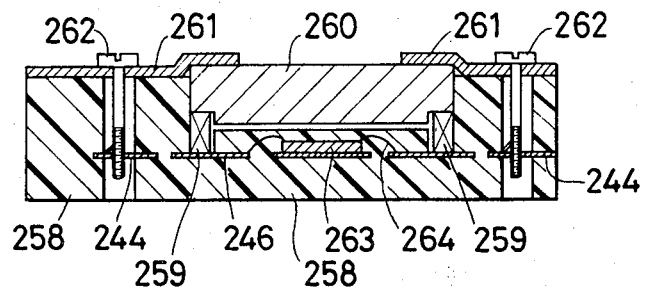

FIG. 91 is a longitudinal sectional view taken along the arrow A—A of FIG. 90.

Figure 92:
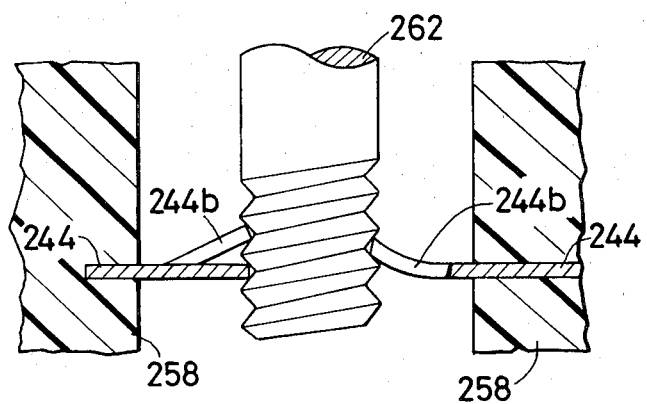

FIG. 92 is a enlarged view of the neighbourhood of the plate nut in FIG. 91.

Figure 93:
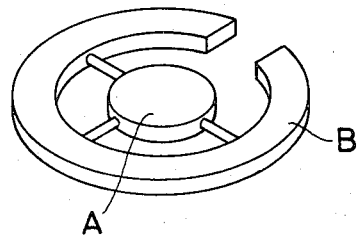

FIG. 93 is a perspective view showing an example of products made of different resin.

Figure 94:
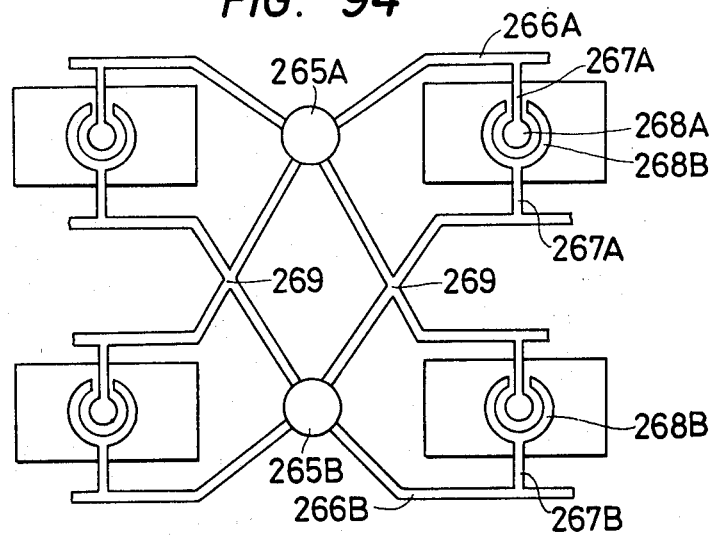
Figure 95A:
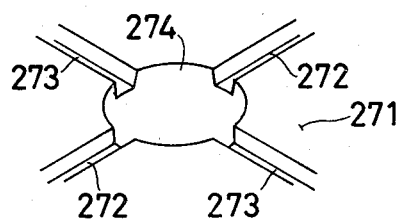
Figure 95B:
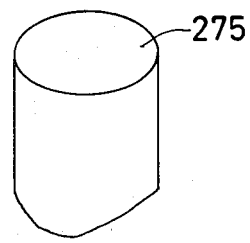
Figure 95C:
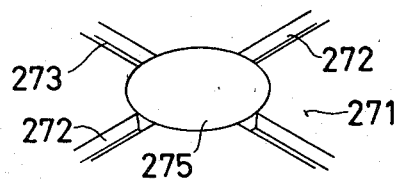
Figure 95D:
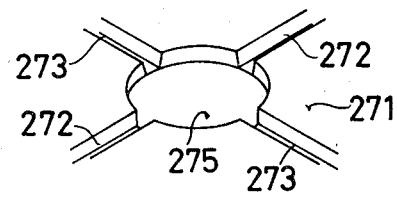

FIG. 94 is an arrangement plan showing the arrangement of resin injection route in transfer molding machine of an embodiment of this invention.

FIG. 95 (a) to (d) are perspective views for the description of the inersecting portion of the injection routes, (a) showing the lower mold, (b) pins, (c) the lower mold when the pins are raised and (d) the lower mold when the pins are lowered respectively.

Figure 96:
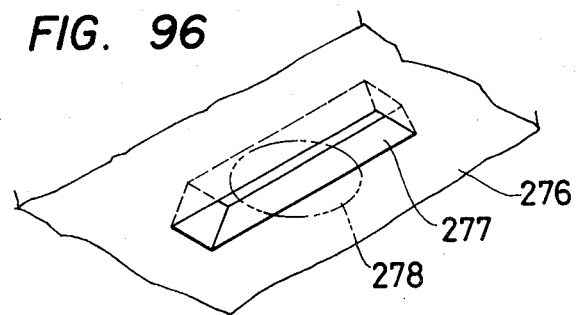

FIG. 96 is a perspective view (as viewed from below) showing the intersecting portion of the upper mold.

Figure 97A:
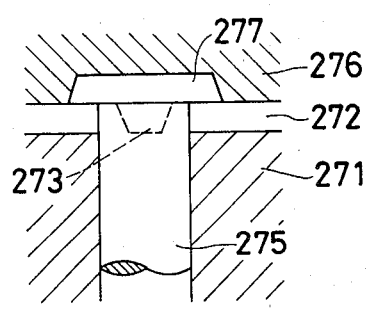
Figure 97B:
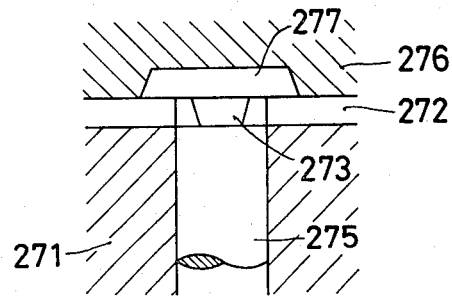

FIG. 97 (a), (b) are sectional views showing the condition of fastened mold, (a) showing the condition of raised pins and (b) the condition of lowered pins respectively.

Figure 98A:
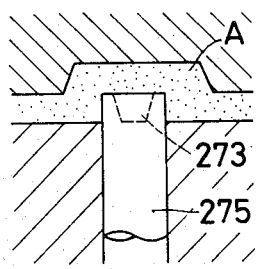
Figure 98B:
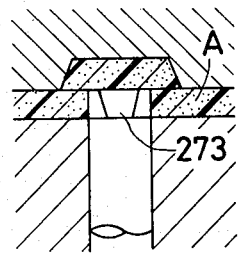
Figure 98C:
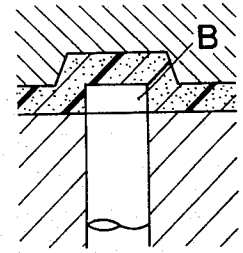

FIG. 98 (a) to (c) are sectional views showing the order of the resin injecting process sequentially, (a) showing the process of injecting resin A, (b) the process of lowering pins and (c) the process of injecting resin B.

Figure 99:
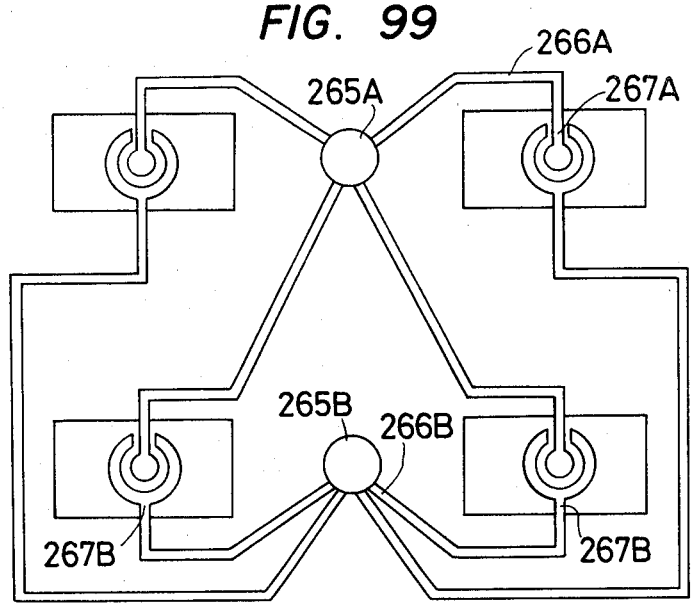

FIG. 99 is an arrangement plan showing the injection route of another embodiment of this invention.

Figure 100:
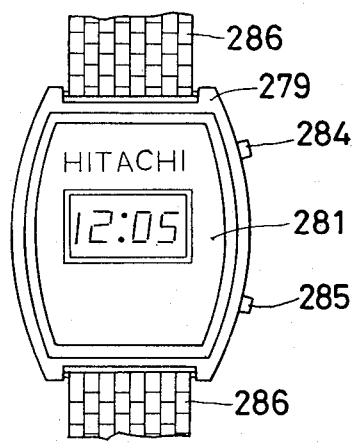

FIG. 100 is a plan view showing an electronic watch of an embodiment of this invention.

Figure 101:
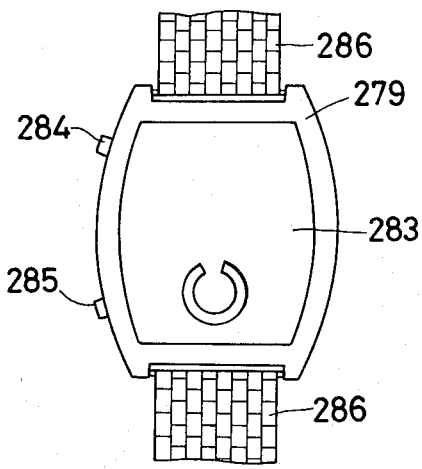

FIG. 101 is a rear view of the electronic watch of FIG. 100.

Figure 102:
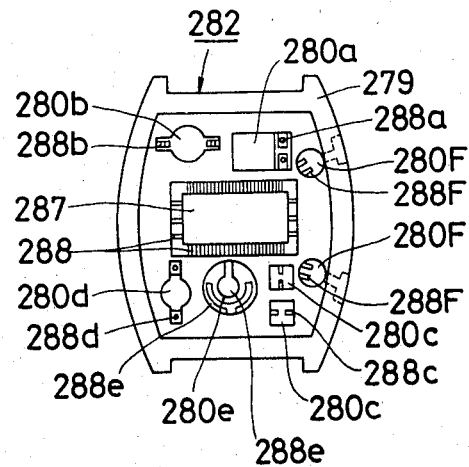

FIG. 102 is a plan view showing a watch module including a watch case which module is essential portion for the electronic watch according to this invention.

Figure 103:
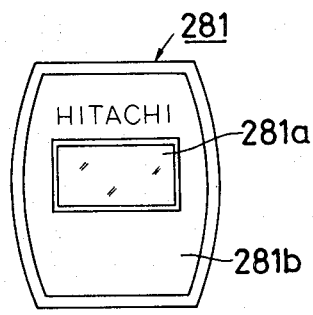

FIG. 103 is a plan view showing a style strip mounted on the surface of watch module.

Figure 104:
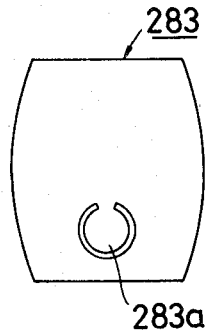

FIG. 104 is a plan view showing a back lid mounted on the back surface of the watch module.

EMBODIMENT I

An electronic watch using IC, an embodiment of this invention, will be hereinafter described concretely with reference to the accompanying drawings.

At first a package, a principal component of this invention, will be described.

Figure 1:
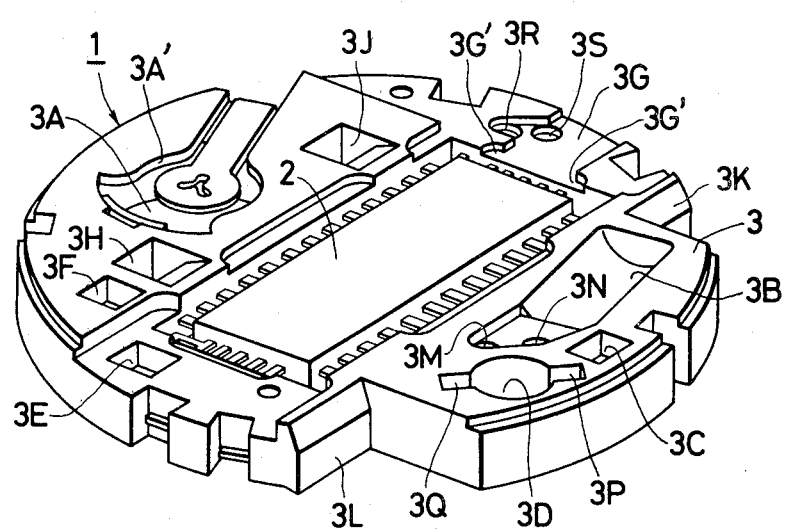
FIG. 1 is a perspective view showing a package used for an electronic watch according to this invention.
Figure 2:
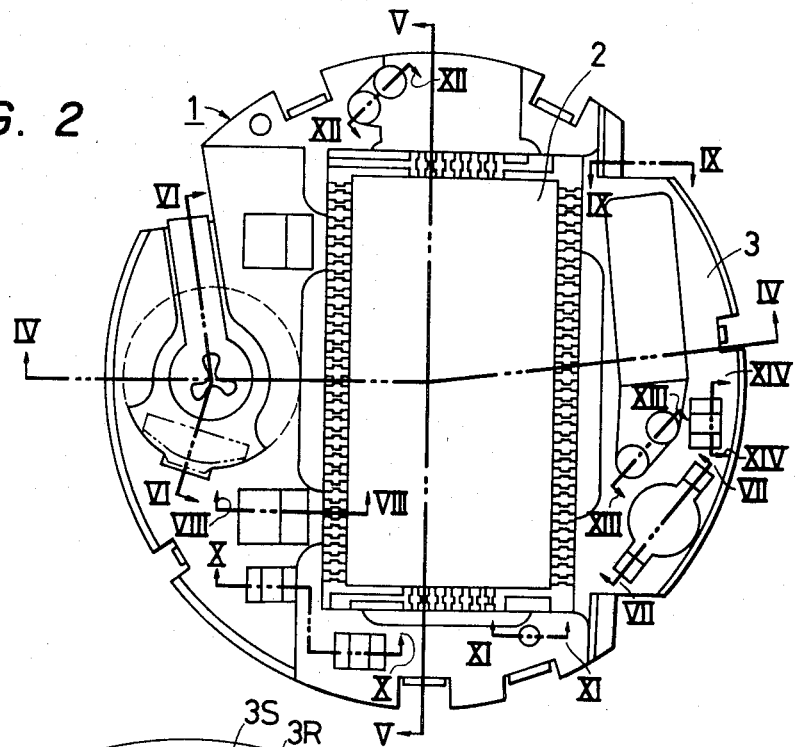
FIG. 2 is a top plan view of said package.
Figure 3:
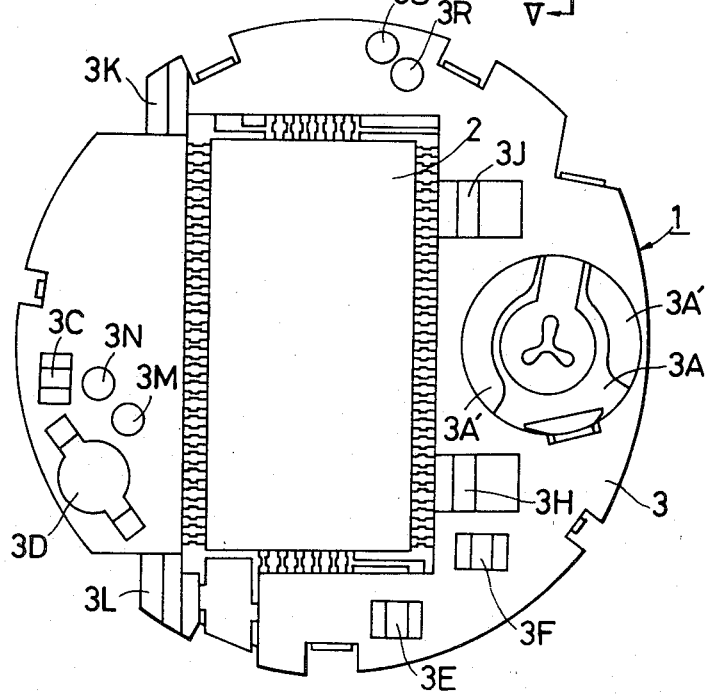
FIG. 3 is a bottom view of said package.
Figure 8:
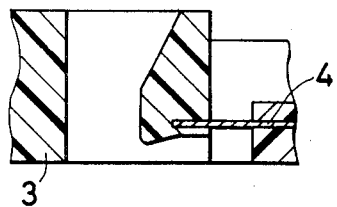
Figure 9:
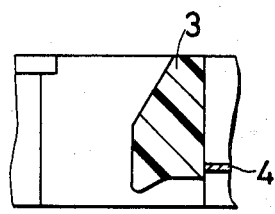
Figure 10:
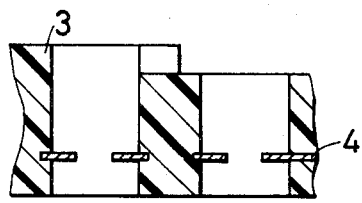
Figure 11:
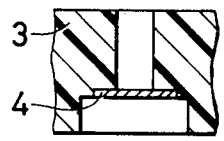
Figure 12:
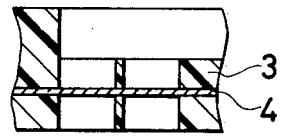
Figure 13:
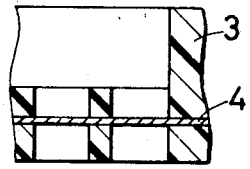
Figure 14:
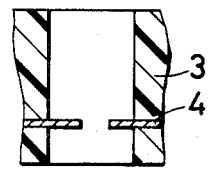

FIGS. 1 to 3 are drawings showing the package according to this invention, FIG. 1 being a perspective view, FIG. 2 a top plan view and FIG. 3 a bottom view. Also FIGS. 4 to 14 are sectional views taken along the respective arrows of the package shown in FIG. 2.

As shown in these drawings, the package 1 of this invention is a unit in which an enclosure 2 of IC (not shown) is integratedly combined with a block 3 capable of receiving various electronic parts through a lead conductor formed by one sheet of lead frame. Though the enclosure 2 and the block 3 are spaced from each other, they are formed together by the use of resin material.

The surface of the block 3 into which a portion of the lead conductor is fixedly embedded by resin is provided with grooves and holes for receiving the electronic parts and connecting electrically their external terminals to the lead conductor. 3A designates the hole for receiving the battery, 3B the groove for receiving crystal oscillator, 3C the hole for receiving capacitor for temperature compensation and 3D the hole for receiving trimmer capacitor. 3E and 3F designate the holes for receiving chip capacitors and 3G the groove for receiving a lamp for illumination at night or having a luminous β light plate inserted in place of the lamp between the enclosure 2 and LCD set thereon as indicator. Also 3H to 3L designate fitting portions for fixedly attaching to the package 1 the frame on which LCD, indicator, is mounted, 3H and 3J being two holes provided with gradient. 3K and 3L are formed with gradient on the side wall of the package 1.

On the other hand 3M and 3N are the holes for connecting electrically the respective external terminals of crystal oscillator to the lead conductor, a portion of the lead conductor being exposed within the holes 3M and 3N. 3P and 3Q are the holes for connecting electrically each external terminal of trimmer capacitor to the lead conductor, a portion of the lead conductor being exposed within the holes 3P and 3Q. 3R and 3S are the holes for connecting electrically each external terminal of lamp to the lead conductor, a portion of the lead conductor being exposed within the holes 3R and 3S.

Also the portion of the enclosure 2 in the package 1 is made concave to the block 3. This portion is formed as a guide groove in the mounting of LCD under the consideration of the facilitation of the location of LCD and the simplification of the mounting and assembling thereof.

Further a small L-shaped groove 3G' provided on the enclosure 2 side in the groove 3G is the one for both location and guidance of light diffusing plate on the enclosure 2.

The package 1 shown in the drawing is provided, between the groove or hole for receiving each electronic part and the hole for connecting the external terminal thereof electrically to the lead conductor, with a groove for both locating and guiding the external terminal, and capable of receiving compactly various electronic parts. However an embodiment of the package 1 according to this invention may be provided without the groove for both locating and guiding the external terminal in the portion where this type of external terminal is arranged.

Said various grooves or holes are the ones for receiving various electronic parts in the package 1 and for the combined receiving, locating and guiding of the external terminal of the electronic parts to connect same electrically to the lead conductor. By providing this type of groove or hole on the package 1, the thickness of the package can be reduced, while various electronic parts can be conveniently mounted and assembled in the package 1.

Also after the mounting and assembling of various electronic parts in the package 1, and when the property adjustment is needed, the portion for receiving this type of electronic parts is made to be a through hole to permit the property adjustment at the opposite side to the mounting and assembly side (for example, the hole 3D for receiving trimmer capacitor). Therefore even after the external terminals of various electronic parts are fixed to and mounted on the package 1, they can be subjected to the property adjustment easily without removably mounting on the package 1.

Next the module for electronic watch according to this invention will be described together with the mounting and assembling thereof.

Figure 15:
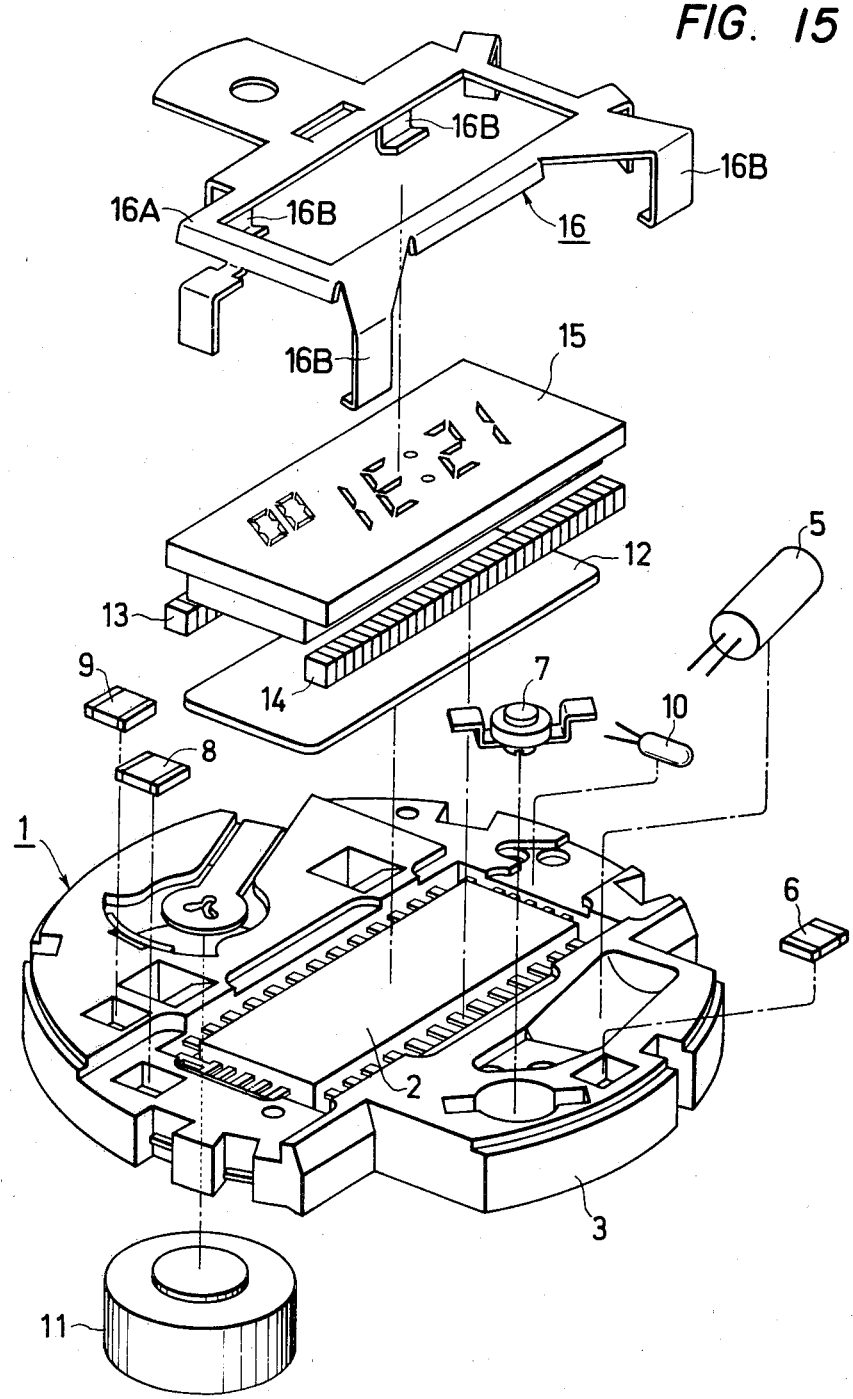
FIG. 15 is a drawing describing the mounting and assembling of the electronic watch according to this invention.

As shown in the schematic assembly drawing of FIG. 15, the holes or grooves provided in the block 3 of the package 1 receives crystal oscillator 5, temperature compensating capacitor 7, trimmer capacitor 7, chip capacitor 8, 9 and lamp 10 from the front side of the package 1.

Next from the same side, each of these external terminals is spot welded, soldered or silver pasted to the lead conductor on the exposed surface thereof. Also a battery 11 is inserted from the rear side of the package 1 to be pressed to the lead conductor for the electric connection thereto.

Next after mounting a light diffusing plate 12 on the IC enclosure 2 in the package 1, conductive zebra-connectors 13, 14 are mounted on the lead conductor interposed between the enclosure 2 and the block 3 and on these connectors 13, 14 is mounted LCD 15. This LCD 15 is fixed to the package 1 by the use of a LCD mounting frame 16. The frame 16 makes contact with each switch portion to provide the external terminal of the switch, while providing a versatile member serving to hold the battery 11.

This is accomplished by depressing toward the package 1 four fixing fit plate-shaped supports 16B extending downwards from the periphery of the frame member 16A in the LCD mounting frame 16 and hooking elastically the claws of the lower end of the support 16B on the rear surface of the package 1. In this case two of said fixing fit supports 16B fit into fixing fit graded holes 3H, 3J in the package 1 and the remaining two are mounted to fit in fixing fit portions 3K, 3L graded and notched in a portion of the outer periphery of the package 1.

Figure 16:
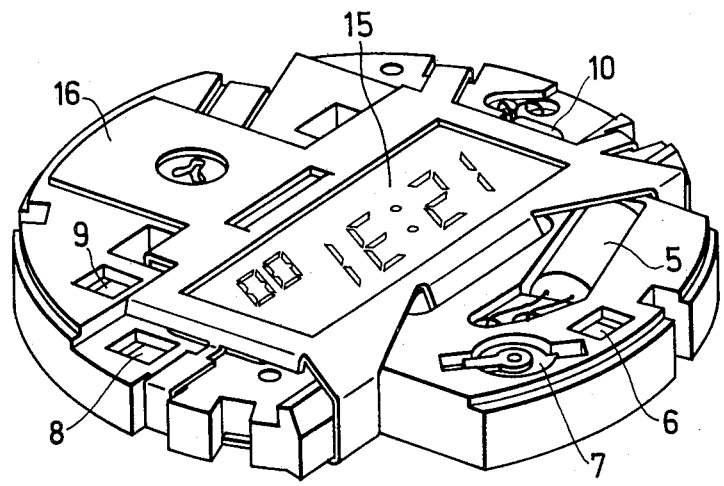
FIG. 16 is a perspective view showing the electronic watch after the mounting and assembling.
Figure 17:
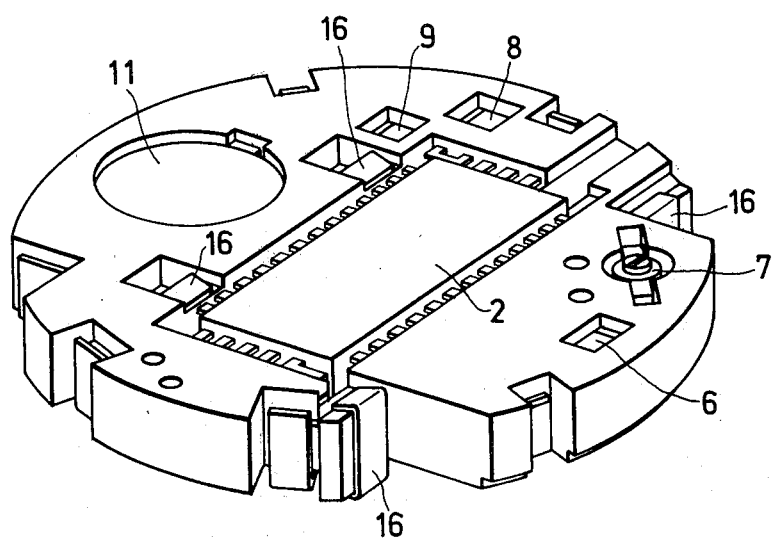
FIG. 17 is a perspective view as viewed from the rear side of the electronic watch shown in FIG. 16.

The module of electronic watch which is mounted and assembled as above mentioned is shown in the prespective view of FIG. 16 and the module as viewed from the rear side is shown in the perspective view of FIG. 17.

After the property adjustment of the trimmer capacitor 7, etc. from the rear side on need, the electronic watch according to this invention is obtained by receiving this module in the watch case.

As above mentioned, the electronic watch according to this invention can receive in the package 1 containing IC from the front side of the package the electronic parts, i.e. crystal oscillator 5, temperature compensation capacitor 6, trimmer capacitor 7, chip capacitors 8, 9 and lamp 10, other than interchangeable battery 11 (which needs to be interchanged by removing the rear side of the watch case) and permits each external terminal of them to be spot-welded, soldered, silverpasted to the exposed surface of the lead conductor from the front side of the package 1.

Accordingly since this electronic watch according to this invention premits all electronic parts having the external terminals fixed to the lead conductor to be mounted in the package 1 containing IC from the front side thereof, it is easily mounted and assembled, resulting in very few number of man-hour for work.

Also since the externally mounted electronic parts of IC in this electronic watch according to this invention can be assembled only from the front side of the package 1 and at the same side the external terminal of the externally mounted electronic parts is fixed to the lead conductor, high reliability of electric connection is obtained, while inspection like appearance inspection, electric measurement inspection, etc. of the electronic watch during and after the assembly thereof can be carried out easily and for a short time.

Also since the electronic watch of this invention is constituted from the package 1 containing IC and provided with versatile holes and grooves, while various electronic parts are assembled and arranged in the package 1 compactly, the number of the parts is very few and further the module construction with very small assembly dimension is attained.

Accordingly since this invention provides the electronic watch with few number of parts, easy assembly and high reliability, it is suited for massproduction and cost reduction.

Thus this invention provides an electronic device in which the electronic parts having the external terminals fixed to the lead conductor among a plurality of electronic parts are assembled in a main surface side, i.e. the front (rear) side, of the resin member in which a part of said lead conductor is embedded. For example this electronic watch comprises a package 1 consisting of a resin block embedding a portion of the lead conductor interconnecting electrically a plurality of electronic parts and IC enclosed by resin, the electronic parts such as capacitor, crystal oscillator, etc. having the external terminal fixed to the lead conductor being assembled from only one side of the package 1.

This invention thus constituted (1) simplifies the mounting and assembly of the electronic watch and thereby the inspection work thereafter since the various electronic parts are set in the package 1 from one side (either the front side or rear side) thereof and the external terminal of said electronic parts is electrically connected, for example, soldered to the lead conductor exposed on a portion of the package 1 at the side receiving these electronic parts.

Also this invention (2) simplifies the replacement of battery and the like, while permitting such operation without adversely affecting various electronic parts, since the battery and the like for power supply which need to be interchanged can be mounted from the rear side (or front side) of the package 1 which is opposite to the assembling side of the electronic parts.

Further this invention (3) permits the property adjustment of electronic parts like trimmer capacitor, etc. with ease and high precision and without adversely affecting other electronic parts, since the property adjustment of the electronic parts after the completion of the assembly can be carried out on the rear side (or front side) of the package 1 which is opposite to the assembling side of the electronic parts.

Further this invention (4) permits the mounting and assembly of the electronic watch consistently in the same direction without turning the package 1 upside down, since the various electronic parts are set in the package 1 from one side thereof. Accordingly the mounting and assembling operation and inspective measurement become very simple, while consistent flow process and automatic mechanical assembly become possible. Hence the man power saving in the fabricating process is attained, while the considerable cost reduction in production is accomplished, resulting in the provision of economical electronic devices.

Also the electronic watch according to this invention is an electronic device in which (1) the enclosure 2 of semiconductor element like IC having unstable surface is completely separated from the block 3 receiving the externally mounted electronic parts (for example, crystal oscillator, capacitor and the like, battery and display device such as LCD, LED, etc.) without the interference of the deformation, strain, etc. of the block 3 in the characteristic of element within said enclosure 2, and (2) the block 3 spaced from the enclosure 2 is combined therewith by the lead conductor molded from lead frame while maintaining its spatial position and in addition the electronic parts received in the latter block 3 are electrically connected with the elements within the enclosure 2.

Accordingly this invention is characterized in that the enclosure 2 of IC and the like is completely separated from the block 3 receiving the electronic parts mounted externally on the enclosure 2.

Therefore (a) The deformation, strain, etc. of the block 3 do not affect the elements within the enclosure 2 at all to prevent the characteristic of elements from degradation.

(b) Materials for enclosing elements and molding block can be selected suitably for attaining respective objects. Hence materials (resin, glass, etc.) for enclosing elements can be used which are chemically stable irrespective of the block 3 with good moisture proof, few degradation, few unfabourable impurities like sodium, chloride, etc. particularly few impurities liable to move as ion, i.e. materials with high adhesive property to the lead conductor. On the other hand materials (resin, ceramic, etc.) for molding the block 3 can be used which irrespective of the enclosure 2 of said elements have excellent mechanical strength, molding property, mold releasing property, thermal deformation property, thermal stability and shock resistance and can be subjected to precision work with small difference of thermal expansion coefficient from that of the lead conductor. Also low cost materials for the latter can be selected, differing from the former for the enclosure. Further the materials for enclosing elements can be selected separately from the materials for molding the block 3 so that the degree of freedom of selecting material for use is enlarged.

Generally thermosetting materials are used for forming the enclosing elements and thermoplastic materials other than the thermosetting ones also can be utilized for molding the block 3.

(c) Opaque black resin can be used for material for enclosing elements and transparent resin can be used for molding block 3, which resin facilitates the assembly of the externally mounted electronic parts and provides high value of product.

In this way the mating material can be distinguished.

(d) Only enclosed semiconductor element can be sold as product by separating only the block 3, while only the block 3 can be sold as product. Also if either of those is defective the lead conductor at the border portion between those can be cut off and replaced by other satisfactory one.

(e) This invention can be a very compact device since the IC occupying small space is the main circuit element and for the externally mounted electronic parts of IC can be used ones with small external dimension which can be completely received in the grooves and holes provided in the block 3.

(f) Since the enclosure 2 is separated from the block 3 in the fabrication of this type of module, various types of fabricating methods can be employed. Thus the molding method or equipment which is the most suitable for use can be selected.

Further the electronic watch according to this invention is constituted such that the both ends of the lead conductor 4T are supported by the IC enclosure 2 and the block 3, and LCD 15 makes ohmic contact with the enclosure through zebra-connectors 13, 14 by mechanical depressing force. Accordingly since this ohmic contact is made stable by the use of the lead conductor 4T having both ends supported, it provides very high reliability and easy operation. It is because the both ends of the lead conductor 4T are embedded in the resin enclosure 2 and the resin block 3 to be mechanically reinforced so that in the mounting of LCD 15 the lead conductor 4T is not deflected, deformed nor displaced even when it is depressed.

Also the module according to this invention uses the IC resin enclosure 2 and the resin block 3 for supporting the both ends of the lead conductor 4T and further utilizes the interval between the both ends for locating and receiving the zebra-connectors 13, 14, LCD 15, etc. Thus, hardly any unused space exists and a very compact module is constructed.

Next an example of the fabricating method of this type of package will be described by the order of the process.

Figure 18:
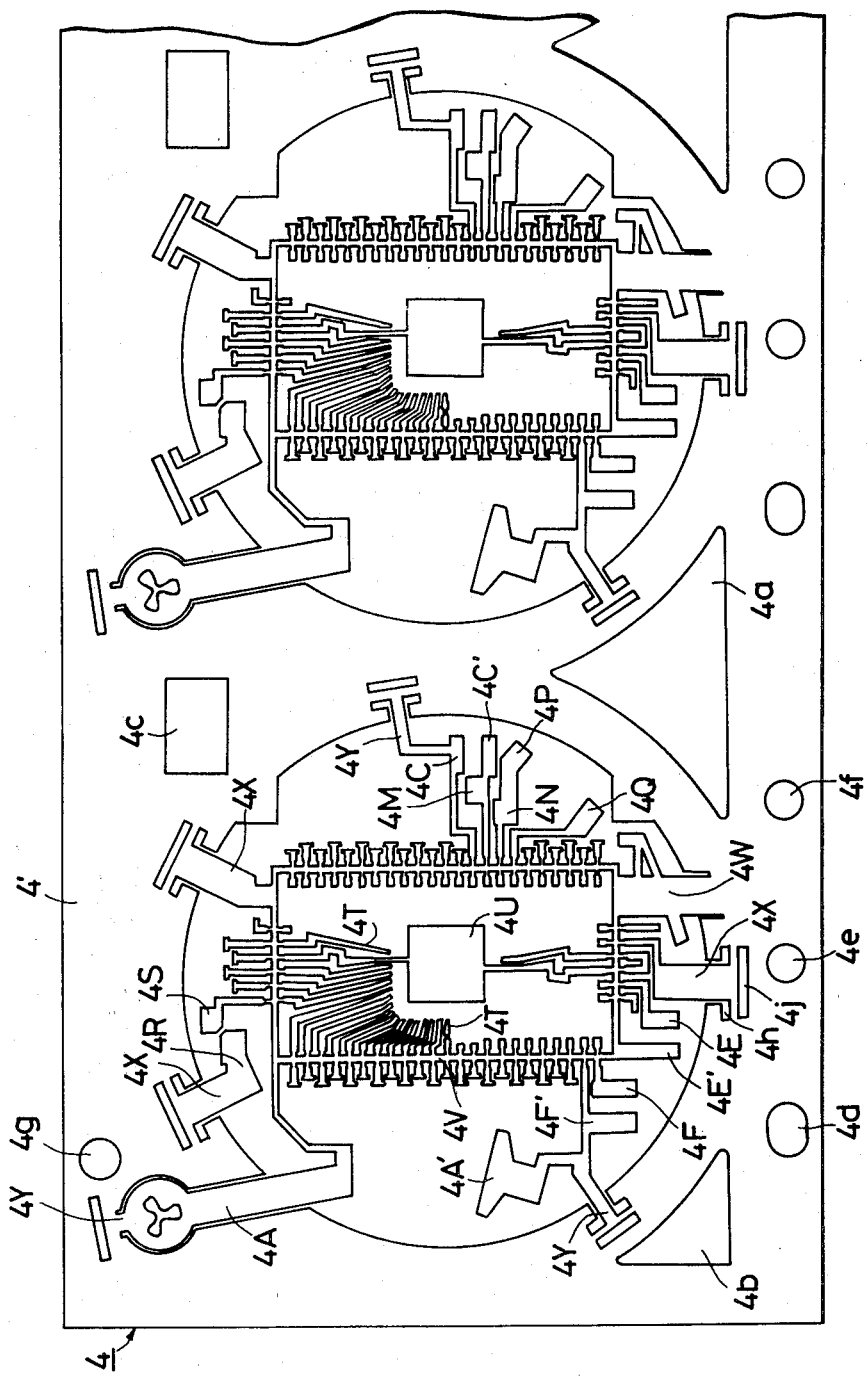
FIG. 18 is a plan view showing a lead frame used for the fabrication of the electronic watch according to this invention.

(1) The lead frame 4 is prepared as starting material as shown in the plan view of FIG. 18. This lead frame 4 made of about 0.15 mm thick ferronickel alloy sheet and the like is formed with lead conductors for wiring each external lead conductor of IC and externally mounted electronic parts of IC. Further the lead frame 4 shown in the drawing is partially cut away for the convenience of illustration and shows only two pieces of the lead frame cells. However the lead frame is generally shaped to connect any number of the cells according to the specification of fabrication.

Figure 19:
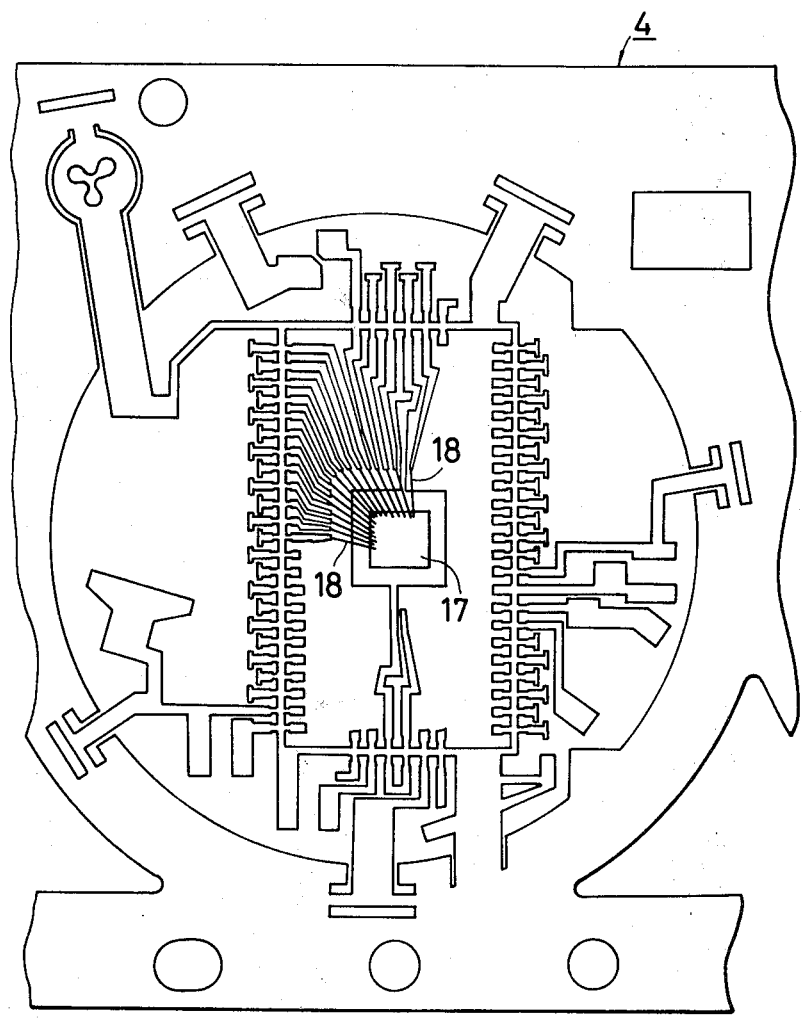
FIGS. 19 and 20 are plan views used for the description of fabricating method of the electronic watch according to this invention.

(2) After die-bonding of IC chip 17 to tub 4U in the lead frame 4, the pad electrode in the IC chip 17 and the lead conductor 4T in the lead frame 4 are interconnected by metal thin wire 18 made of gold, aluminum or the like (FIG. 19).

This is easily accomplished by wire bonding method such as thermal pressing, supersonic bonding.

Figure 31:
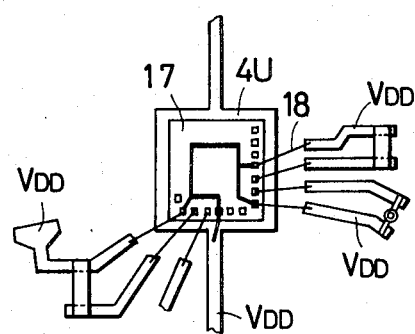

Since it is difficult for this type of lead frame 4 to cross wire the lead conductor, the terminals $V_{DD}$ are inteconnected by wiring within the IC chip. Thus by the use of one layer wired lead conductor formed by one sheet of plate-shaped lead frame can be obtained an electronic watch constructed to interconnect electrically various electronic parts in addition to the IC chip (FIG. 31).

Figure 32:
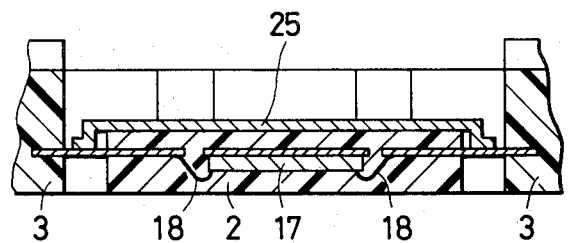
Figure 33:
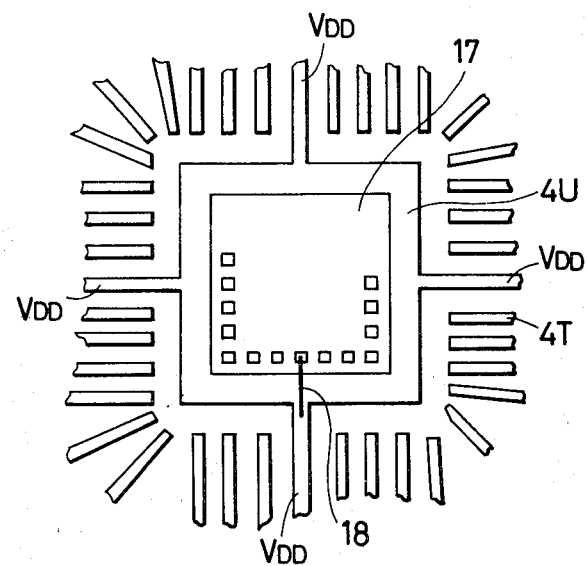

Further the terminals $V_{DD}$ of power supply may be embodied to electrically interconnect the pad electrodes for the terminals of each power source on the chip or the lead conductors by the use of bonding wire and jumper wire other than wiring within the chip, or to electrically interconnect the lead conductors for the terminals $V_{DD}$ of power source by the use of jumper wire 25 after enclosing by resin (see FIG. 32). Also the tub itself may be made the terminal $V_{DD}$ of power source and embodied such that the tub hanging lead conductor is used for the lead conductor for the terminal $V_{DD}$ of power source (see FIG. 33).

Figure 20:
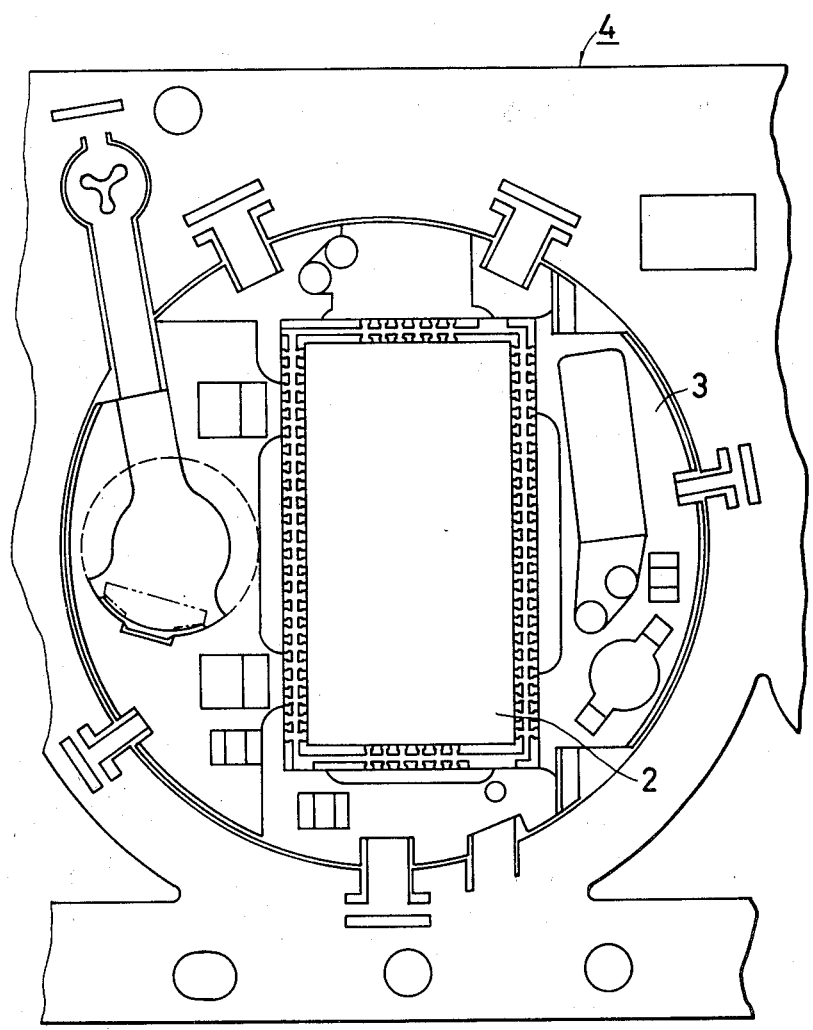

(3) The IC chip 17 and its peripheral lead conductor 4T and metal thin wire 18 are enclosed by resin to form the enclosure 2. Also the block 3 having holes and grooves for receiving the externally mounted electronic parts of IC is formed to embed a portion of the lead conductor by resin (FIG. 20).

(4) Unnecessary portions such as the outer frame 4', dam 4V, etc., of the lead frame 4 are cut off and the lead conductor of necessary portion is bent to make the package 1. Such cutting-off of the unnecessary portions of the lead frame and bending of the lead conductor may be carried out during the formation of said block 3 or before and after the formation of same.

The package 1 made in this way is shown in FIGS. 1 to 3.

While the package 1 according to this invention is fabricated by the above-mentioned process, the fabricating method of the lead frame 4 and package 1 according to this invention will be hereinafter described with respect to their construction, feature, modification, etc. in the separate sections.

(A) Detailed Description of Lead Frame

FIG. 18 is a plan view showing the lead frame 4 according to this invention. This lead frame 4 is made of about 0.15 mm thick ferronickel alloy sheet and the like to form each external lead conductor and wiring lead conductor of externally mounted electronic parts of IC. Further the lead frame 4 shown in the drawing is partially cut away for the convenience of illustration and shows only two lead frame cells. Generally the lead frame is shaped to have any number of the cells selected by the specification for fabrication.

In the same drawing, 4T designates the lead conductor electrically connected to the pad electrode on the surface of the IC chip through metal thin wire. The IC chips are arranged to surround the tub 4U diebonded thereto, and the lead conductor 4T and the tub are interconnected through the dam 4V to hold the mechanical strength. The dam 4V acts as a stopper for preventing the resin flow during resin molding.

Figure 21:
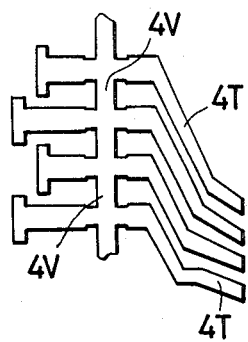
FIGS. 21 to 26 are plan views used for describing lead frame for fabricating the electronic watch according to this invention.
Figure 22:
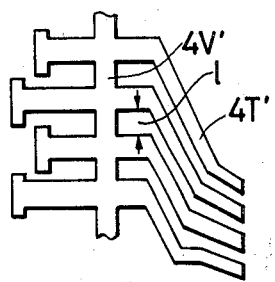

The lead conductor 4T in the lead frame 4 according to this invention is characterized by the shape of the portion where it is connected to the dam 4V as shown in FIG. 21. Namely the periphery of the dam 4V is designed to have small width of the lead conductor 4T. By this shape the dam 4V is lengthened and the punching dimension in the cutting-off of the dam is enlarged so much. Thus the breakage of the lead conductor 4T or cutting blade due to the punch is reduced and the dam is easily cut off. The embodiment of the lead frame according to this invention may be constructed to simply connect the lead conductor 4T' shown in FIG. 22 by the dam 4V'. However this type of lead frame makes the pitch dimension l between the lead conductors 4T' small, and when the pitch dimension l becomes less than about 0.8 mm, the cutting-off of the dam becomes difficult. This is because when the dam is cut off for the electrical separation of the lead conductors 4T' after molding the punching dimension of the dam cutting punch needs to be shortened and this is difficult in the present production engineering so that the lead conductor 4T' tends to be damaged by the buckling, shock, etc. of the punch during cutting-off of the dam. The above-mentioned one avoids these kinds of unfabourable damages.

Figure 23:
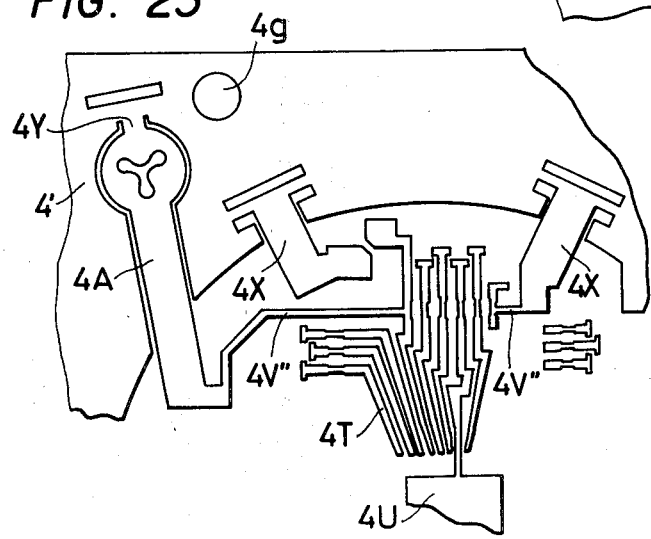

Also the dam 4V in the lead frame 4 according to this invention, as shown in FIG. 23, leaves one portion thereof behind in the cutting-off of the dam and the remaining dam 4'' is utilized as lead conductor. This is contemplated from the need for providing pins (lead conductors) as much as possible within the predetermined spaced to permit many lead conductors to be provided in the small area occupied by the lead frame.

4M and 4N, 4C and 4C', 4P and 4Q, 4E and 4E', 4F and 4F', 4R and 4S designate the lead conductors directly connecting crystal oscillator 5, temperature compensation capacitor 6, trimmer capacitor 7, chip capacitors 8, 9 and lamp 10 to the external lead conductor 4T of the IC chip 17 respectively.

Figure 24:
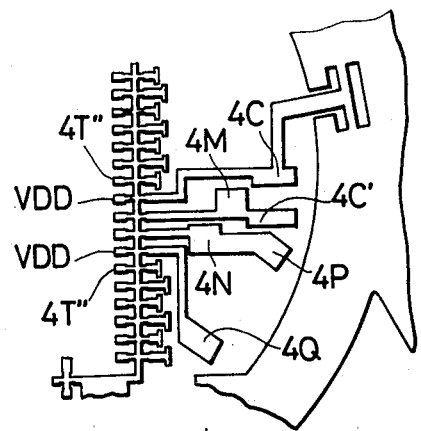

The lead conductors 4M and 4N connected electrically to the external terminal of crystal oscillator 5 are preferably arranged as far as possible from the lead conductor 4T' connected electrically to the LCD segment terminal. Hence as shown in FIG. 24, the lead conductor 4C (electrically connected to the terminal $V_{DD}$ of power source) is interposed between 4M and 4T'' and the lead conductor 4Q (electrically connected to the terminal $V_{DD}$ of power source) interposed between 4N and 4T'. Accordingly 4M and 4N are electrically separated from 4T'' so that parasitic capacity is not produced between these lead conductors and coupling phenomenon is not generated. Since there is no coupling phenomenon that tends to be produced by the lead conductors 4M, 4N electrically connected to the external terminals of crystal oscillator 5 and the lead conductor 4T" electrically connected to the LCD segment terminal, any malfunctions of LCD 15 is not caused by the coupling phenomenon.

In FIG. 18, 4A designates the lead conductor making electric contact with (−) pole of the battery 11, i.e. power source, and 4A' designates the lead conductor making electric contact with (+) pole of same. Their arrangement in block 3 can be seen in FIG. 6.

Figure 25:
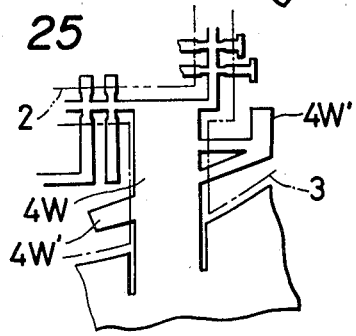

4W is a resin injection port for enclosing the IC chip and the periphery thereof by resin, which port is provided with double wings 4W', 4W" as shown in FIG. 25. In the formation of the block 3, said double wings 4W', 4W" are shaped to be embeeded in this block 3 (shown by alternate long and short dash line in FIG. 25).

This resin injection port 4W is provided with a runner for metal mold into which resin is injected in the formation of resin enclosure 2, when the resin enclosure 2 (shown by alternate long and short two dashes line in FIG. 25) of IC chip and the block 3 are formed in the separate resin molding operation. The resin injection port 4W in the lead frame and the runner in the metal mold prevent resin from leakage to other portion to form the resin enclosure 2. This resin injection port 4W leaves a portion of itself behind in the package when unnecessary portions of the lead frames such as dam, outer frame, etc. are cut off after resin molding. The remaining resin injection port 4W makes contact with the block 3 only at one surface so that it may tend to peel off. Then according to this invention the double wings 4W', 4W" are provided to be embedded fixedly in the block 3. Hence the resin injection port 4W is firmly held by the package 1 through the double wings 4W', 4W" without peeling off from the package 1. Also the resin injection port 4W fixes the block 3 through the double wings 4W', 4W" so that it serves to reinforce the block 3. The cavity portions (see FIG. 11) of the block 3 in the port portions are reinforced to increase the mechanical strength of the block 3 and prevent the block 3 and the port portion from breakage.

Three lead conductors designated by 4X in FIG. 18 are the lead conductors for switch terminals, while they also play a part of hanging lead for making the outer frame 4' of the lead frame 4 support various lead conductors. Further two lead conductors designated by 4Y act as hanging leads.

Figure 26:
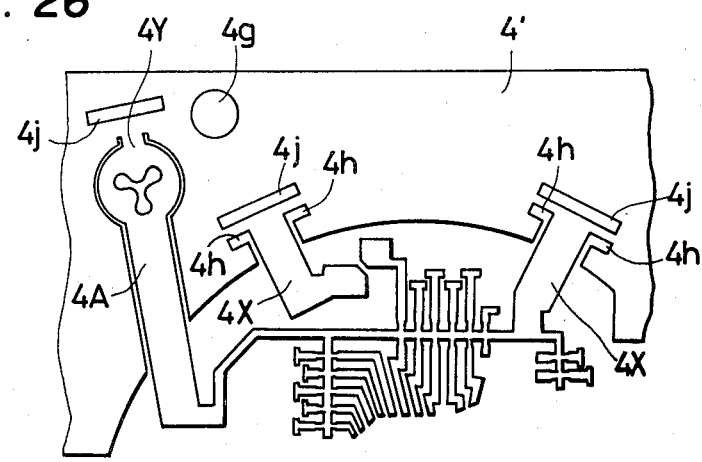

This hanging lead portion, as partially shown in FIG. 26, is provided on the peripheral lead conductor in the portion connected to the outer frame 4' with a L-shaped slit 4h and a straight-line-shaped one 4j.

These slits 4h, 4h are provided to produce local week portions in the hanging lead and absorb the deformation force through these portions due to the thermal contraction produced in the resin molding like the formation of the block 3 for prevent the whole lead frame from deformation. Also since the hanging lead constructed to have this type of slit makes the deformation of the whole lead frame negligibly small, holes 4d to 4f (FIG. 18) in the lead frame 4 can be used for both locating and transporting the lead frame 4 and the package 1 after the forming work of the package 1 to facilitate the rationalization and automation of operation.

Further a portion of the hanging leads 4X, 4Y in the lead frame according to this invention is a extension of the lead conductor for the terminal $V_{DD}$ of power source. Thus any leads used exclusively for the hanging lead are not needed so that the lead conductors can be arranged in the lead frame as much as possible. Also since the hanging lead becomes the extension of lead conductor for the terminal $V_{DD}$ of power source, the inspective measurement such as selection can be carried out without cutting-off of the outer frame 4' of the lead frame and the inspective measurement can be carried out during production process and with simple operation.

4a to 4c (FIG. 18) are holes provided in the outer frame 4' in the lead frame 4, and 4d to 4f are holes used for locating the lead frame 4. 4a and 4b are holes for preventing the thermal deformation of the lead frame 4 in the resin molding to form the package 1 and for improving the accuracy of forming the lead conductor pattern in the fabrication of the lead frame. 4c is a feed hole used for the intermittent transport of the lead frame 4 in cell unit, and 4g is a hole for holding the lead frame 4 which is used in the case of the surface treatment (plating process and the like) of the exposed surface of the lead conductor after the formation of the package 1.

Further considering the shape of the lead frame 4 the gap between the outer frame 4' of the lead frame 4 and the block 3 is generally somewhat larger selected on account of the production dimension of metal mold for forming the package 1, the production dimension for forming the lead frame 4 and in addition the alignment of the metal mold with the lead frame. Thus in the formation of the block 3 by resin, the resin flow is produced in the existing gap to form resin projection (resin fin) in the outer circumference of the block 3 which projection easily peels off in the handling of the package 1 to provide resin scrap which is often unfavorable for the production of this type of electronic device requiring clean process.

Figure 29:
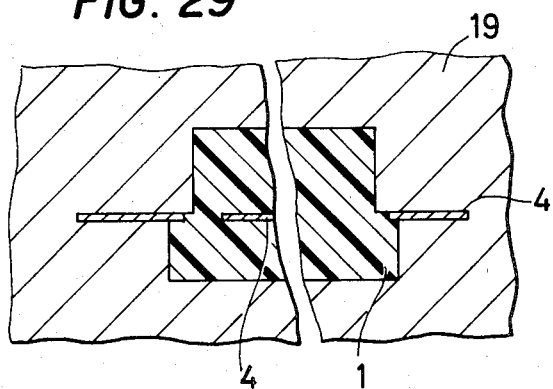
FIGS. 29 to 33 show other embodiments of this invention, FIGS. 29 and 32 being sectional views and FIGS. 30, 31 and 33 being plan views respectively.

This can be prevented by an embodiment shown in FIG. 29 in which the block 3 is formed such that a portion of the outer frame of the lead frame 4 is included in a portion of the block 3. In this case the side wall of the block 3 is formed with a stage portion, but the above-mentioned resin scrap is not produced. Further in the same drawing, 19 is a metal mold for resin molding to form the block 3.

Figure 30:
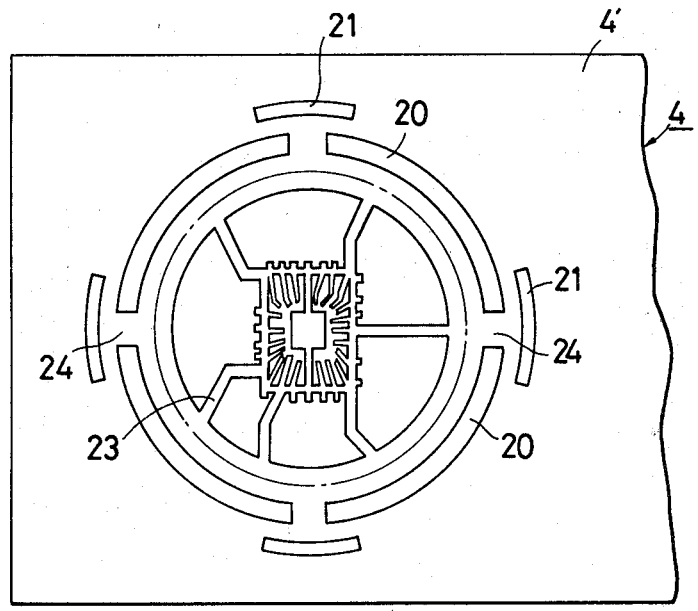

Also another embodiment for preventing the production of this type of resin scrap is shown in FIG. 30 in which slits 20, 21 are provided along the outer frame 4' of the lead frame 4 and the outer frame portion 22 connected with lead conductor pattern is embedded in the package 1 in the formation of the package 1, this outer frame portion 22 and the lead conductor pattern being interconnected by the hanging lead conductor 23 and on the other hand the outer frame portion 22 and the outer frame 4' provided with the slit 20, 21 being interconnected by the hanging lead conductor 24 for mechanical support. Further the area surrounded by the alternate long and short dash line in the same drawing shows the one in which the package 1 is formed.

(B) Detailed Description of the Fabricating Method of Package 1

Since the enclosure 2 is separated from the block 3 in the fabrication of this type of package 1, various fabricating methods can be employed to select thereby the molding method or device which is the most suitable for use.

The fabricating method of the package 1 and others will be hereinafter described concretely and precisely.

(1) The following is depict as an embodiment of the fabricating method. After the enclosure 2 is formed to mount the parts such as IC tips on the lead frame and enclose them, the block 3 is formed. Since the IC chip has the unstable surface, the enclosure is preferably carried out before the block 3 is molded. On the other hand, different from said method, another method may be employed in which the block 3 is formed with the lead frame embedded therein and then the parts such as IC chips is mounted on the lead frame to be enclosed.

In this method the metal mold for molding needs two molds for enclosing parts such as IC chips and for molding the block. In this method, however, the dam is not needed which prevents the lead frame between the enclosure 2 of parts such as IC chips and the block 3 from the resin flow and the like in the molding work.

This is because the enclosure 2 (or the block 3) molded beforehand plays a part of stopper against the resin flow and the like coming out of the metal mold in the subsequent molding of the block 3 (or the enclosure 2).

Thus according to this method, the cutting operation of dam of the lead frame is not needed and simple-shaped lead frame is advantageously used.

(2) Since the lead frame does not have the dam in said method of (1), unnecessary portions such as resin fins produced in the molding of the enclosure 2 need to be removed. In that case the lead frame may be deformed. To prevent the lead frame from the deformation the lead frame is provided with the dam to form the enclosure 2 and the block 3 according to the method of (1).

(3) The lead frame is provided with the dam and further the enclosure 2 and the block 3 are formed at the same time or alternatively by the use of one metal mold for molding. This is accomplished by providing separately a pressure injection port of resin for molding the enclosure 2 and a pressure injection port of resin for molding the block 3. It is particularly useful for the formation of the enclosure 2 and the block 3 by the use of resin suitable for them.

Of course the package 1 may be fabricated by the use of the same resin for both molding the enclosure 2 and the block 3. However the use of different resin respectively for the enclosure 2 and the block 3 is often useful.

Resin with excellent moisture proof, chemical stability, etc. is preferably used for molding the enclosure 2. For example epoxy resin is preferably used.

On the other hand resin with high mechanical strength, excellent molding property and mold releasing property, and small thermal deformation is preferably used for molding the block 3.

This method provides high productivity since it uses one metal mold to mold the enclosure 2 and the block 3.

The enclosure 2 and the block 3 can be formed by the resin mold using a transfer molding method.

However when the resin for molding the enclosure 2 is different from the one for molding the block 3, a intricate-shaped metal mold with many cavities is needed disadvantageously so that the price of the metal mold becomes very high and the cost requirement for implementing model change and the like is unsatisfactory. Hence the simple-shaped enclosure 2 is preferably formed by injection molding of a resin and the intricate-shaped block 3 is preferably formed by the resin molding of injection molding method. By employing such molding methods the number of cavities in the metal mold for forming the block which need an intricate shape can be reduced. Thus the block 3 can be produced by the use of a metal mold which is economical and easily subjected to model change and the like.

Another embodiment of this invention employs the lead conductor of tape carrier system which does not need the installation of the dam, connects electrically the electronic parts such as IC chips to the lead conductor and provides the resin enclosure of IC and the resin block by resin molding.

Since this type of embodiment can minimize the dimension of the width of the lead conductor (wiring) itself and the interval between respective lead conductors, while not needing to cut off the dam after resin molding, the lead conductors with many pins can be arranged within the limited space to provide the electronic device with a very small assembly dimension.

Also since the use of the lead conductor of tape carrier system provides small wiring dimension and thin wire, the wiring can be specified with high degree of freedom. Thus it is not always necessary to minimize the length of the lead conductor and the total lead conductors for reducing the area occupied by the lead conductors (wiring) through the overlapping of the indicator element such as LCD and IC, i.e. the main element driving the indicator element. Hence even embodiment assembled without overlapping of the indicator element and IC for driving same does not have large space for the lead conductors (wiring) so that the invention can provide an extremely thin type of electronic device (which can be made thin by the construction without the overlapping of the indicator element and IC for driving same).

Still another embodiment of this invention employs the lead conductor molded from one sheet of lead frame and arranges the indicator element spaced from IC without the overlapping of the indicator element such as LCD and IC, i.e. the main element for driving same. Compared with the embodiment employing the lead conductor of tape carrier system, this embodiment has the same effect to the production of the thin type of electronic device, but it has the disadvantage that the wiring (lead conductor) occupies large space. However it can provide a compact electronic device by the package constructed to mount crystal oscillator, various capacitors, battery, etc. beneath indicator element such as LCD.

The embodiment in which the indicator element and IC are spaced from each other without overlapping provides the thin type of electronic device even if it employs the above-mentioned lead conductor of tape carrier system or the lead conductor molded from one sheet of lead frame. Thus this type of electronic device is preferable for the thin type of women's or men's electronic watch.

The package 1 according to this invention is based on the lead frame 4 to form the enclosure 2 and the block 3 by resin molding. However in the resin molding of the enclosure 2 and the block 3, the portion of lead conductor which is exposed on the surface (the area to which the external terminals of electronic parts are connected) may be formed with thin resin film. Though this film needs to be removed after resin molding, it may be sometimes unable to be removed easily. Hence this invention may provide an embodiment in which the lead conductor in the area formed with the resin film is provided with a coating which permits the resin film to peel off easily.

(C) Detailed Description of Package 1

Though the package 1 according to this invention was described with reference to FIGS. 1 to 14, it will be further described with reference to its features hereinafter.

(1) The battery receiving portion is a through hole 3A (FIG. 1) and the lead conductor 4A making contact with (−) pole of the battery is bent on the side wall of the block 3 to be depressed by LCD mounting frame 16 (FIGS. 6, 15 and 16). On the other hand the lead conductor 4A' making contact with (+) pole of the battery is drawn out of the middle of the block 3 to be bent along the side wall of the hole 3A (FIG. 6). These lead conductors 4A, 4A' are formed from one sheet of lead frame 4.

Thus (1) since the battery receiving portion is provided in the block 3 as the through hole 3A, the mechanical strength is high. (2) The electric contact between (−) pole of the battery and the lead conductor 4A is reinforced by the LCD mounting frame 16 so that the thickness of the block 3 can be the same as that of the battery to provide the thin type of electronic watch. (3) The hole 3A, i.e. battery receiving portion can be on need provided on the upper surface with a shoulder 3A' for supporting the battery (FIGS. 1, 3 and 4). Hence the battery is easily received and replaced to facilitate the correction of the battery position.

(2) The groove 3G of the lamp receiving portion is enlarged. Hence in the embodiment using β light plate in place of night illumination lamp, the β light plate can be mounted on the package 1 through this groove before or after the mounting and assembling of module. Namely since the package 1 according to this invention has said groove 3G, the β light plate can be built in the package 1 without the removal of LCD, etc. from the package 1 even after mounting LCD, etc.

Figure 27:
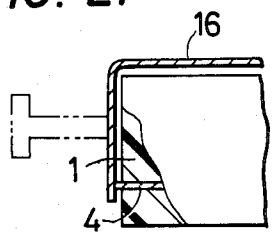
FIGS. 27 and 28 are sectional views showing the peripheral portion of lead conductor for switch in the package used for the electronic watch according to this invention.

The lead conductor for switch according to this invention is shaped to be drawn out of the middle of the side wall of the package 1 and cut off, as shown in FIG. 27, the sectional surface being made the switch surface. Hence the construction is simple and does not produce any failures even with frequent operations of the switch. Also it is shaped to have high mechanical strength and occupy small space so that the compact package 1 is obtained. Further in this type of lead conductor for switch can simplify the construction of metal mold for molding the package 1.

Figure 28:
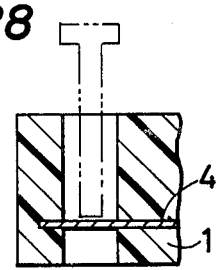

Further, as shown in FIG. 28, the lead conductor for the switch may be constructed such that the package is provided with through holes, the lead conductor having the switch surface is exposed at the middle of said through hole and other portions of the lead conductor are embedded in the package 1 at the middle of the through hole. Also in another embodiment the lead conductor for switch may be drawn out of the middle of the side wall of the package and bent at that portion.

Further in FIGS. 27 and 28, the switch terminal having a crown built in the watch case and the like is shown by the alternate long and two short dashes line.

In another embodiment of electronic watch according to this invention, IC and crystal oscillator, various capacitors, etc. (the externally mounted electronic parts of IC) are electrically connected to the lead conductor which is molded by resin to provide the package.

This type does not need the provision of the grooves and holes for receiving the electronic parts so that extremely compact module is obtained.

Further in this type of embodiment the trimmer capacitor and the like which need the property adjustment may be built exclusively in the through holes provided in the package 1 to be mounted subsequently on the package 1. Also in the package having lamp and others built therein, transparent resin is preferably used for molding the package 1 in which the lamp is embedded.

This invention is not limited to the electronic watch, but applied to various electronic devices necessitating the minimization of the assembly dimension to provide extremely compact device which is easy to produce with low cost.

Hereinafter the LCD mounting frame according to this invention will be detailed.

Figure 34:
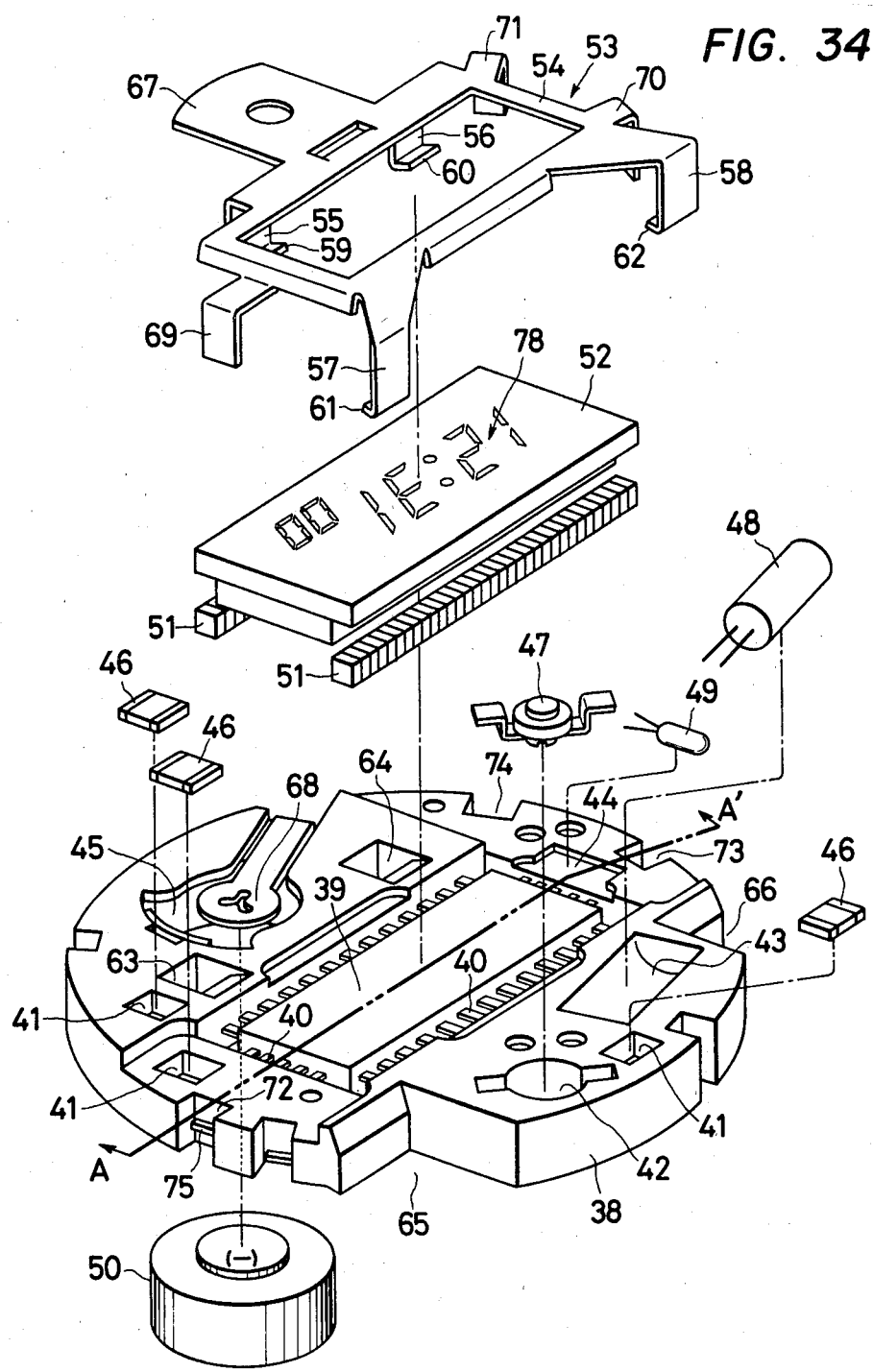
FIG. 34 is an exploded view showing the relationship between an embodiment of LCD mounting frame in a liquid crystal display type of electronic watch according to this invention and respective parts of electronic watch.

FIGS. 34 and 35 are an exploded perspective view and a sectional view showing the LCD mounting frame in the liquid crystal display type of electronic watch according to this invention.

At first in FIG. 34 is shown a disk-shaped package 38 made of resin. IC 39 is formed in the middle of the package 38. Also the lead conductors 40 of IC 39 are exposed on one portion in parallel state and each end of the lead conductors 40 extends in the package 38 to form wiring plate (conductive plate). One portion of each lead conductor 40 respectively protrudes directly or indirectly through other parts into the capacitor fitting groove 41, trimmer capacitor fitting groove 42, crystal oscillator fitting groove 43, lamp fitting groove 44 and battery fitting hole 45, each provided on the upper portion of the package 38, to form the terminal for fitting each electronic parts. And a capacitor 46 is inserted in said capacitor fitting groove 41, a trimmer capacitor 47 in said trimmer capacitor fitting groove 42, a crystal oscillator 48 in said crystal oscillator fitting groove 43, a lamp 49 in said lamp fitting groove 44 and a battery 50 is inserted from below into said battery fitting hole 45.

On the other hand zebra-connectors 51 are respectively mounted on the lead conductors 40 of said IC 39, and on these zebra-connectors 51 are respectively mounted liquid crystal panel 52. Also on these liquid crystal panel 52 are laid the LCD fitting frames 55 and four fixing fit plate-shaped supports 55 to 58 extending downwards from the periphery of the frame member 54 of the LCD fitting frame 53 hook their lower end claws 59–62 elastically on the lower surface of the package 38 respectively to fix the liquid crystal panel 52 to the package 38. Two fixing fit supports 55, 56 fit in the fixing fit holes 63, 64 provided in the package 38 and the other two fixing fit supports 57, 58 fit in the fixing grooves 65, 66 formed by notches partially provided on the outer periphery of the package 38.

Also from one side of the frame member 54 of the LCD fitting frame 53 extends plate-shaped battery holder (battery fixing portion) 67 the end of which projects above said battery fitting hole 45 and makes contact with the upper surface of battery terminal plate 68 projecting to the upper end of the battery fitting hole 45.

Also three plate-shaped switch portions 69 to 71 project horizontally from the frame member 54 of the LCD fitting frame 53 and bend downwards on the way. These switch portions 69 to 71 extend elastically into the switch grooves 72 to 74 provided partially on the outer periphery of the package 38. Also from the groove seats of these switch grooves 72 to 74 project switch pieces 75 connected to the lead conductor extending in the package 38. By the switch pieces 76, 77

(mounted on the case, not shown, covering the whole package) having a crown for externally pressing each switch portion 69 to 71 as shown in FIG. 35, each of switch portions 69 to 71 is pressed and deformed to make contact with the switch pieces.

Further the space portion within the frame member 54 of said LCD fitting frame 53 has sufficient size for viewing digital display portion 78 on liquid crystal panel 52 from above. Also the fixing fit supports 55 to 58, extending from the frame member 59, switch portions 69 to 71 and battery holder plate (battery fixing portion) 67 are respectively formed from one sheet of metal plate, preferably spring steel plate.

According to such embodiment one piece of the LCD fitting frame can also play a part in the switch plate moving elastically in response to the fixation of battery and the movement of the switch member. Thus the number of parts can be reduced so that the number of man-hours for assembly and the cost can be reduced.

Also since the LCD fitting frame according to this embodiment is easily mounted and removed, the assembly thereof is simple. Also since it is formed by suitable metal plate like spring steel plate, its bending strength is high so that the switch plate is not broken.

Further this invention is not limited to said embodiment. For example, the end of the fixing fit support may be press fit elastically into the hole of the package and the like.

As above mentioned, according to the LCD fitting frame of this invention, the liquid crystal panel and the battery can be fixed at the same time, while displaying the function of the switch. Thus the number of parts and the production cost of electronic watch can be reduced.

This invention relates to the LCD fitting frame in the liquid crystal display type of electronic watch. Generally the switch of the liquid crystal display type of electronic watch consists of a switch transmitting signals to the internal circuit of the IC and a switch of the external circuit for lighting the lamp illuminating the digital display surface. Either of these switches accomplishes a switching function with one of the electrodes of the battery. The power source for this switch in the case of a usual metal watch uses the whole case as one electrode and a switch member having a crown mounted on the case as the other electrode through the case. Thus the package on which respective electronic parts such as LCD are mounted is provided with the switch plate opposite to the end of said switch member. The arrangement and construction of this switch plate shown in FIGS. 36(a), (b) are known. In the construction shown in FIG. 36(a) the switch plate 27 of metal plate is fixedly soldered to the upper edge of ceramic plate (or printed plate and the like) 26 to place this switch plate 27 at the end of the switch member 28. Also in the construction of FIG. 36(b), one end of supporting base plate 29 formed by a tape carrier (tape in which polyamide tape is provided on its front and rear surface with the conductive layer having desired pattern while the conductive layers on the front and rear surfaces are connected with each other by conductor extending through polyamide tape at the predetermined portion and further semiconductor elements are fixed to the predetermined portion) or lead frame is bent to use its upright portion as switch plate 30 on which the end of the switch member 31 is located.

However the former construction needs the switch plate 27 in addition to the ceramic plate 26 or printed plate, etc. to increase the number of parts, while having the disadvantage that the switch plate 27 is soldered to the ceramic plate and others with difficulty.

Also since thin polyamide resin occupies the main portion of the tape carrier, the latter construction has little rigidity and needs a guide for making the portion of switch plate 30 upright to increase the number of parts. Also the lead frame of phosphorus bronze plate (PBP) or ferronickel alloy plate has the disadvantage of low bending strength and liability to breakage.

On the other hand, as shown in FIG. 37, in the case of the luminous diode type of digital watch a construction is known in which the end of the pressure plate 34 for the battery 33 mounted on the package 32 is bent to form the switch plate 35 which is located on the end of wiring plate 36, while the end of switch member 37 is located in the neighbourhood of the switch plate 35. In this luminous diode type, the pressure plate 34 for battery is formed by metal, the end thereof being arranged to make contact with the end of the wiring plate 36 when the former is subjected to the external force. Hence the case does not have to be made of metal. Since a portion of the pressure plate 34 for battery also plays the part of the switch plate 35, new space for mounting the switch plate is not needed and a compact construction is advantageously obtained.

On the other hand in the liquid crystal display type of electronic watch, the liquid crystal needs to be always fixed to the supporting base plate and a conventional construction is employed in which the liquid crystal is fixedly held by one end of the lever directly or indirectly fixed to the package on the other end.

This invention relates to the LCD fitting frame developed and improved from this lever and said pressure plate and having a switch portion, battery fixing portion, liquid crystal portion and fixing fit portion.

Accordingly the number of parts for the liquid crystal display type of electronic watch is reduced by this invention to thereby reduce the production cost.

Thus this invention is constituted from conductive materials comprising fixing fit supports fixedly fitting in the package containing a partially exposed conductive plate (wiring plate) of the predetermined pattern and having fitting grooves for mounting parts such as LCD, crystal oscillator, battery, etc. on the desired portions, a LCD fixing portion for fixing LCD between said support and the package, a battery fixing portion for fixing the battery between said support and supporting base plate and a switch portion located at the movable end of a switch member to make contact with the predetermined exposed conductive plate of the package by the contact with the switch member during the movement.

EMBODIMENT II

Hereinafter another embodiment of this invention, an electronic watch using IC, will be concretely described with reference to the drawings. First the package will be described in which the enclosure of IC according to this invention is completely separated from the block receiving the externally mounted electronic parts of IC, and combined with the block by the lead conductor molded by one sheet of lead frame.

FIG. 38 is a perspective view showing the package according to this invention. As shown in the drawing the package 79 according to this invention is one in which the enclosure 80 enclosing IC (not shown) is integrally combined with the block 81 receiving the external electronic parts by the lead conductor, but the enclosure 80 and the block 81 are arranged separately from each other and are molded by the use of resin material. Further 82a to 82d designate respective lead conductor portions exposed in the lead conductors. The block 81 molded from resin is provided on the surface with grooves and holes for receiving electronic parts. 83 designates the hole for receiving battery, 84 the groove for receiving crystal oscillator, 85 the groove for receiving temperature compensation capacitor, 86 the groove for receiving trimmer capacitor and 87 the groove for receiving chip capacitor. Also 88 to 89 designate the grooves for connecting electrically the external terminal of the crystal oscillator and the lead conductor, the grooves being provided on their bottom with an exposed portion of the lead conductor. 90 and 91 designate the grooves for electrically connecting both external terminals of trimmer capacitor and the lead conductor. 92 designates the four threaded through holes for fastening the display device fitting plate to the package 79, 93 designates the groove for receiving lamp, and 94, 95 the groove for interconnecting electrically the external terminal of lamp and the lead conductor. Further LCD is used for the display device and mounted on the resin enclosure 80 of IC through the zebra-connector to fit into the guide groove 96 of the resin block 81.

Next an example of the fabricating method of this type of package 79 will be described by the order of the process.

Figure 39:
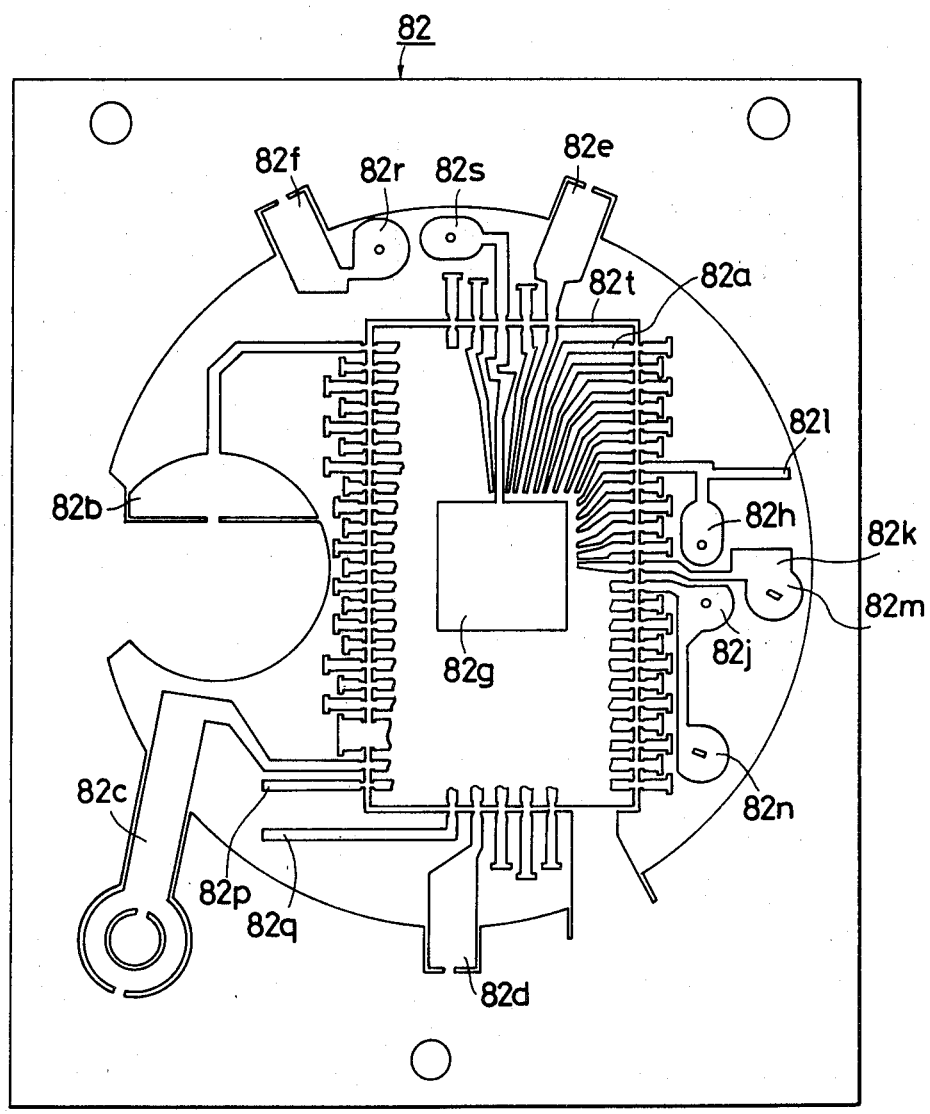

(1) The lead frame 82 shown in FIG. 39 is prepared as starting material. This lead frame 82 is made of about 0.15 mm thick ferronickel alloy plate and the like and formed with respective external lead conductors of IC and wiring lead conductors of the externally mounted electronic parts.

82 designates the lead conductor electrically connected to the pad electrode on the surface of IC chip, 82b and 82c the wiring lead conductors connected to (+) and (−) poles of battery respectively, 82d, 82e and 82f the wiring lead conductor for switch, 82g the tab to which IC chip is die bonded, 82h, 82j, 82k, 82l, 82m, 82n, 82p, 82q, 82r and 82s the terminals of the lead conductors through which crystal oscillator, temperature compensation capacitor, trimmer capacitor, chip capacitor and lamp are respectively connected electrically to the external terminal of IC. 82t designates the dam for preventing resin flow in the resin molding.

Further the lead frame 82 shown in the drawing is partially cut away for the convenience of illustration.

Figure 40:
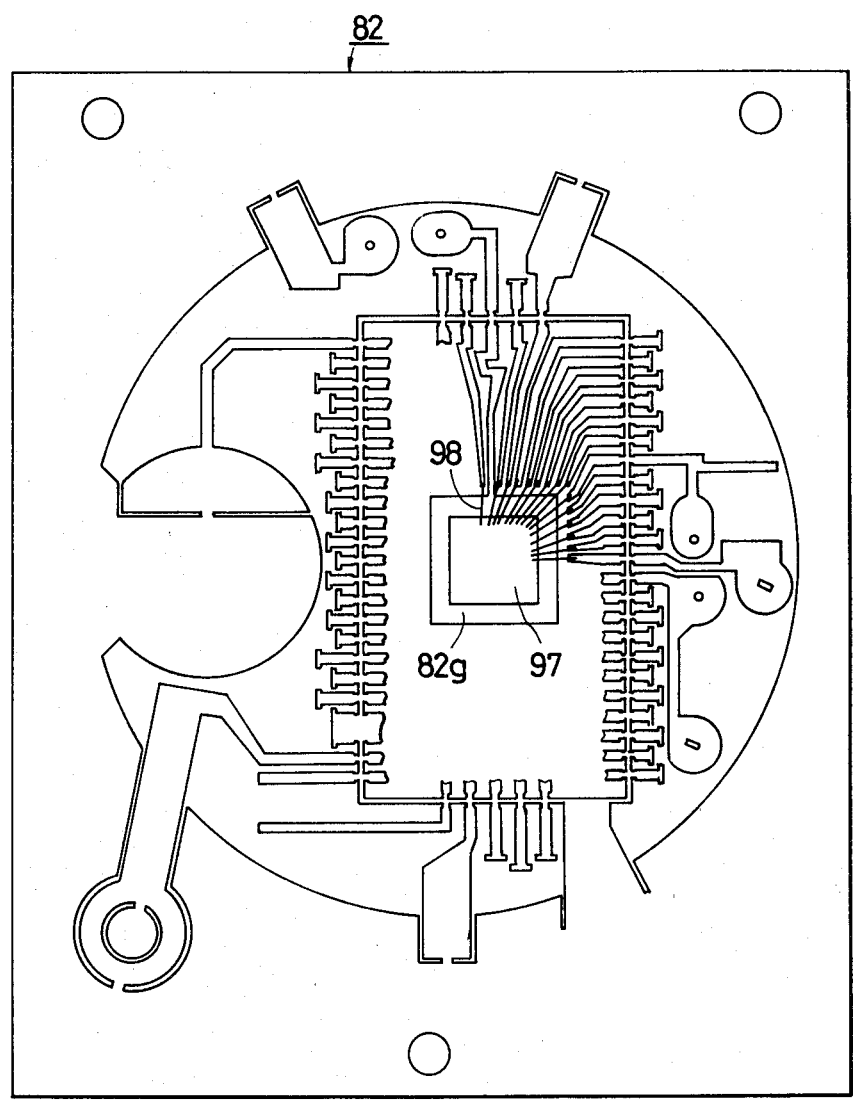

(2) After die-bonding of IC chip 97 to the tab 82g in the lead frame 82, the pad electrode in the IC chip 97 and the lead conductor 82a in the lead frame 82 are interconnected with thin metal wire 98 like gold, aluminum, etc. (FIG. 40). This is readily accomplished by wire bonding such as thermal welding, supersonic bonding, etc. well known in the art.

Figure 41:
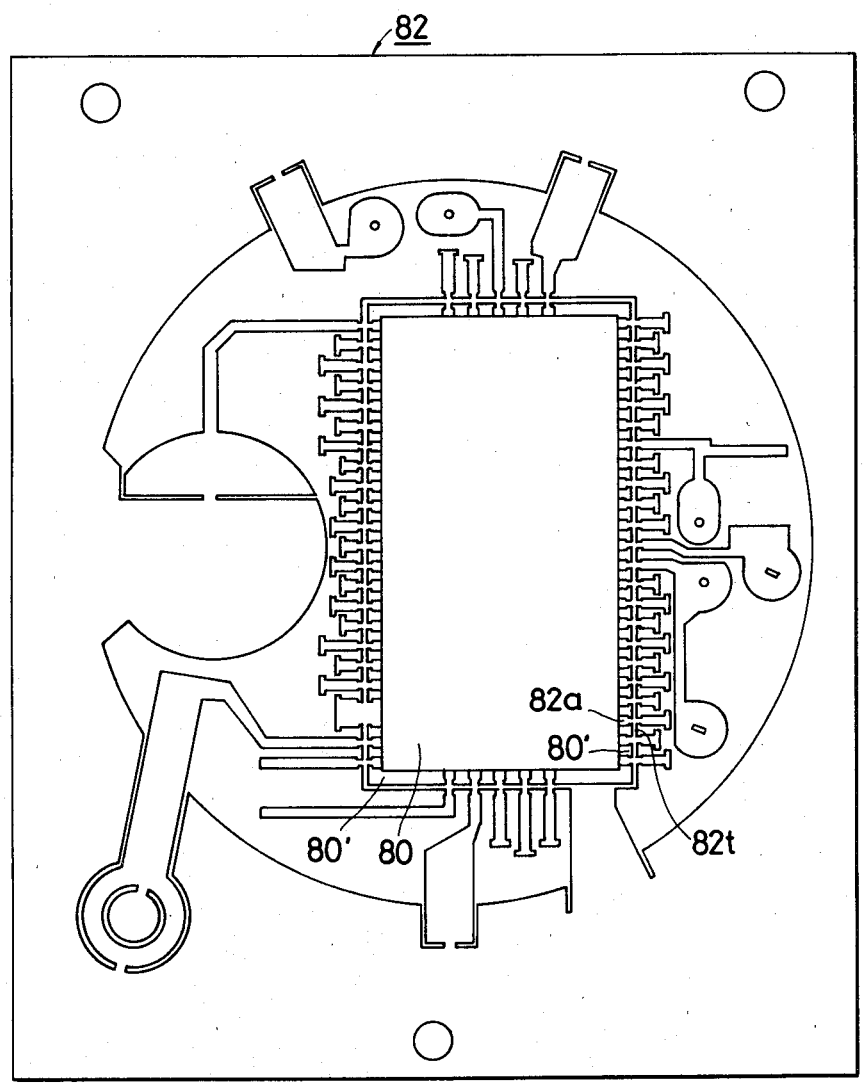

(3) IC chip 97 is resin enclosed by transfer molding method and others (FIG. 41). Epoxy resin and the like with excellent moisture proof, chemical stability, etc. are used for the resin to be used.

Figure 42:
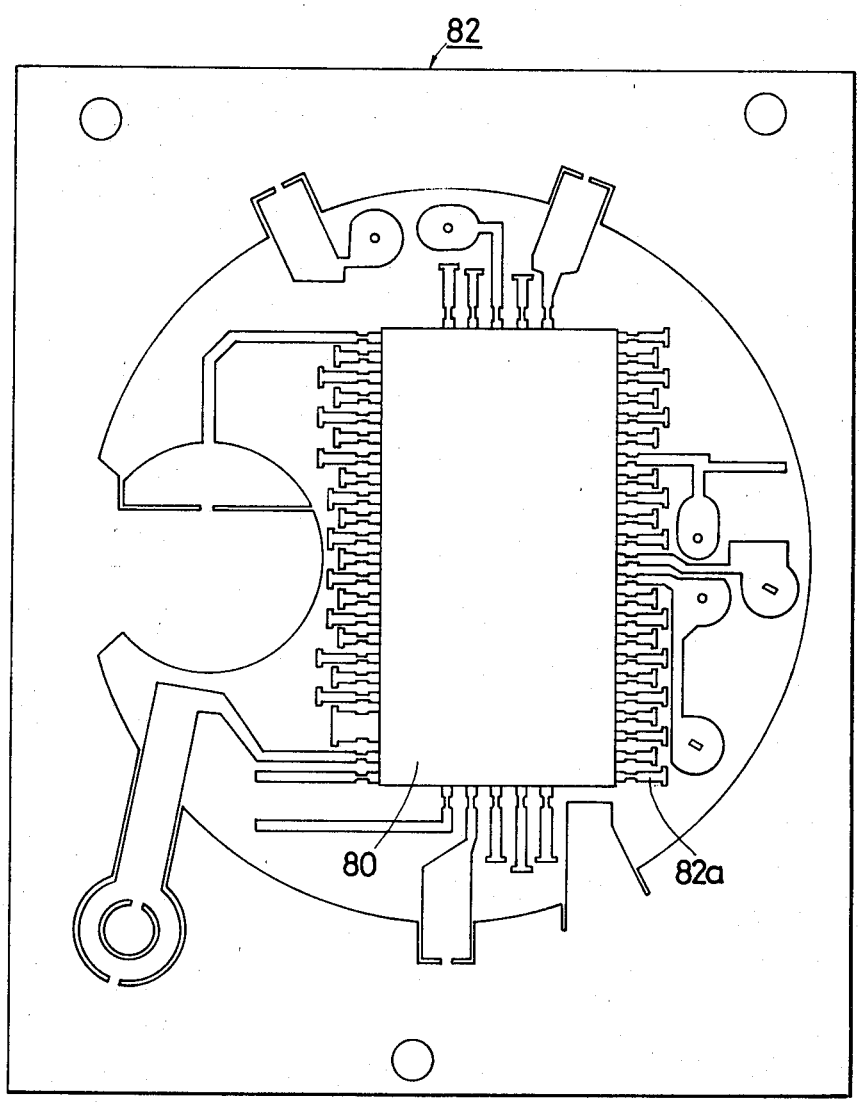
Figure 43:
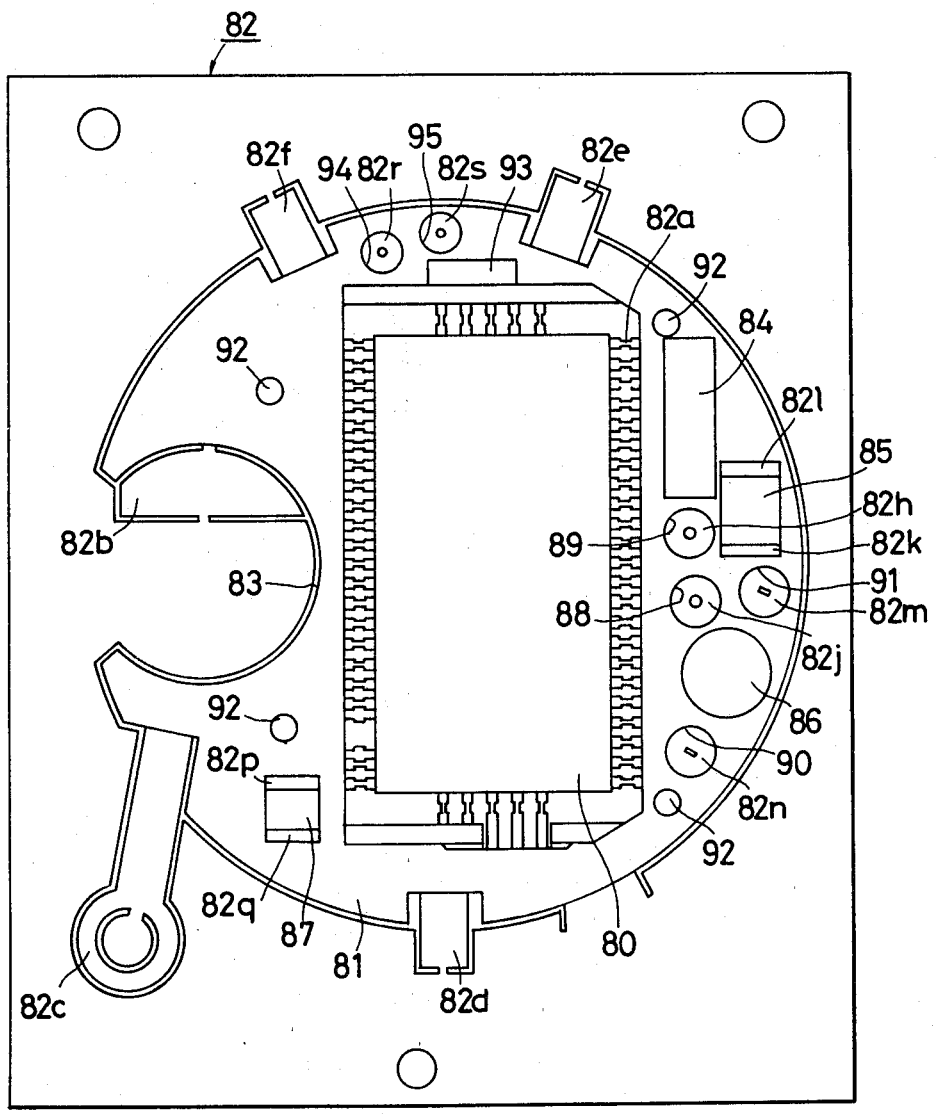

In this case since resin fins 80' are formed around the enclosure 80, the removal of the resin fins are carried out together with the cutting-off of the dam. (FIG. 42).

(4) The block 81 receiving the externally mounted electronic parts of IC is formed by injection molding method, transfer molding method, etc. (FIG. 43) Resin with excellent mechanical strength, molding property, mold releasing property, low thermal deformability, etc. is used. Grooves and holes for receiving electronic parts are provided in this block 81. 83 is a hole for receiving battery. Also 84, 85, 86, 87, 93 are grooves for receiving crystal oscillator, temperature compensation capacitor, trimmer capacitor, chip capacitor and lamp respectively. 88, 89, 90, 91, 94 and 95 are the grooves for the electric connection of said electronic parts, the lead conductor 82b to 82s being exposed at the bottom of the groove.

Figure 44:
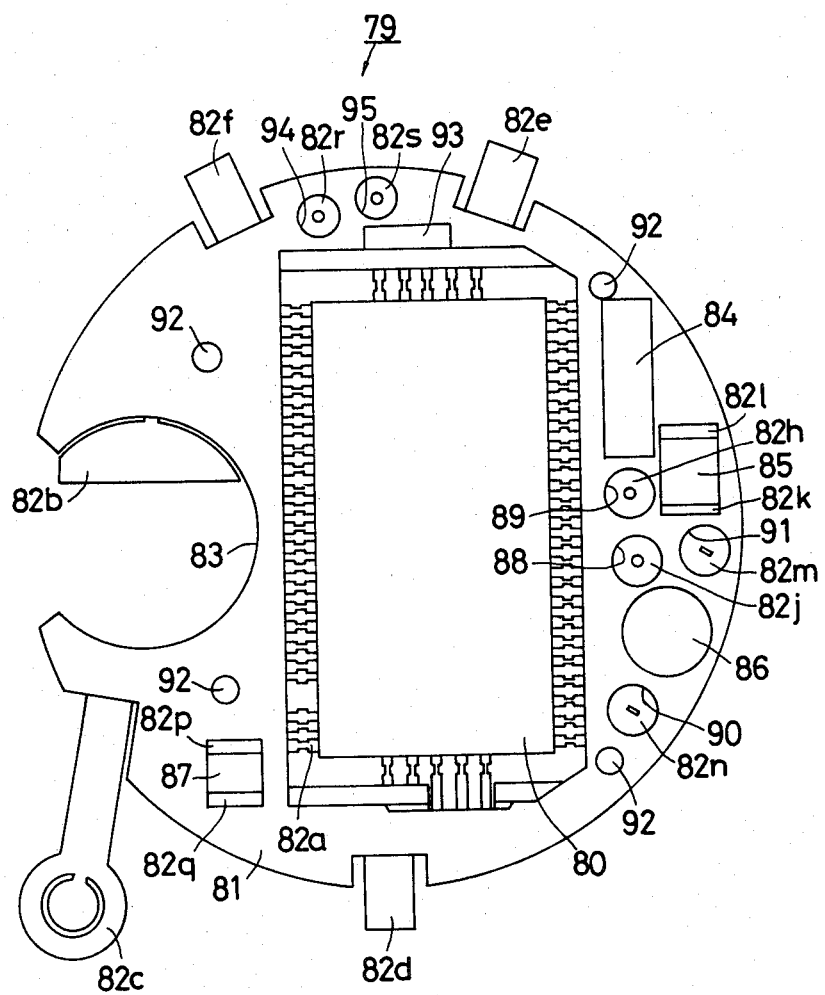
Figure 45:
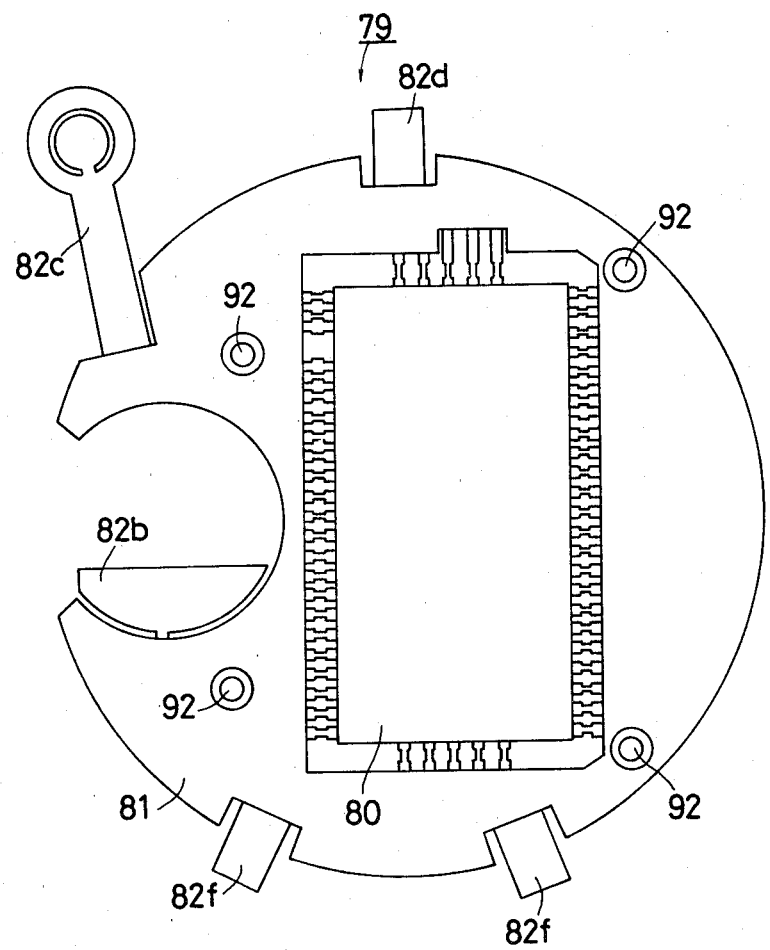

(5) The outer frame of the lead frame 82 is cut off to obtain the package 79. A plan view of the package 79 is shown in FIG. 44 and the rear view in FIG. 45.

Next the mounting and assembling of the electronic watch according to this invention will be described. As shown in the schematic assembly drawing of FIG. 46, each hole and groove in the block 81 of resin in the package 79 receive respectively the crystal oscillator 99, temperature compensation capacitor 100, trimmer capacitor 101, chip capacitor 102, lamp 103 and battery 104. Each terminal of these parts is fixedly secured to the exposed surface of the lead conductor by spot welding, solder, silver paste, etc. Before or after this assembly process the lead extending along the side wall of the block 81 of resin is bent. Then LCD 106 and the LCD mounting plate 107 are mounted through zebra-connector 105 on the resin enclosure 80 of IC in the package 79 in which these electronic parts are built, and fastened to the resin block 81 by the use of screw 108 and screw fastener 109 to obtain module 110.

According to this invention the enclosure 80 of IC is arranged separately from the block 81 receiving the crystal oscillator 99, capacitors 100 to 102, in addition battery 104, etc., the clearance between both parts being utilized as the portion for electrically connecting LCD 106 to IC through the zebra-connector 105. Since the lead conductor 82a exposed in this clearance is embedded on its both ends in the enclosure 80 and the block 81 to be mechanically reinforced, the lead conductor 82a, even when pressed in the mounting of LCD 106, can not be deflected and displaced. Hence the fact that the block 81 is arranged separately from the enclosure 80 of IC prevents the performance of IC from degradation caused by the block 81 and have the large effect on the utilization of the clearance produced by said fact as the portion for mounting, locating and receiving said zebra-connector 105, LCD 106, etc. and on the utilization of the mechanical reinforcement of the lead conductor 82a in addition on the facet of molding work.

FIGS. 47 and 48 are schematic perspective views of the package in the electronic device of another embodiment according to this invention. In the same drawings, 111 designates the resin enclosure of IC, 112 the resin block for receiving the external electronic parts. FIG. 47 shows two ICs and the resin enclosure thereof built in the predetermined portion on the resin block 112. FIG. 48 shows the package in which the enclosure 111 consisting of three IC and resin thereof and the block 112 consisting of two resins are integrally combined by the lead conductor molded by one sheet of the lead frame.

Also FIG. 49 is a schematic perspective showing another embodiment according to this invention. The same drawing shows the electronic device in which the lead conductor 115 is conducted out to the periphery of the enclosure 113 enclosing IC with resin and the end of the lead conductor 115 is embedded in the block 115. The connector like zebra-connector is interposed on the lead conductor 114 between the enclosure 113 and the block 115 to be used for the mounting of electronic parts like LCD. The block 115 reinforces mechanically the lead conductor 114 to prevent the lead conductor 114 from deflection and the like, while locating spatially the enclosure 113 to form the receiving portion of the externally mounted electronic parts.

As above mentioned, this invention can be applied to electronic devices of various embodiments to provide a compact and high reliability electronic device.

According to this invention, an electronic device is provided in which (1) the enclosure of semiconductor having an unstable surface like an IC, transistor, etc. is separated completely from the block receiving the electronic parts mounted externally of the enclosure (for example, crystal oscillator, capacitor and the like, battery, display device like LCD, LED, etc.) so that the deformation, strain, etc. of the block do not interfere with the properties of the elements in said enclosure, and (2) the enclosure and the block spaced therefrom are combined by the lead conductor, while maintaining their spatial positions, and in addition the electronic parts received in the latter block are electrically connected to the elements in the enclosure.

Thus this invention is characterized in that the enclosure of IC and the like is completely separated from the block receiving the electronic parts mounted externally of the enclosure.

Accordingly (a) No deformation and strain of the block are produced which affect the elements in the enclosure. Thus the degradation of the properties of the elements are easily avoided.

(b) Materials for enclosing the elements and ones for molding the block can be selected suitably for their objects. Thus for enclosing the elements, irrespectively of the block, are used materials (resin, glass, etc.) which have excellent moisture proof, few degradation and unfavourable impurities such as sodium, chlorine, etc. particularly impurities liable to act as ion, high chemical stability and adhesive property to the lead conductor. On the other hand the materials (resin, ceramic, etc.) can be used for molding the block, which, irrespectively of said enclosure of elements, have excellent mechanical strength, molding property and mold releasing property, small thermal deformability, high thermal stability and shock resistance, small difference of thermal expansion coefficient from that of the lead conductor and precise workability. Also they can be selected from materials having low cost, differing from the former materials for enclosing elements. Further since materials for enclosing elements are different from those for molding the block, the materials for use can be selected with high degree of freedom.

Generally thermosetting materials are used for enclosing the elements and the use of them is not limited to the molding of the block. The thermoplastic materials also can be applied to the molding of the block.

(c) Opaque black resin can be used for enclosing elements and transparent resin which facilitates the assembly of the external electronic parts and provides high product value can be used for molding the block. In this way the mating materials can be distinguished.

(d) While only the block can be separated to permit only the enclosed semiconductor elements to be sold as product, only the block can be sold as product. Also when defective products are found in either of them, the lead in the boundary between them can be cut off to replace that products by other good ones.

(e) This invention can provides an extremely compact device since IC occupying small space is the main circuit element and the externally mounted electronic parts of IC having small external dimension are constructed for use to be received completely in the grooves and holes provided in the block.

(f) In the fabrication of this type of module the enclosure is separated from the block so that the fabricating methods of various embodiments can be employed. Thus molding methods or apparatus can be selected which are the most suitable for their application.

For example the following method can be employed.

(f-1) After the semiconductor elements such as IC are mounted on the lead frame and enclosed, the block is formed. Since the surface of the semiconductor element is unstable, the enclosure is preferably carried out before the block is molded. On the other hand, differing from said method another method may be employed that after the block is formed with the lead frame embedded, the semiconductor elements such as IC are mounted on the lead frame and enclosed.

In this method two metal molds for molding, i.e. metal molds for enclosing elements and for molding the block, are needed. However in this method the dam is not needed to be provided on the lead frame between the enclosure of elements and the block for preventing resin flow during molding work. This is because the enclosure (or the block) previously molded acts as stopper against the resin flow and the like flowing out of the metal mold in the subsequent molding of the block (or the enclosure). Thus, by means of this method, the work of cutting off the dam on the lead frame is not needed and the simple-shaped lead frame can be advantageously used.

(f-2) The absence of the dam on the lead frame in said (f-1) method necessitates the cutting-off of the unnecessary portions such as resin fins produced in the enclosing of elements of IC and the like and in this case the lead frame may be deformed. To prevent this the dam is provided on the lead frame to form the enclosure of elements and the block according to (f-1) method.

(f-3) The dam is provided on the lead frame and the enclosure of elements and the block are formed at the same time by the use of one molding metal mold. This method is particularly useful when the pressure resin injection port for enclosing elements can be provided separately from the pressure resin injection port for molding the block to form the enclosure of elements and the block by the use of suitable resin. Since this method uses one metal mold to mold the enclosure of elements and the block at the same time, it has high versatility and productivity.

As detailed hereinbefore, the electronic device such as electronic watch according to this invention minimizes the space occupied by module and can be fabricated simply with high productivity, reliability and performance.

EMBODIMENT III

Hereinafter with reference to the drawings will be concretely described an electronic watch using IC, an embodiment of this invention. First will be described and package featured by this invention, which has the receiving portion enclosing IC to receive electronic parts connected electrically to IC, while having as the main element the resin block partially embedding the lead conductor interconnecting electrically IC and electronic parts.

FIG. 50 is a perspective view showing the package according to this invention. As shown in the same drawing the package 116 according to this invention is characterized in that the resin enclosure 117 enclosing IC (not shown) is extended to constitute the resin block 118 having the receiving portion receiving the external electronic parts, and the lead conductor makes ohmic contact by the mechanical pressing force of LCD and the like, both ends of the exposed portion 119a for the ohmic contact in the lead conductor being embedded respectively in the resin enclosure 117 and the resin block 118 to be supported by them with high mechanical strength and make high reliability ohmic contact with the external electronic parts such as LCD electrically connected to the portion.

Referring to the same drawing for the detailed description of the package 116, IC is enclosed in the resin enclosure 117 and the resin block 118 embedding the lead conductor (exposed lead conductors 119a to 119d are shown in the drawing) connected electrically to IC is integrated with the resin enclosure 117.

The surface of the resin block 118 is provided with grooves and holes for receiving electronic parts. 120 designates the hole for receiving battery, 121 the groove for receiving crystal oscillator, 122 the groove for receiving temperature compensation capacitor, 123 the groove for receiving trimmer capacitor and 124 the groove for receiving chip capacitor. Also 125, 126 designate the grooves for inteconnecting electrically the external terminal of crystal oscillator and the lead frame 119, the bottom of the groove being provided with an exposed portion of the lead conductor. 129 designates four threaded through holes for fastening the LCD fitting plate to the package 116. 130 is the groove for receiving lamp and 131, 132 the grooves for electrically interconnecting the external terminal of lamp and the lead conductor.

133 is the guide groove for electrically connecting LCD to the lead conductor 119a on which LCD is mounted through the zebra-connector (elastic conductor), and these are pressed by the LCD fitting plate to engage with each other. This lead conductor 119a is supported on both ends by the resin enclosure 117 and the resin block 118 and is neither bent nor broken even by the ohmic contact of LCD, i.e. the externally mounted electronic parts due to said pressing and permits the good ohmic contact without adversely affecting lining-up property and flatness.

As above mentioned the package 116 according to this invention is characterized in that the resin enclosure 117 enclosing IC is extended to provide the resin block 118 in which the receiving portions such as grooves and holes for receiving the electronic parts are formed, while the electronic parts making ohmic contact due to their being pressed by the LCD and the like are mounted on the resin enclosure 117 of IC to support both ends of the lead conductor 119a thereon.

Next an example of the fabricating method of this type of package will be described by the order of process.

Figure 51:
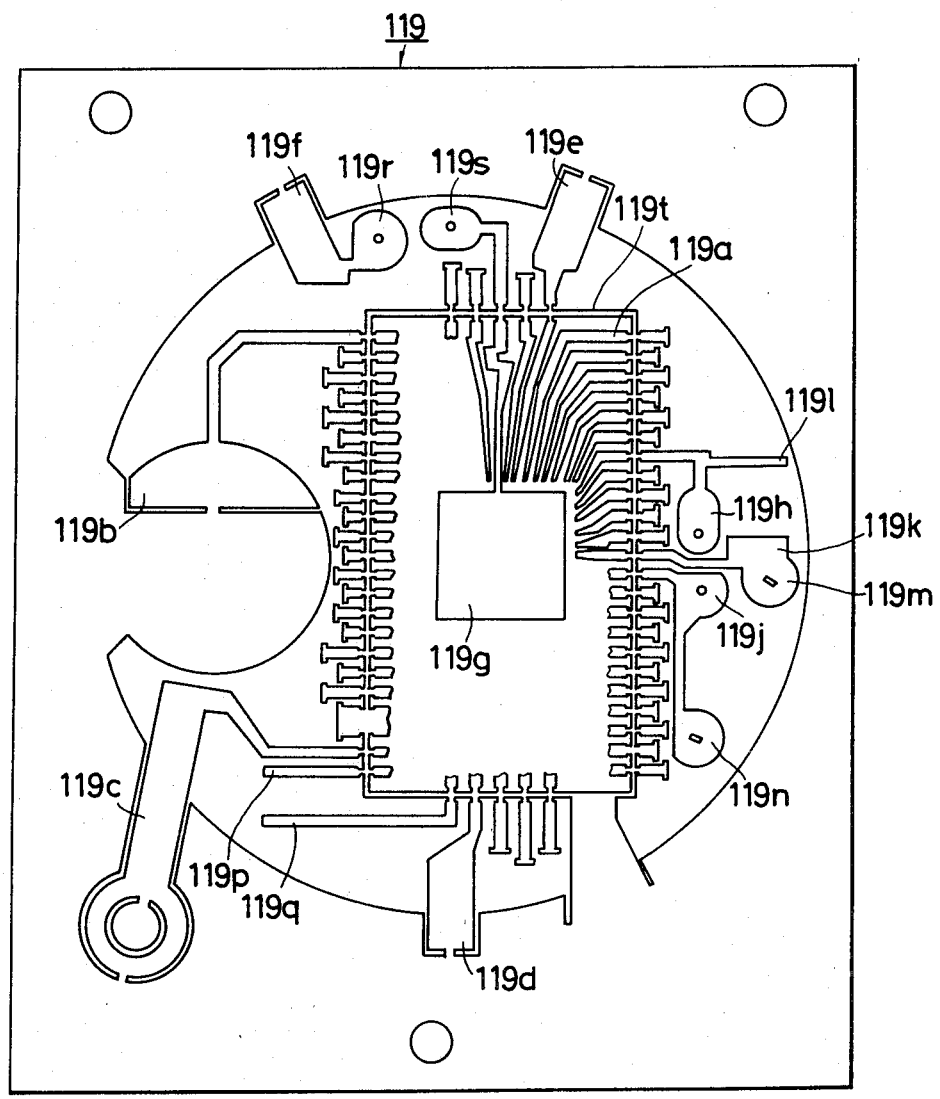
Figure 52:
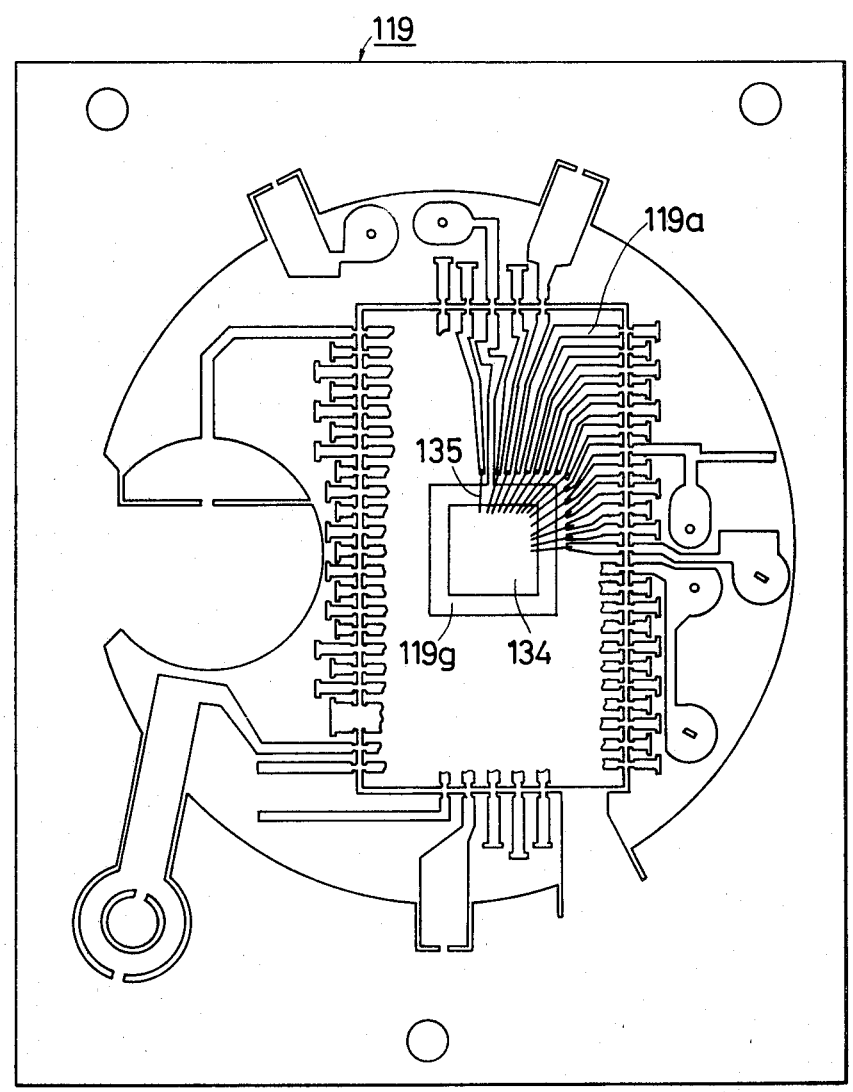

(1) The lead frame 119 shown in FIG. 51 is prepared as starting material.

This lead frame 119 is made of about 0.15 mm thick ferronickel plate and the like and formed with wiring lead conductor for respective external lead conductor and externally mounted electronic parts of IC. 119a is the lead conductor electrically connected to the pad electrode on the surface of IC tip, 119b, 119c the wiring lead conductors connected to (+) and (−) poles of battery, 119d to 119f the wiring lead conductors for switch, 119g the tab to which IC tip is die bonded, 119h and 119j, 119k and 119l, 119m and 119n, 119p and 119q, 119r and 119s the lead terminals for electrically connecting the external lead of IC to the crystal oscillator, temperature compensation capacitor, trimmer capacitor, chip capacitor and lamp respectively. And 119t is the dam for preventing the resin flow in the resin molding.

Further the lead frame 119 shown in the drawing is partially cut away from the convenience of illustration.

(2) After die bonding of IC chip 134 to the tab 119g on the lead frame 119 the pad electrode in the IC chip 134 and the lead conductor 119a on the lead frame 119 are interconnected by thin wire 135 of metal like gold, aluminum, etc. (FIG. 52) This is easily accomplished by the well known technique like thermal welding, supersonic bonding, etc.

Figure 53:
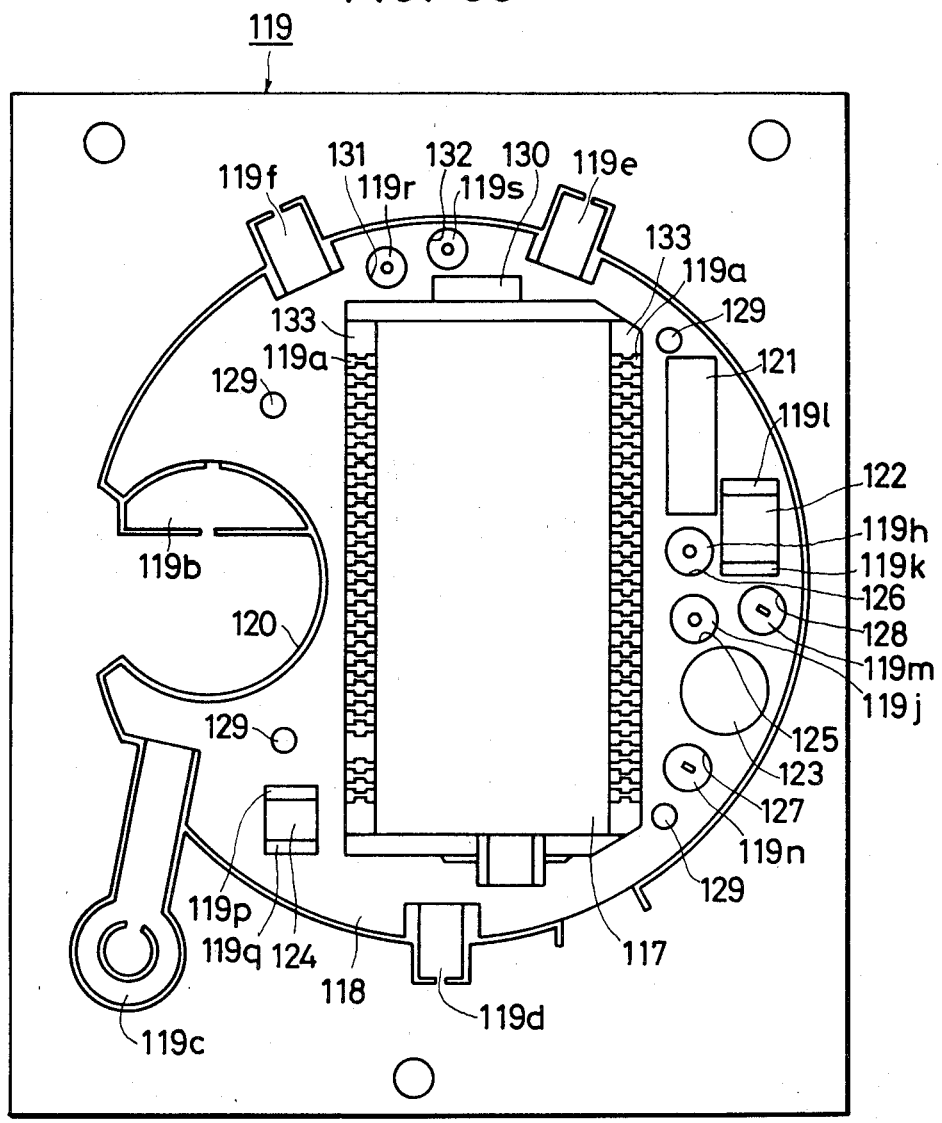

(3) The resin enclosure 117 is formed by resin enclosure of IC chip 134 through transfer molding method and the like, while the resin block 118 is formed which has the receiving portion for receiving electronic parts (FIG. 53). The grooves and holes for receiving the electronic parts in the resin block 118 comprise the hole 120 for receiving battery, grooves 121 to 124, 130 for receiving crystal oscillator, temperature compensation capacitor, trimmer capacitor, chip capacitor and lamp respectively and the grooves 125 to 132 for connecting electrically these electronic parts to IC chip 134. The lead conductors 119b to 119s are exposed on the bottom of the grooves 125 to 132. 133 is the guide groove for receiving LCD and in the guide groove the lead conductor 119a is exposed with its both ends supported.

Further since in said resin molding resin fins are formed in the portion of the lead conductor 119a between the resin enclosure 117 and the resin block 118, they are removed while the dam is cut off.

Figure 54:
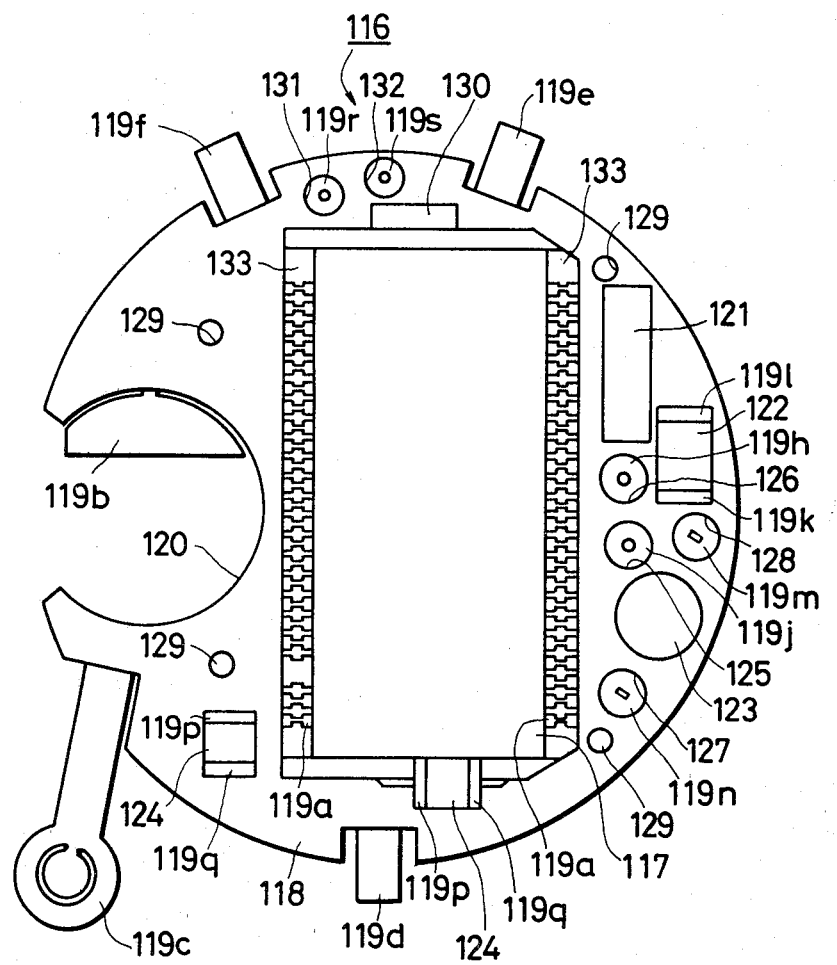
Figure 55:
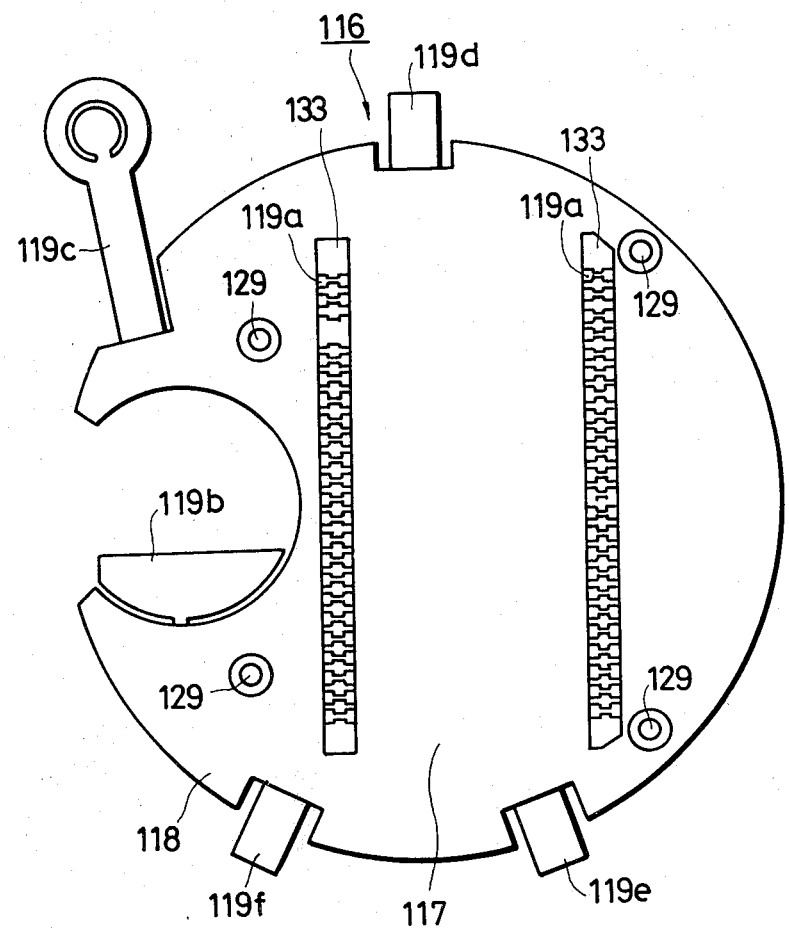

(4) The outer frame of the lead frame 119 is cut off to obtain the package 116. A plan view of the package 116 is shown in FIG. 54 and the rear view in FIG. 55.

Next the mounting and assembly of the electronic watch according to this invention will be described. As shown in the schematic assembly drawing of FIG. 56, the crystal oscillator 136, temperature compensation capacitor 137, trimmer capacitor 138, chip capacitor 139, lamp 140 and battery 141 are received in respective grooves and holes of the resin block 118 in the package 116 and respective terminals of said elements are fixedly secured to the exposed surface of the lead conductor by spot welding, solder, silver paste, etc. Before or after this assembly process the lead conductor extending along the side wall of the resin block 118 is bent.

Then LCD 143 and the LCD fitting plate 144 are placed through the zebra-connector 142 on the lead conductor 119a in the package 116 in which various electronic parts are built, and fitted to the package 116 by the use of screw 145 and screw fastener 146 to provide the module 147.

As detailed hereinbefore, the module 147 for electronic watch according to this invention has the lead conductor 119a supported on both ends by the resin enclosure 117 of IC and the resin block 118 and the LCD 143 making ohmic contact with the lead conductor by the mechanical pressing force through the zebra-connector 142. Since this ohmic contact uses the lead conductor 119a supported on both ends, it is extremely stable, reliable and simple in manipulation. This is because the both ends of the lead conductor 119a are embedded respectively in the resin enclosure 117 and the resin block 118 to be reinforced mechanically so that the lead conductor 119a is not deflected and displaced even by the pressing force in the mounting of the LCD 143.

Also the module 147 according to this invention uses the resin enclosure 117 of IC and the resin block 118 for supporting the lead conductor 119a at both ends and in addition utilizes the interval between the both ends for mounting, locating and receiving the zebra-connector 142, LCD 143, etc. Hence the module is constructed to be extremely compact with very little useless space.

Thus the electronic device according to this invention comprises IC, the resin enclosure for enclosing IC, electronic parts such as battery, capacitor, indicator element like LED, LCD, etc. connected electrically to IC, conductors such as lead conductor molded from lead frame electrically interconnecting these electronic parts and the IC and molded from lead frame, and resin block having receiving portion such as grooves and holes for receiving said electronic parts, the conductor making ohmic contact by mechanical pressing force of the indicator element and the like, both exposed ends of the conductor for making ohmic contact being embedded in the resin enclosure and the resin block to be supported on both ends with large mechanical strength and ensure high reliability ohmic contact with the electronic parts electrically connected to that conductor portion.

This invention is not limited to said embodiment, but can applied to the electronic devices of the various embodiments. Hereinafter each embodiment of this invention will be described.

(1) FIG. 57 is a perspective view showing a package 116' in the electronic watch module of an embodiment of this invention. As shown in the same drawing, the resin enclosure 117 of IC and the resin block 118 having portions for receiving the externally mounted electronic parts of IC support the lead conductor 119a at both ends and spaced completely from each other. This type of package 116' is constituted from the resin enclosure 117 of IC and the resin block 118 which are individually separated from each other so that the resin materials for them can be selected with high degree of freedom. The resin with high moisture proof, chemical stability, etc. can be used for the resin enclosure 117 and the resin with excellent mechanical strength, molding property, mold releasing property, few thermal deformation, etc. is used for molding the resin block 118.

(2) FIG. 58 is a perspective showing the package 116" in the electronic watch module of an embodiment of this invention.

As shown in the same drawing the resin enclosure 117' enclosing IC and the resin block 118' having portions for receiving the externally mounted electronic parts of IC are separately formed and fixedly secured to each other by soldering and the like through their lead conductors 119a', 119a" to fabricate the package 116". The lead conductor 119a of such construction is supported also on both ends to provide high mechanical strength and high reliability ohmic contact. In this embodiment, IC and the resin enclosure 117' thereof and the resin block 118' can be sold as a product separately, while defective ones can be easily replaced by good ones if found in either of them.

(3) In said electronic watch module according to this invention the lead conductor 119a is supported on both ends by the resin enclosures 117, 117' of IC and the resin blocks 118, 118'. The lead conductor 119a may be supported on both ends only by the use of the resin block in which IC is enclosed.

Also the electronic parts such as LCD making ohmic contact by mechanical press, the electronic parts such as LED making ohmic contact by fixation such as soldering, etc. are used for the electronic parts electrically connected to the lead conductor 119a supported on both ends so that this invention can be applied to various electronic devices.

EMBODIMENT IV

Hereinafter an electronic watch using IC, an embodiment of this invention, will be concretely described with reference to the accompanying drawings. First a package will be described which fixedly sandwiches in IC having the lead conductor featured by this invention between the upper and lower surface resin blocks receiving the externally mounted electronic parts of IC.

FIG. 59 is a perspective view showing the package according to this invention. As shown in the drawing, the package 148 according to this invention is constituted from the IC 149 mounted on the lead conductor molded from the lead frame and resin enclosed, the upper surface resin block 150 and the lower surface resin block 150' both for receiving and locating the external electronic parts. The IC 119 having the lead conductors is fixedly sandwiched in between both resin blocks 150, 150' to be integrated with them. Further 151a to 151d designate each exposed lead conductor of the lead conductor. The resin blocks 150, 150' are provided with through holes for receiving electronic parts. 152 is the through hole for receiving batter, 153 the through hole for receiving crystal oscillator, 154 the through hole for receiving temperature compensation capacitor, 155 the through hole for receiving trimmer capacitor and 156 the through hole for receiving chip capacitor. Also 157, 158 are the through holes for connecting electrically both external terminals of crystal oscillator to the lead frame 151, and 159, 160 the through holes for electrically connecting both external terminals of trimmer capacitor to the lead conductor. 161 designates four threaded through holes for fitting the display device fitting plate to the package 148. 162 is the through hole for receiving lamp, and 163, 164 the through holes for electrically connecting the external terminal of the lamp to the lead conductor. Further LCD is used for the display device to be mounted on the resin enclosed IC 149 through zebra-connector to engage with the through hole 165 of resin block 150.

Next an example of the fabricating method of the IC 149 having this type of lead conductor will be described by the order of process.

Figure 60:
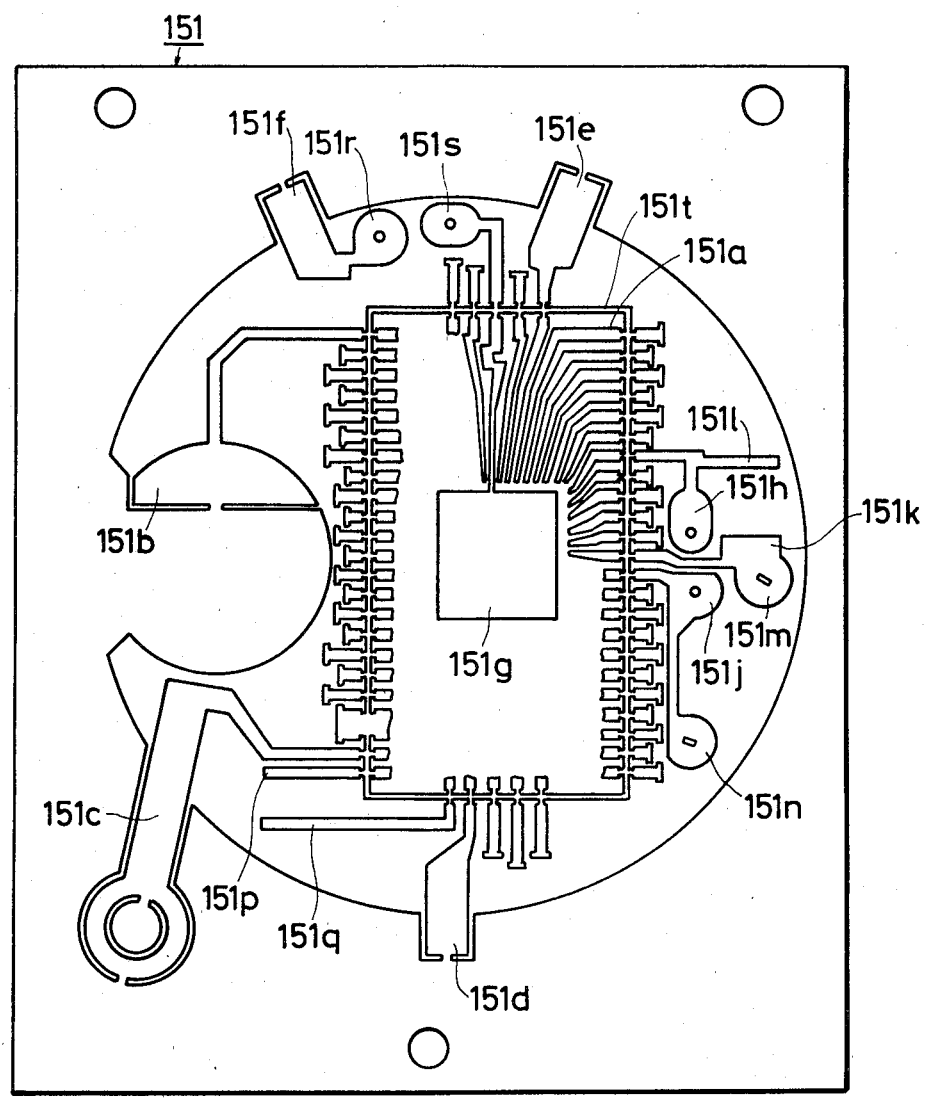

(1) The lead frame 151 shown in FIG. 60 is prepared as starting material. This lead frame 151 is made of about 0.15 mm thick ferronickel alloy plate and the like and formed with the wiring lead conductor for each external lead conductor and externally mounted electronic parts of IC.

151a is the external lead conductor electrically connected to the pad electrode on the surface of IC chip, 151b, 151c the lead conductors connected to (+) and (−) poles of battery respectively, 151d, 151e, 151f the lead conductors for switch, 151g the tab to which the IC chip is die bonded, 151h and 151j, 151k and 151l, 151m and 151n, 151p and 151q, 151r and 151s the terminals of lead conductors through which the external lead conductors of IC are electrically connected to crystal oscillator, temperature compensation capacitor, trimmer capacitor, chip capacitor, and lamp, respectively. And 151t is the dam for preventing the resin flow and the resin molding.

Further the lead frame 151 shown in the drawing is partially cut away for the convenience of illustration.

Figure 61:
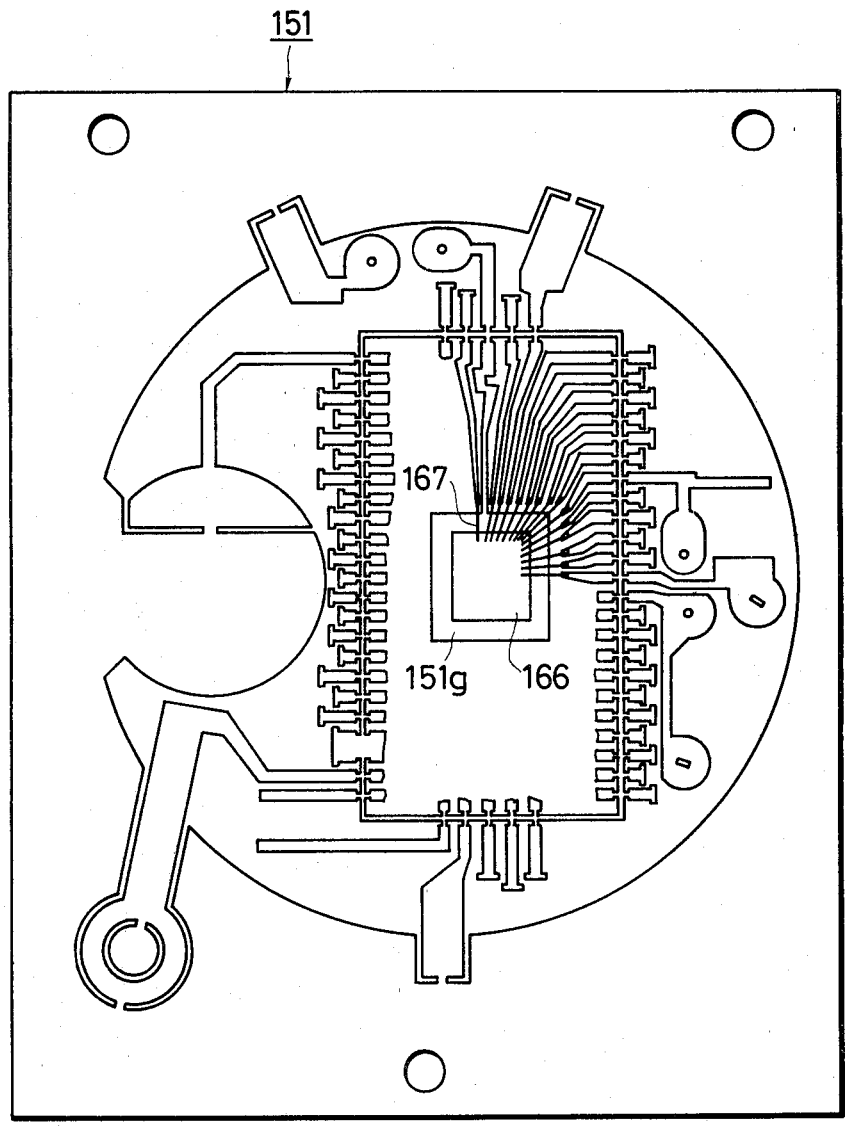

(2) After the IC chip 166 is die bonded to the tab 151g in the lead frame 151, the pad electrode in the IC chip 166 and the lead conductor 151a in the lead frame 151 are interconnected by thin wire 167 of metal like gold or aluminum (FIG. 61). This is easily accomplished by well-known techniques such as welding and supersonic bonding.

Figure 62:
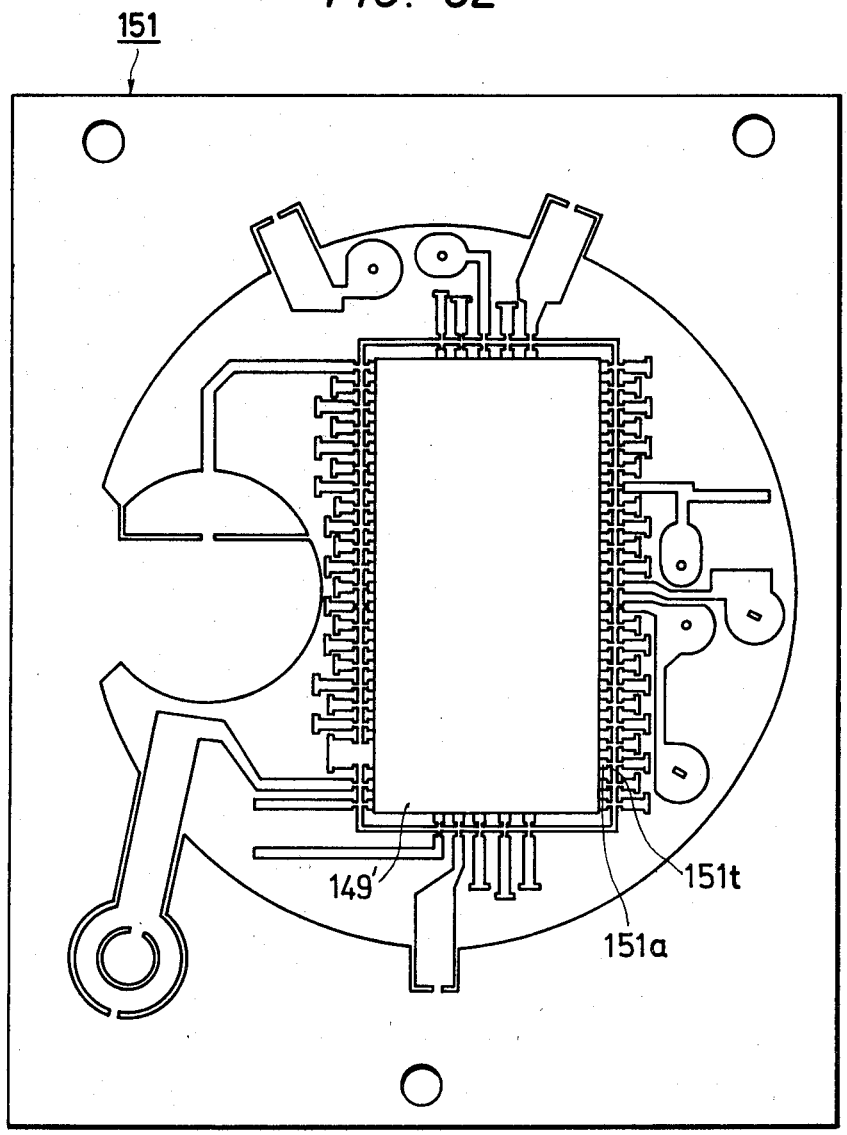

(3) The IC chip 168 is resin enclosed by a transfer molding method and the like (FIG. 62). Epoxy resin with excellent moisture proof, chemical stability, etc. is used for that method.

Figure 63:
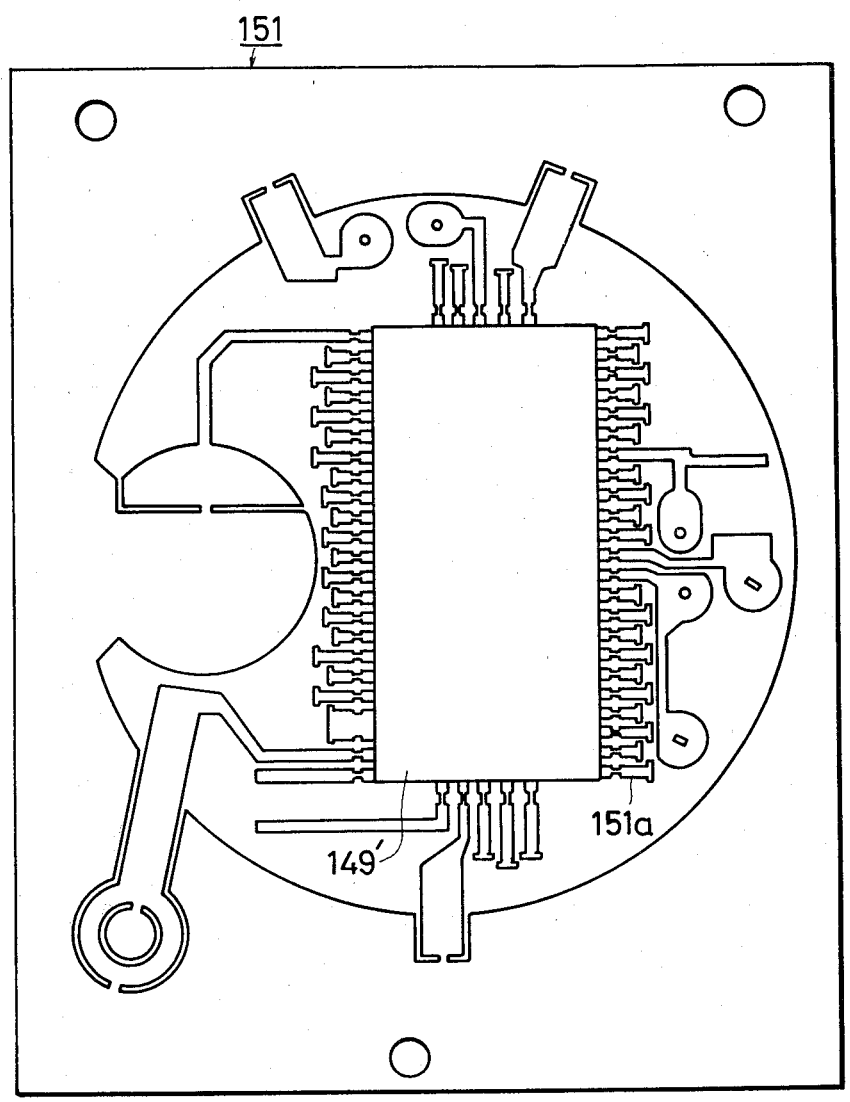

In this case since resin fins are formed around the enclosure 149' of IC 149, they are removed while the dam is cut off (FIG. 63).

Next an example of the fabricating method of the upper surface resin block 150 in which the electronic parts mounted externally of IC 149 are received and arranged at the predetermined positions on the lead conductor will be described. Namely the upper surface resin block 150 can be molded by injection molding or transfer molding (FIG. 64). Resin with excellent mechanical strength, molding property, mold releasing property, few thermal deformation, etc. is used for that method. This block 150 is provided with the through holes for receiving electronic parts. 152 is the through hole for receiving battery. Also 153, 154, 155, 156 and 162 are respectively the through holes for receiving crystal oscillator, temperature compensation capacitor, trimmer capacitor, chip capacitor and lamp, 157, 158, 159, 160, 163 and 164 being the through holes for electrically connecting said electronic parts to the lead conductors respectively.

Further the lower surface resin block 150' can be fabricated according to the fabricating method of the upper surface resin block 150 (FIG. 65).

Also in another embodiment of this invention the lower surface resin block 150' is integrated with the IC 149 having the lead conductors and can be formed by a simple method at the same time as the IC 149 is resin enclosed. In this case resin fins may be formed on the surface of the lead frame 151 in the resin molding. Hence the portion making ohmic contact with electronic parts in the lead frame 151 is preferably resin molded with a projection provided in the lower metal mold to prevent the formation of the resin fins in the resin molding. The lead frame 151 formed by the use of such metal mold for resin molding is exposed only on the surface making ohmic contact with electronic parts in the lead frame 151, the other portions being covered by resin fins so that the resin fins act effectively as a stopper against the flow of solder and others in fixing the electronic parts.

Next the mounting and assembly of electronic watch according to this invention will be described. As shown in the schematic assembly drawing of FIG. 66, the through holes of resin blocks 150, 150' in the package 148 receives respectively crystal oscillator 168, temperature compensation capacitor 169, trimmer capacitor 170, chip capacitor 171, lamp 172 and battery 173, each terminal of these parts being fixed to the exposed surface of the lead conductor by spot welding, soldering, silver paste, etc. Before or after this assembly process, the lead conductor extending to the side wall of the resin block 150, 150' is bent. Then LCD 175 and LCD fitting plate 176 are mounted through zebra-connector 174 on the IC 149 in the package 148 containing electronic parts, and fastened to the resin blocks 150, 150' by the use of screw 177 and screw fastener 178 to obtain module 179.

In this invention the IC 149 and the resin blocks 150, 150' receiving crystal oscillator 168, capacitors 169 to 171 and battery 173 are arranged independently of each other and the clearance between them is utilized for electrically connecting the LCD 175 to the IC 149 through zebra-connector 174. The lead conductor 151a exposed in the clearance is fixed on the both ends to the IC 149 and the resin blocks 150, 150' to be mechanically reinforced so that the lead conductor 151a is not deflected and displaced in the mounting of the LCD 175 even when it is pressed. Accordingly the fact that the resin blocks 150, 150' are spaced from the IC 149 has the effect of preventing the IC from the degradation of the performance due to the resin blocks 150, 150', the effect on the facet of molding work and in addition the large effect of utilizing said clearance as the portion for mounting, locating and receiving said zebra-connector 174 and the LCD 175 and as the mechanical reinforcement of lead conductor 151a.

As above mentioned, this invention can be applied to the electronic devices of various embodiments to provide the compact and high reliability electronic devices.

Thus this invention is characterized in that the electronic device is constituted from the IC mounted on the lead conductor and enclosed by resin, the electronic parts electrically connected to the IC through the lead conductor and the upper surface and lower surface resin blocks having portions for receiving the electronic parts and arranging said electronic parts in the predetermined positions on the lead conductor and the IC having the lead conductor is fixedly sandwiched in between both resin blocks, the electronic parts being received in the receiving portions of both resin blocks, while being electrically connected to the lead conductors. Further an embodiment may be obtained in which the IC having the lead conductor is integrated with the lower surface resin block.

Namely an electronic device according to this invention is obtained in which (1) the IC having a semiconductor with an unstable surface and enclosed by resin is completely separated from the resin block having portions for receiving the electronic parts mounted externally of IC (for example, crystal oscillator, capacitor and the like, battery, indicating element such as LCD, LED, etc.) so that the deformation and strain of the resin block do not interfere with said characteristics of said elements and (2) the electronic parts connected electrically to the lead conductor are located spatially by the resin blocks fixedly sandwiching in the IC and in addition the electronic parts received in the resin blocks are electrically connected to the IC by the lead conductor.

Accordingly this invention is characterized in that the IC is completely separated from the resin blocks receiving the electronic parts mounted externally of IC. Hence (a) The deformation, strain, etc. of the resin block have no effects on the IC and tend to prevent the characteristics of the elements from degradation.

(b) Material for enclosing the IC and material for molding the resin block can be selected suitably for their objects. Accordingly, irrespective of the resin block used, a material can be used for enclosing the IC that exhibits excellent moisture proof properties, few degradation and impurities such as unfavourable sodium, chlorine, etc. particularly impurities liable to move as ion, excellent chemical stability and adhesive property to the lead conductor. On the other hand for the material for molding the resin block can be, irrespectively of said enclosure of IC, used one with excellent mechanical strength, molding property, mold releasing property, few thermal deformation, excellent thermal stability and shock resistance, small difference of thermal expansion coefficient from that of the lead conductor and precise workability. Also differing from the former material for enclosing the IC, the latter can be selected from low cost materials. Further since the material for enclosing the IC can be selected separately from that for molding the resin block, the materials can be selected with large degree of freedom.

Generally the thermosetting material is used for enclosing the IC, and material for molding the resin block is not limited to the thermosetting one and the thermoplastic one can be also used for molding the resin block.

(c) Opaque black resin is used for enclosing the IC and transparent resin which permit the easy assembly of the external electronic parts and the acquirement of high product value is used for molding the resin block. In this way both materials can be distinguished.

(d) While the IC of semiconductor can be sold as product, individually, the resin block also can be sold individually as product. Also if defective ones are found in either IC or resin block, they can be replaced by good ones.

(e) This invention provides an extremely compact device since the IC occupying small space is the main circuit element and the externally mounted electronic parts of IC having small outer dimension are used and constructed to be received completely in the portions such as through holes provided in the resin block.

(f) Since the enclosure of IC is separated from the resin block in the fabrication of this type of module, the fabricating methods of various embodiments can be employed. Hence the molding method or apparatus which is the most suitable for use can be selected.

As hereinbefore described, the electronic device like electronic watch according to this invention has the minimized space occupied by module and can be fabricated easily with high productivity, reliability and performance.

EMBODIMENT V

Hereinafter an embodiment of this invention, an electronic watch using IC, will be concretely described with reference to the accompanying drawings. First a package will be described which is provided by the integrated combination of the resin block receiving the electronic parts mounted externally of IC featured by this invention and the lead conductor molded from one sheet of lead frame.

FIG. 67 is a perspective view showing the package according to this invention. As shown in the drawing, the package 180 according to this invention is the resin block 182 receiving the IC (not shown) and the external electronic parts and integrated with the lead conductor molded from one sheet of lead frame. The resin block 182 is molded by the use of resin material. Further 183a to 183d designate each exposed portion of the lead conductor. The resin block 182 is provided on the surface with the grooves and holes for receiving electronic parts. 184 is the hole for receiving battery, 185 the groove for receiving crystal oscillator, 186 the groove for receiving temperature compensation capacitor, 187 the groove for receiving trimmer capacitor and 188 the groove for receiving chip capacitor. Also 189 to 190 are the grooves for electrically connecting the external terminal of crystal oscillator to the lead conductor, the grooves being provided on the bottom with an exposed portion of the lead conductor. 191, 192 are the grooves for electrically connecting the both external terminals of the trimmer capacitor to the lead conductor. 193 designates four threaded through holes for fastening the display device fitting plate to the package 180. 194 is the groove for receiving lamp, and 195, 196 are the grooves for electrically connecting the external terminal of the lamp to the lead conductor. Further LCD is used for the display device and mounted on the IC through the zebra-connector to engage with the guide hole 97 in the resin block 182.

Next an example of the fabricating method of this type of the package 180 will be described by the order of the process.

Figure 68:
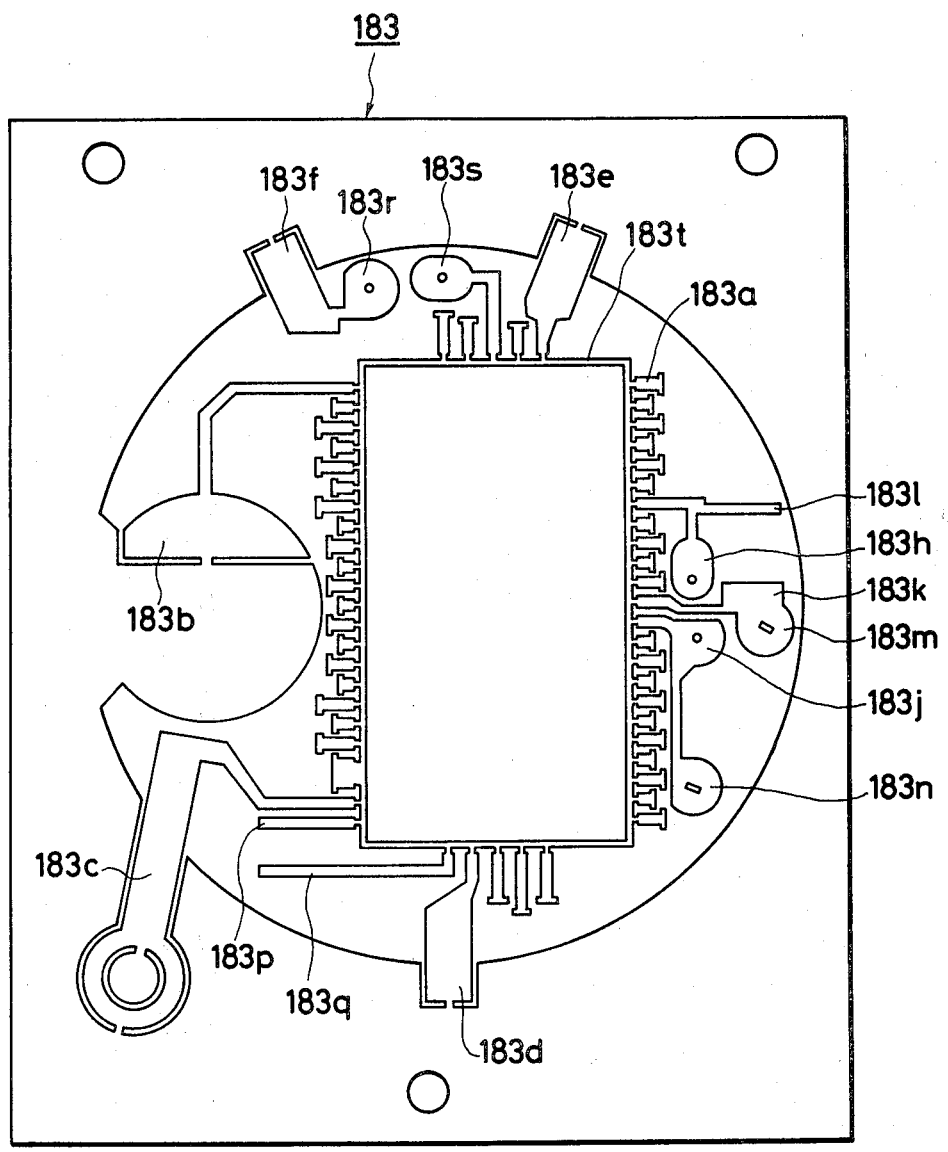
Figure 69:
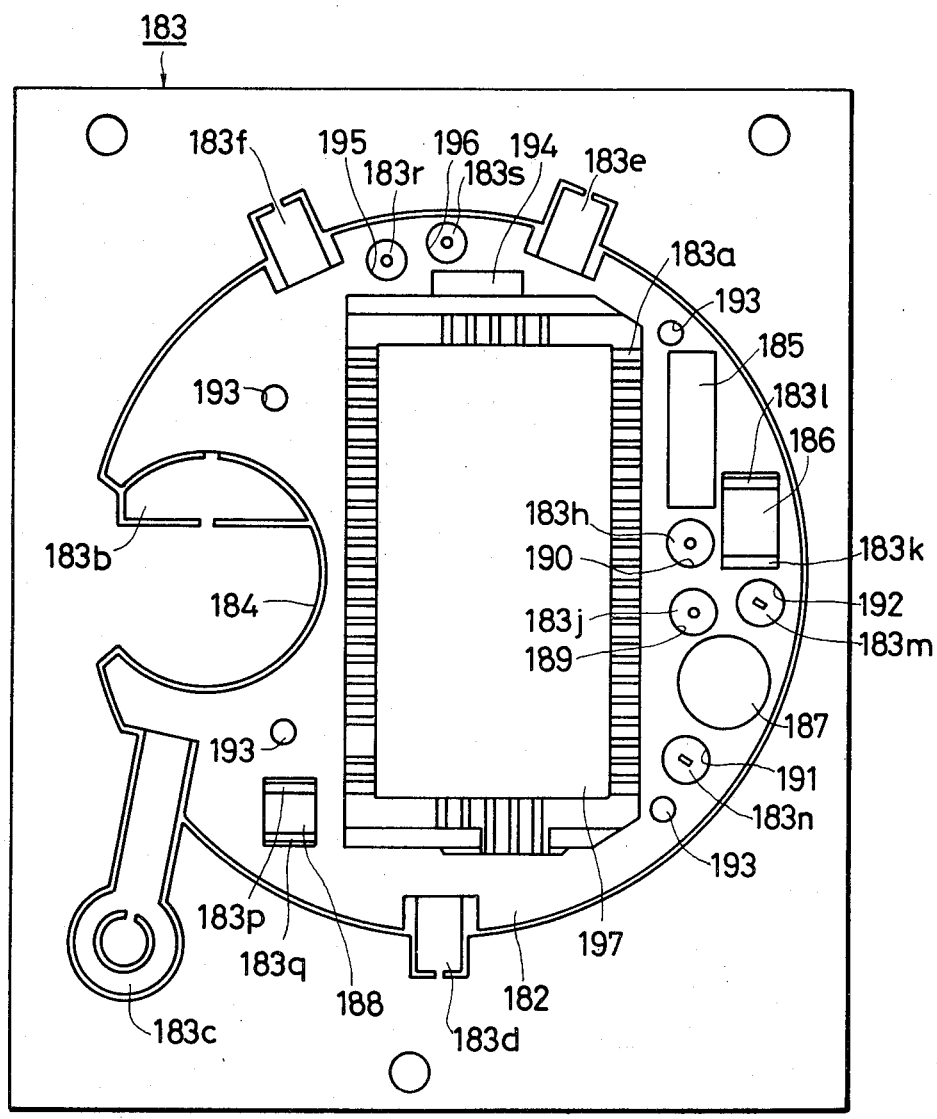

(1) The lead frame 183 shown in FIG. 68 is prepared for starting material. This lead frame 183 is made of about 0.15 m thick ferronickel alloy plate and the like and formed with the wiring lead conductors for IC and the externally mounted electronic parts.

183a is the lead conductor electrically connected to the IC, 183b and 183c the lead conductors connected electrically to (+) and (−) poles of battery respectively, 183d, 183e, 183f the lead conductors for switch and 183h and 183j, 183k and 183l, 183m and 183n, 183p and 183q, 183r and 183s are respectively the terminals of the lead conductors through which the crystal oscillator, temperature compensation capacitor, trimmer capacitor, chip capacitor and lamp are electrically connected to the lead conductor 183a. And 183t is the dam for preventing the resin flow in the resin molding.

(2) The resin block 182 for receiving the externally mounted electronic parts of IC is formed by injection molding and transfer molding method, etc. (FIG. 69) Resin with excellent mechanical strength, molding property, mold releasing property, low thermal deformation, etc. is used. This resin block 182 is provided with the grooves and holes for receiving electronic parts. 184 is the hole for receiving battery. Also 185, 186, 187, 188 and 194 are respectively the grooves for receiving crystal oscillator, temperature compensation capacitor, trimmer capacitor, tip capacitor and lamp. 189, 190, 191, 192, 195 and 196 are the grooves for electrically connecting said electronic parts, the lead conductors 183b to 183s being exposed on the bottom of the grooves.

Further in this case one portion of the resin block 182 is formed with resin fins which are removed while the dam is cut off.

Figure 70:
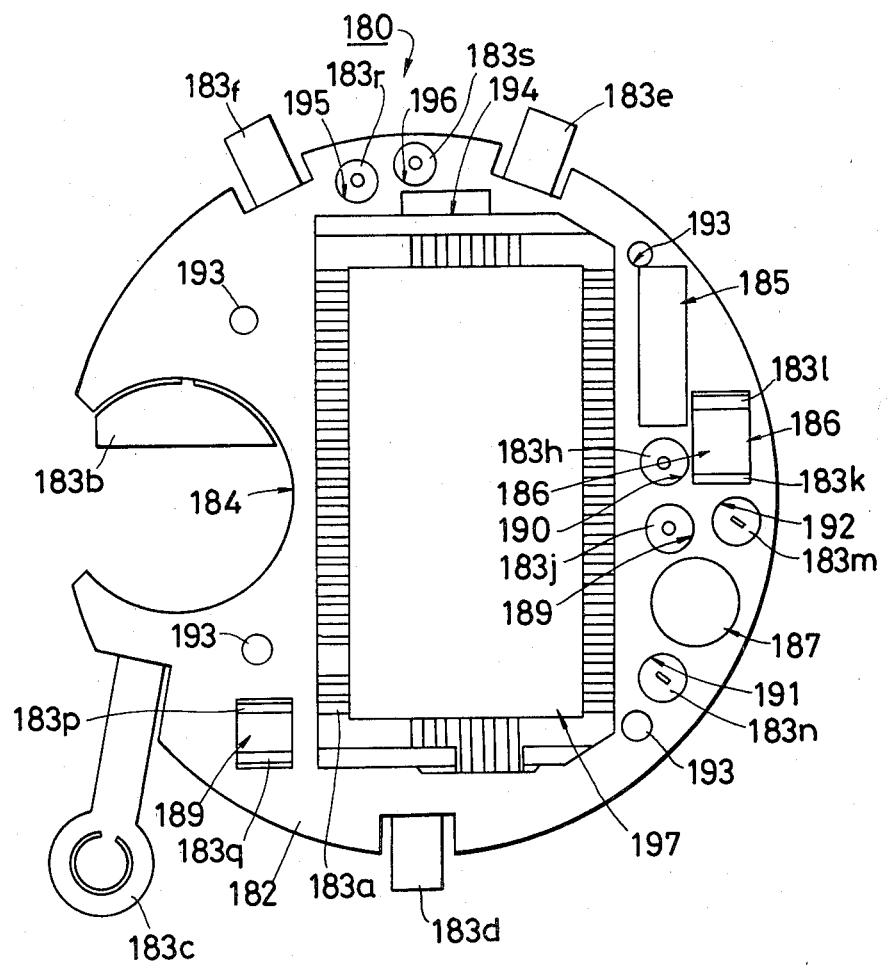
Figure 71:
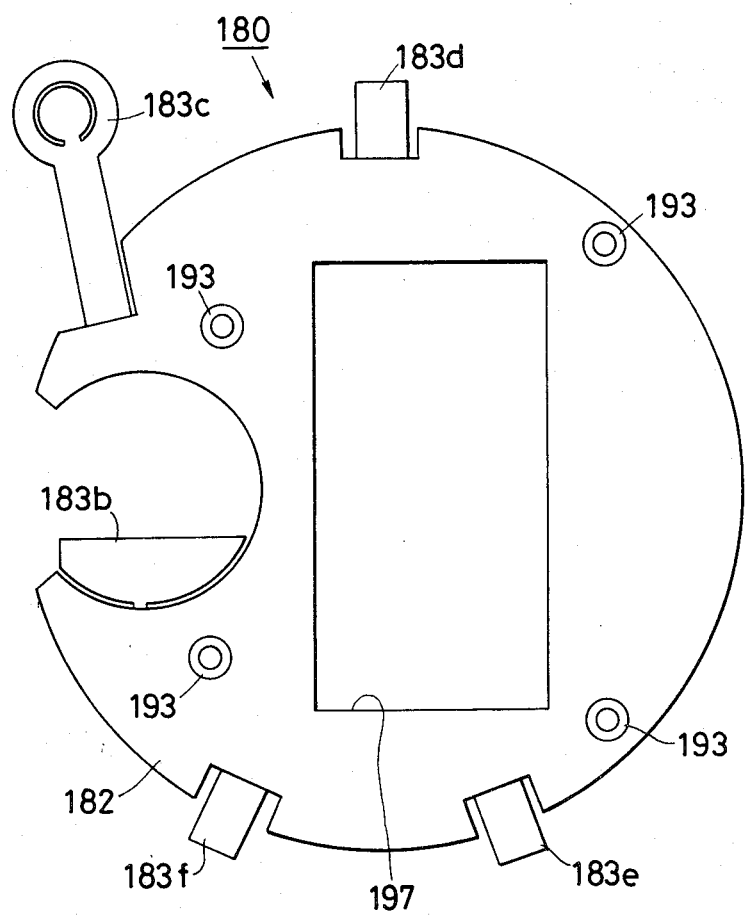

(3) The outer frame of the lead frame 183 is cut off to obtain the package 180. The plan view of the package 180 is shown in FIG. 70 and the rear view in FIG. 71.

Next the mounting and assembly of the electronic watch according to this invention will be described. As shown in the schematic assembly drawing of FIG. 72, IC 181 is built in the resin block 182 in the package 180. Then in each groove and hole of the resin block 182 are received the crystal oscillator 200, temperature compensation capacitor 201, trimmer capacitor 202, chip capacitor 203, lamp 204 and battery 205 each terminal of which is fixedly secured to the exposed surface of the lead conductor by spot welding, soldering, silver paste, etc. Before or after this assembly process, the lead conductor extending to the side wall of the resin block 182 is bent. Then on the IC (enclosure of resin) 181 in the package 180 in which these electronic parts are built are mounted the LCD 207 and the LCD fitting plate 208 through zebra-connector 206. The LCD and the LCD fitting plate 208 are fastened to the resin block 182 by the use of screw 209 and screw fastener 210 to obtain module 211.

In this invention the IC 181 is spaced from the resin block receiving crystal oscillator 200, capacitors 201 to 203 and battery 205, and the clearance between both parts is utilized for electrically connecting the LCD 207 to the IC 181 through the zebra-connector 206. And the lead conductor 183a exposed in this clearance is mechanically reinforced by the IC 181 and the resin block 182 so that the lead conductor 183a can not be deflected and displaced even when pressed in the mounting of LCD 207. Hence the fact that the resin block 182 is spaced from the IC 181 has the effect of preventing the IC 181 from the degradation of performance due to the resin block 182, the effect of molding these parts efficiently and in addition the large effect of utilizing the clearance produced by said fact for mounting, locating and receiving said zebra-connector 206, LCD 207, etc. and of reinforcing mechanically the lead conductor 183a.

As above mentioned, this invention can be applied to the electronic devices of various embodiments to provide compact electronic device with high reliability.

Thus the electronic device according to this invention is characterized in that it is constituted from a plurality of electronic parts including IC and the resin block having portions receiving these electronic parts and integrated with the lead conductors interconnecting electrically these electronic parts, the electronic parts being received in the receiving portion of the resin block and electrically interconnected by the lead conductors.

Accordingly in this invention (1) the enclosure of semiconductor elements such as IC, transistor, etc. having unstable surface is completely separated from the resin block receiving the electronic parts mounted externally of the enclosure (for example, crystal oscillator, capacitor and the like, battery, display device like LCD, LED, etc.) so that the deformation strain, etc. of the resin block do not interfere with the characteristics of elements within said enclosure and (2) the electronic parts received in the resin block are electrically interconnected by the lead conductors integrated with the resin block to provide an electronic device.

Hence this invention is characterized in that the enclosure of IC and others is completely separated from the resin block receiving the electronic parts mounted externally of the enclosure. Thus.

(a) The deformation, strain, etc. of the resin block do not affect the elements within the enclosure at all, but tend to prevent the elements from the degradation of characteristics.

(b) The material for enclosing the elements and one for molding the resin block can be selected suitably for respective objects. Hence for enclosing the elements can be used materials (resin, glass, etc.) which have, irrespectively of the resin block, excellent moisture proof, few degradation and unfavorable impurities like sodium, chlorine, etc. especially impurities liable to move as ion, excellent chemical stability and adhesive property to the lead conductor. On the other hand, for molding the resin block can be used irrespectively of said enclosure of the elements the resin materials which have high mechanical strength, molding property, mold releasing property, few thermal deformation, high thermal stability and shock resistance, small difference of thermal expansion coefficient from that of the lead conductor and precise workability. Also the latter material differing from the former one for enclosing the elements can be selected from economical materials. Further since the material for enclosing the elements can be selected separately from that for molding the resin block, it can be selected with high degree of freedom.

Generally the thermosetting material is used for enclosing the elements. However it is not limited to the material for molding the resin block and the thermoplastic one can be also used for molding same.

(c) Opaque black resin is used for enclosing the elements, and transparent resin which facilitates the assembly of the external electronic parts and provides high product value can be used for molding the resin block so that they can be distinguished from each other.

(d) While the semiconductor elements themselves can be sold as a product, the resin block itself also can be sold as a product. Also if defective products are found in either the elements or the block, they can be replaced by other good ones. Further the semiconductor elements or the resin block are easily subjected to the alteration of design and shape.

(e) This invention provides extremely compact device since it has as the main circuit element the IC occupying small space and uses for the electronic parts mounted externally of the IC the ones with small outer dimension which parts are constructionally received completely in the portions like grooves and through holes provided in the resin block.

(f) In the fabrication of this type of module, the enclosure of IC and the like is separated from the resin block to that various fabricating methods can be employed. Hence the method or apparatus can be selected which is the most suitable for use.

As detailed hereinbefore, the electronic device according to this invention like electronic watch, etc. minimizes the space occupied by the module and can be fabricated with ease, high productivity, reliability and performance.

Hereinafter an electronic watch, another embodiment of this invention, will be concretely described.

FIG. 73 is a plan view showing the watch module, i.e. the essential part of the electronic watch according to this invention. FIG. 74 is a longitudinal sectional view taken along the arrow A—A in FIG. 73. FIG. 75 is a longitudinal sectional view taken along the arrow B—B in FIG. 73. In the same drawing 212 designates LCD as the indicator element. The external terminal 212a of the LCD makes ohmic contact with the external lead conductor 213a in the IC 213 through zebra-connector 214 and this electric contact is made by pressing the LCD 212 through the fitting plate 215. 216 is the resin enclosure of IC 213 in which the IC chip 217 is die bonded to the external lead conductor 213a and wire bonded to other external lead conductor 213a. The resin enclosure 216 receives the externally mounted electronic parts of IC 213, i.e. crystal oscillator 218, battery 219, various capacitors (for trimmer, chip, temperature compensation), etc., while the frame member 216a electrically connecting these parts to the external lead conductor 213a of IC 213 and the reference wall body 216b against which one end wall surface 212A of LCD 212 abuts are connected and integrated with each other. And in this frame member 216a is embedded one portion of press member 220 which makes one end of the LCD 212 abut against the reference wall body 216b and presses the end wall surface 212B opposed to said wall body 216b. For this press member 220 is utilized a portion of the external lead conductor in the IC 213 which is suitably bent to maintain the property of a spring.

Next the assembly of the watch module thus constructed will be described.

In the grooves and through holes in the frame member 216a which is the extension of the enclosure 216 of IC 213 are received the crystal oscillator 218, battery 219, various capacitors, etc. and each terminal of these parts is fixedly secured to the exposed surface of each external lead conductor 213a by spot welding, solder, silver paste, etc. Before or after this assembly process, the external lead conductor 213a extending to the side wall of the frame member 216a is bent and formed as terminal for switch and others.

Then the zebra-connector 214 is mounted on the external lead conductor 213a in the IC 213 containing these electronic parts and thereafter the LCD 212 mounted on same. Then while the LCD 212 is urged against the reference wall body 216b by the press member 220, the LCD 212 is urged against the reference wall body 216b. This is accomplished by retaining the press member 220 in mounting the LCD 212 on the IC 213 and releasing the press member 220 after the mounting of the LCD 212. Since the press member 220 tends to return to the original condition due to the property of spring, one end wall surface 212A of the LCD 212 abuts against the reference wall surface 216b while the press member 220 comes to press other end wall surface 212B.

Next the fitting plate 215 is mounted on the LCD 212 and fastened to the IC 213, i.e. the enclosure 216a of IC 213 and frame member 216b, by fastener 221 to press the external electrode 212a of LCD 212 and the external lead conductor 213a of IC 213 through zebra-connector 214 and electrically interconnecting these parts for fabricating the electronic watch module. Further the LCD 212 and the IC 213 may be electrically interconnected by the reference wall body 216b and the press member 220 to omit the fitting plate 215.

As above mentioned, in the watch module according to this invention, one end wall surface 212A of LCD 212 is urged against the reference wall body 216b fixed to the one end of the enclosure of IC 213 by means of the press member 220, while the other end wall surface 212B is urged by the press member 220 to locate the LCD 212 and the IC 213.

Thus the LCD 212 can be located to the IC 213 with ease and high accuracy. Hence the external electrode 212a of the LCD 212 makes ohmic contact piece by piece with the external lead conductor 213a of the IC 213 even through the zebra-connector with high reliability of good electric connection. Also since this invention permits the location of LCD 212 and IC 213 only by the manipulation of the press member 220, the location of LCD 212 can be extremely simplified, facilitated and mechanized.

Particularly this invention is very effective and preferable for an electronic device with compact assembly dimension in which the pitch between each external electrode of LCD 212 and the pitch between each external lead of IC 213 are small and each dimension of these parts is small.

This invention is not limited to said embodiments, but can be applied to the electronic devices of various embodiments like pocket calculators. Also the various embodiments of the reference wall body and the press member for locating the electronic parts like LCD and IC to each other can be applied to the various electronic devices. For example the press member may be a wedge-shaped one 220a (see FIG. 76) or an elastic one 220b fastened by screw (FIG. 77) and others.

The present invention relates to electronic devices such as electronic wrist watchs and desk-top calculators. Conventionally, these electronic devices of small loading size have been constituted by ICs. At the same time, when an LCD is used as a display body, these ICs and LCD are connected by a mechanical pressing force through a resilient conductive connector such as a zebra connector.

This way of connection is adopted because LCD usually has a shorter life than LED. Namely, in case that LED is used as the display body, it is connected to the external lead of IC through an ohmic connection by means of, for example, soldering. However, in case of LCD, such an ohmic connection is not used but, instead, the connection is made simply by a mechanical resilient pressing force, so that the LCD may easily be replaced with a new one, when the life of LCD has been exhausted.

Thus, in these electronic devices, the LCD is not connected to the external lead of IC through a good ohmic connection, to cause various inconveniences.

The major inconvenience is the difficulty in assembling.

More specifically, according to the conventional assembling process, at first a zebra connector is placed on the external leads of the IC and then the LCD is placed on the zebra connector. Then, the LCD is pressed into contact with the IC through the zebra connector, by means of an LCD attaching plate.

During this assembling, a highly complicated and troublesome work is required fro correctly positioning the external leads of LCD in alignment with the external leads of the IC for obtaining a good ohmic connection therebetween. This is attributable to the fact that there is no reference point for correctly positioning the external leads of the LCD in alignment with the external leads of the IC, so that the connection work has to be done such that at first the zebra connector is simply placed on the IC and then the LCD is set thereon and then, keeping the LCD in the driving state, the position of the LCD is manually adjusted finely to obtain desired ohmic connection.

This manual work is not so troublesome when the pitches of the external leads of the IC and the external electrodes of the LCD are large and the numbers of the external leads and electrodes are small.

However, as a matter of fact, this problem is becoming serious because of current tendency of smaller size of LCD and IC and the large number of pins (external leads or electrodes) mounted thereon.

Thus, the invention is concerned with a novel electronic device in which highly reliable electric connection is achieved by a simple operation, thus overcoming above stated problem of the prior art.

Hereinafter, a detailed description will be made as to an electronic wrist watch, which is a still further embodiment of the invention, having a display body constituted by an LCD.

FIG. 78 is a plan view of a wrist watch module which is an essential part of the electronic wrist watch of this embodiment, while FIG. 79 is a sectional view taken along the line AA of FIG. 78. Referring to these Figures, and LCD 222 which constitutes a display body is connected through external electrodes 222a to an electronic parts adapted to drive the LCD 222. A frame 223 made of an organic resin or the like material has grooves receiving an IC 224 which is the electronic part for driving the LCD 222, battery 225, quartz oscillator 226, trimmer condenser 227, chip capacitor 228, temperature correction capacitor 229 and the like components. These components are electrically connected through external lead conductors 224a–224c of the IC 224.

These external lead conductors 224a–224c are partly embedded in the frame 223, so as to be used as the conductor for connection of the IC with other components 225–230 (230 denotes a lamp). The portion of the external leads to which the external electrode 222a of the LCD 222 is to be connected has a beak-like shape, so that the external leads 224a, 224b may be kept in electric contact with the external leads 222a of the LCD 222 through a mechanical pressing due to the resiliency of these external leads 224a, 224b.

As has been stated, according to this embodiment, a beak-shaped connector is constituted by the external lead conductors 224a, 224b of the IC 224. The beak-shaped connector receives the external electrode 222a of the LCD 222, so as to provide electric connection between the LCD 222 and the IC 224 which is the electronic part adapted to drive the LCD 222.

Consequently, the electric connection between the LCD 222 and the electronic part such as the IC 224 for driving the LCD is achieved without using any specific connector such as the zebra connector and without any mechanical pressing force. In addition, it is not necessary to place the electronic part and the LCD one on another as made in conventional arrangement, but, rather, various forms of arrangement such as placing the IC 224 and the LCD in side-by-side relation are possible.

In the described embodiment, the connector through which the LCD 222 is connected to the electronic part such as the IC 224 for driving the LCD 222 is constituted by the external lead conductors 224a, 224b of the IC 224. However, this is not exclusive, and the connector can be constituted by various materials of various forms as shown in FIGS. 80 and 81.

The characteristic electric connection between the display body such as LCD and the electronic part for driving the same of this embodiment affords the following advantages.

1. The connector for inserting the external electrode of the display body is formed in the external lead conductors of the electronic part for driving the display body, so that specific connector such as the zebra connector can be dispensed with. At the same time, it is not necessary to impart a mechanical pressing force by, for example, the connector. Consequently, the number of parts is reduced while preserving a good ohmic connection, so that a compact and highly reliable electronic device is obtained.

2. The display body and the electronic part for driving the same are positioned at any desired positions relative to each other.

3. A perfect ohmic connection is ensured to exclude any ill contact, because the electric connection between the external electrode of the display body and the electronic part for driving the display body is made directly, without employing any other intermediate connecting member.

4. The display body can be detached or replaced easily.

5. This embodiment can be adopted in various electronic devices such as electronic wrist watch and desk-top calculators which incorporate LCD or ECD (Electrochromic Display) as the display body.

The present invention relates to electronic devices such as electronic wrist watch and desk-top calculator. Conventionally, these electronic devices of small loading size have been constituted by ICs. At the same time, when an LCD is used as a display body, these ICs and LCD are connected by a mechanical pressing force through a resilient conductive connector such as a zebra connector.

This way of connection is adopted because LCD usually has a shorter life than LED. Namely, in case that LED is used as the display body, it is connected to the external lead of IC through an ohmic connection by means of, for example, soldering. However, in case of LCD, such an ohmic connection is not used but, insteadly, the connection is made simply by a mechanical resilient pressing force, so that the LCD may easily be replaced with new one, when the life of LCD has been exhausted.

In the electronic devices of the kind described, however, it is necessary to apply a predetermined load or mechanical pressing force to the resilient connector such as the zebra connector, in order to maintain a good ohmic connection between the external leads of the IC and the LCD. For this reason, such a laminated or superposed arrangement is adopted that the resilient conductive connector such as the zebra connector, on which the LCD is placed, is placed on the external leads of the IC, and that a mechanical pressing force is applied to press the LCD onto the external leads of the IC through the medium of the conductive connector.

This inconveniently results in an enlarged size of the assembled electronic device. In addition, due to the use of the resilient conductive connector such as zebra connector, the number of parts is increased, and the ohmic nature of the electric contacts may be deteriorated. These problems are serious especially in case of such electronic devices as requiring a small loading size as possible, facilitated assembling work and reduced cost, e.g. electronic wrist watches and desk-top calculators.

From this point of view, the present invention aims also at providing an electronic device in which the electric contact between the IC and LCD is achieved without using a specific separate connecting member, so that the number of parts may be reduced, while maintaining a good electric contact, thereby to reduce the cost and size of the device as much as possible.

Hereinafter, an electronic wrist watch, which is a still further object of the invention, incorporating an LCD as the display body will be described.

FIG. 82 is a perspective view of a watch module which constitutes the essential part of the electronic wrist watch of this embodiment, while FIG. 83 is a sectional view taken along the line AA of FIG. 83.

Referring to these Figures, an LCD 231 constituting the display body is connected through its external electrode 231a to an electronic part adapted to drive the same. A frame 232 made of an organic resin or the like material has grooves accomodating an IC 233 which is the electronic part for driving the LCD 231, battery 234, quartz oscillator 235, trimmer condenser 236, chip condenser 237, temperature correcting condenser 238 and so forth. These components are connected mutually through the external lead conductors 233a–233c of the IC 233. The external leads 233a–233c are partially embedded in the frame 233 so as to function as the conductors for the connection of components 234–239 (230 denotes a lamp).

A part of the external lead conductor 233a is notched to form a tongue-like projection 233b adapted for connection to the external electrode 231a of the LCD 231. The electric connection of the external electrode 231a of the LCD 231 is achieved through a mechanical contact, making use of the resiliency of the external lead conductors 233a, 233b.

FIG. 84 shows a perspective view of a portion of the device around the external lead conductors 233a, 233b of the IC 233.

As has been stated, in the watch module of this embodiment, the ohmic contact between the external lead conductors 233a, 233b of the IC 233 and the LCD 231 is made through a connector in the form of a tongue-like projection constituted by the external lead conductors 233a, 233b, making use of the resilient nature of the tongue-like projection 233b, and through pressing the LCD 231 onto the tongue-like projection 233b by means of a pressing plate 240. Reference numerals 241 and 242 denotes a fixture members for fixing the pressing plate 240 to the frame 232.

Consequently, the LCD 231 is connected electrically to the electronic part such as the IC 233 for driving the same, without employing a specific connector such as the zebra connector. Consequently, the IC 233 and the LCD can be mounted in a compact manner, although they are superposed as in the conventional arrangement.

In this embodiment, the connectors 233a, 233b for the electrical connection between the LCD 231 and the electronic part such as the IC 233 are constituted by the external lead conductors 233a, 233b of the IC 233. However, this arrangement is not exclusive and connectors can be constituted by various other materials in various forms.

The characteristic electric connection between the display body such as LCD and the driving electronic part according to this embodiment offers the advantages as follows.

1. The connectors to which the external electrodes of the display body is to be pressed is provided in the external leads of the electronic part for driving the display body. Consequently, specific connecting members such as the zebra connector can be dispensed with. At the same time, an improved ohmic contact and a higher precision of the alignment of the external leads with the external electrodes are obtained, as compared with the conventional arrangement in which the electric connection is made by a mechanical pressing force making use of separate connecting member.

Consequently, the number of parts is reduced, and the better ohmic contact is ensured, so as to render the electronic device compact and reliable.

2. The electronic device is made compact because of the direct ohmic contact between the display body and the IC.

3. The direct ohmic contact between the display body and the electronic part for driving the same ensures a good state of contact, eliminating any ill contact.

4. The display body can be detached and replaced quite easily.

5. This embodiment can be adopted in various electronic devices such as electronic wrist watches and desk-top calculators, incorporating display bodies constituted by LCD or ECD (Electrochromic Display).

The present invention relates to electronic devices such as an electronic wrist watch and desk-top calculator. Conventionally, these electronic devices of small loading size have been constituted by ICS. At the same time, when an LCD is used as a display body, these ICs and LCD are connected by a mechanical pressing force through a resilient conductive connector such as a zebra connector.

This way of connection is adopted because an LCD usually has a shorter life than an LED. Namely, in case that LED is used as the display body, it is connected to the external lead of IC through an ohmic connection by means of, for example, soldering. However, in case of LCD, such an ohmic connection is not used but, instead, the connection is made simply by a mechanical resilient pressing force, so that the LCD may easily be replaced with a new one, when the life of LCD has been exhausted.

In the electronic devices of the kind described, however, it is necessary to apply a predetermined load or mechanical pressing force to the resilient connector such as the zebra connector, in order to maintain a good ohmic connection between the external leads of the IC and the LCD. For this reason, such a laminated or superposed arrangement is adopted that the resilient conductive connector such as the zebra connector, on which the LCD is placed, is placed on the external leads of the IC, and that a mechanical pressing force is applied to press the LCD onto the external leads of the IC through the medium of the coductive connector.

This inconveniently results in an enlarged size of the assembled electronic device. In addition, due to the use of the resilient conductive connector such as zebra connector, the number of parts is increased, and the ohmic nature of the electric contacts may be deteriorated. These problems are serious especially in case of such electronic devices as requiring a small loading size as possible, facilitated assembling work and reduced cost, e.g. electronic wrist watches and desk-top calculators.

From this point of view, the present invention aims also at providing an electronic device in which the electric contact between the IC and LCD is achieved without using specific separate connecting member, so that the number of parts may be reduced, while maintaining a good electric contact, thereby to reduce the cost and size of the device as much as possible.

Hereinafter, this embodiment will be described in detail with specific reference to FIG. 85, which is a plan view of the lead frame of an electronic wrist watch of this embodiment.

This frame 243 consists of a plate of an iron-nickel alloy, having a thickness of about 0.15 mm on which formed are external lead conductors of IC, lead conductors of external electronic parts and plate-like nuts 244. Numeral 245 denotes a tab to which an IC is die-bonded, 246 denotes an external lead conductor adapted to be connected to the pad electrode on the IC chip surface, 247 and 248 denote lead conductors adapted to be connected to the plus and minus sides of the battery, and 249-251 denote lead conductors for switches. At the same times, pairs of lead conductors through which a quartz oscillator, temperature correction condenser, trimmer condenser, chip condenser and a lamp are connected to the external lead conductors of the IC are denoted by numerals 252,253; 246a,253a, 252a,254; 246b,246c; 246d,246e and 249a,255. Reference numeral 256 denotes a connecting piece through which the frame body 257 of the lead frame 243 is connected to the external lead conductor 246 and the plate-like nut 244.

For the clarification purpose, the lead frame 243 is illustrated with a part thereof broken.

The lead frame 243 of this embodiment is characterized by having a plate-like nut 244. The plate-like nut 244 is shown in a larger scale at FIG. 86. This nut 244 is made of the same material as the external lead conductors 246 of the lead frame 243, lead conductors 247-255 and the connecting piece 256, i.e. made of an iron-nickel alloy. The peripheral portion of this nut is sealed and fixed by means of a resinous sealing material or the like. The nut 244 has a bore 244c the diameter d of which corresponds to the inner diameter of the threaded portion of a bolt or a screw. The length l of a notched part 244b is smaller than the outer diameter of the bolt or screw by a length equal to the above mentioned diameter d. The size l of the notched part, number of the notched parts, and the shape of the same can be selected as desired, in accordance with the uses of this plate-like nut 244.

FIGS. 87 and 88 show other forms of the plate-like nut of the lead frame of this embodiment. Referring first to FIG. 87, the plate-like nut 244' is similar to that of FIG. 86, but is provided with slits 244'a. The slits 244'a are provided for enlarging the elastic limit of the plate-like nut 244', thereby to increase the resilient cramping force of the latter. The nut as shown in FIG. 88 has notched parts 244"b extending in the tangential direction of the bore 244", and peripheral slits 244"a.

As has been stated, the plate-like nut of the lead frame of this embodiment can have various forms.

FIG. 89 is a plan view of the base portion of an electronic wrist watch module incorporating the lead frame of this embodiment.

This module is fabricated in the following manner. An IC chip shown by broken lines is die-bonded to the tab 245 of the lead frame 244, and the pad electrode on the IC chip surface is connected to the external lead conductor 246 of the lead frame 244 through a bonding wire or the like. This structure is then sealed up by a resin to form a resin-sealed body 258. Finally, unnecessary parts of the lead frame such as connecting piece 256 and the frame portion 257 are severed.

The resin-sealed body 258 accomodates in an airtightly sealed manner the IC chip, and carries associated electronic parts such as the quartz oscillator, temperature correction condenser, trimmer condenser, chip condenser, lamp, battery and so forth. The grooves for accomodating these electronic parts are denoted by reference numerals 258a-258f. The lead conductors exposed in these grooves constitute the terminals for the electric connections of these electronic parts.

The parts of the resin-sealed body 258 corresponding to the plate-like nut 244 is provided with a through bore. The portions around the plate-like nut 244 are unitarily sealed and fixed by the resin.

FIG. 90 is a plan view of a wrist watch module of an electronic wrist watch incorporating a lead frame 243 of this embodiment, while FIG. 91 is a sectional view taken along the line AA of FIG. 90.

The illustrated module is constructed as follows. A quartz oscillator, temperature correcting condenser, trimmer condenser, chip condenser, lamp, battery and so forth are received by corresponding bores and grooves of the resin-sealed body 258. The terminals of these parts are connected to the exposed lead conductors by means of spot welding, soldering or by a silver paste. An LCD 260 and a plate 261 for attaching the same are placed on thus formed assembly, through a medium of a zebra connector 259, and are fastened to the resin-sealed body 258 by means of screws or bolts 262 engaging the plate-like nuts 244, so as to constitute the module.

Reference numeral 263 denotes an IC chip, while a fine metal wire through which the pad electrode on the IC chip surface is connected to the external lead 246 is denoted by a numeral 264. The engagement of the plate-ike nut 244 with the associated bolt 262 is shown in an enlarged scale at FIG. 92.

The lead frame of this embodiment and the electronic devices incorporating the latter offer the following advantages.

1. It is not necessary to prepare and use separate nuts, because the nuts are formed on the lead frame, so that the number of parts of the electronic device such as electronic wrist watch is greatly reduced.

2. Number of steps of assembling process of the electronic devices is largely reduced thanks to the lead frame having plate-like nuts unitarily provided thereon.

3. In attaching the LCD or the like, the fastening of the latter can be made gently, without incurring any inconvenience attributable to excessive tightening of the bolts or screws, thanks to the resilient nature of the plate-like nuts formed on the lead frame.

4. Consequently, this embodiment affords a reduced cost and size of the electronic device.

Thus, this embodiment is an electronic device having a lead frame unitarily provided with nuts as the fastening means, the lead frame being electrically connected to the electronic parts such as IC, the portions of the lead frame around these electronic parts being sealed in an airtight manner, and is suitable for use as a small-sized electronic devices such as electronic wrist watches.

Generally speaking, in the electronic devices such as electronic wrist watches, it is a critical problem to reduce the space occupied by the module in which the semiconductor elements, capacitors, battery and the like are mounted.

At the same time, there is an increasing demand for simplifying the assembling process and reducing the number of parts of these modules or electronic devices.

For instance, in electronic devices incorporating ICs, the ICs are sealed up by a resin. The sealed up body is provided with portions for accomodating or receiving external parts such as a quartz oscillator, various capacitors, battery and display body such as an LCD. These electronic parts and the IC are electrically connected by means of a lead conductors shaped out of a single lead frame, so as to form a compact module.

In this module, when an LCD is used as the display body, the arrangement is such that a resilient conductive connector such as a zebra connector is placed on the external lead conductors of the resin-sealed IC, and then the LCD is superposed to the connector. A mechanical pressing force is applied to press the external lead conductors of the IC and the LCD to each other through the connector, by means of suitable fastening means such as screws or bolts and nuts, so as to connect these electronic parts electrically and rigidly. This construction of module requires a large number of parts and a complicated and troublesome work such as correct positioning of these parts in assembling.

This goes quite contrary to the requisites for the electronic devices such as electronic wrist watches and desk-top calculators, e.g. simplified assembling and reduced cost.

Under these circumstances, the invention aims also at providing an electronic device of reduced size and cost of manufacture, through diminishing the number of parts and steps of manufacturing process. At the same time, the invention is concerned with a lead frame which can be used in the electronic devices of the kind described, and having various functions.

The embodiment of the invention for the described purposes will be explained with reference to FIG. 94 which illustrates the arrangement for the resin supply in a mold of a transfer molding machine which is an embodiment of the invention.

Reference numerals 265A and 265B denote ports for distributing the resin, while numerals 266A and 266B denote runners through which the resin flows. These runners communicate molding cavities 268A,268B through respective gates 267A and 267B. The parts 265A to 268B constitutes a resin charging line, whereas another resin charging line is constituted by parts 265B to 268B. These resin charging systems intersect each other at a point designated at 269.

FIG. 95 shows the portion of the lower mold 271 around the point 269 of the intersection.

As will be seen from FIG. 95-a, the lower mold 271 is provided, at a portion where the passage 272 of a first resin A intersects the passage 273 of the second resin B intersect, with a hole 274 receiving a cylindrical pin 275 as shown in FIG. 95-b. The pin 275 is movable up and down, as shown in FIGS. 95-c and 95d.

In operation, when the resin A is charged, the pin 275 is lifted up to the level of the surface of the lower mold 271 as shown in FIG. 95-c, while, when the resin B is charged, the pin is lowered to the level of the bottom of the passages 272 and 273 of the resins.

FIG. 96 is a bottom perspective view of the portion of an upper mold around the area of the intersection.

The upper mold 276 has a groove 277 corresponding to the resin passage 272 of the resin A, but has no groove which would correspond to the passage 273 for the resin B.

The portion illustrated by one-dot-and-dash line corresponds to the hole 274 of the lower mold.

FIGS. 97-a and 97-b show the mold in the closed state, in which FIG. 97-a shows the pin in the lifted position, while FIG. 97-b shows the same in the lowered state.

FIGS. 98-a to 98-c show the method of charging the mold with the resins.

At first, the resin A is charged with the pin 275 kept at the lifted position. In this state, the passage 273 for the resin B is closed completely by the pin 275 extending into the space where two passages intersect each other, while the passage 274 for the resin A is not closed by the pin 275, thanks to the provision of the groove 277 formed in the upper mold, which acts as an intermediate passage. Consequently, the resin A is made to flow into the cavity through the passage 272, without invading the passage 273 of the resin B.

The pin 275 is lowered, while the molds are still kept in the closed state, as the resin A has become solidified. Consequently, the passage 273 of the resin B is opened through the space which has been occupied by the pin 275 in the timing of FIG. 98-a. Subsequently, the resin B is charged through the passage 273, as illustrated in FIG. 98-c. The molds are separated after the sufficient solidification of the resin B, and the molded article is picked up from the opened molds.

Thanks to the provision of the pin adapted to temporarily project into the space where the two resin passages intersect, two kinds of resins are molded in a one cycle of the molding operation.

FIG. 99 shows still further embodiment in which the resin charging system is so arranged that two resin charging lines do not intersect each other. This embodiment is superior to the first mentioned embodiment in that it does not necessitate the mechanism for moving the pin up and down. However, on the other hand, the length of the resin passages are rendered long, in order that the passages may not intersect, resulting in an enlarged size of the molds. This is inconvenient especially when a large number of articles are to be molded at one time. The second-mentioned embodiment is therefore inferior to the first-mentioned embodiment when all aspects are taken into consideration.

The invention relates also to a transfer molding machine for forming a resinous body or a resin-sealed body, by filling mold cavity or cavities with resinous materials. It is often required to use a plurality of kinds of resins in a single molded article. For instance, in case of an article as shown in FIG. 93, a part A thereof is molded from a blue resin, while the other part B is molded from a red resin, so that a visible mark may be formed.

In such a case, more than two kinds of resin are charged separately by separate steps; i.e. one resin in one step. This process is however inconvenient in that a plurality of molding steps are required fro the molding of only one article, resulting in an increased number of steps and, accordingly, raised cost of manufacture.

The invention thereofre relates to a molding of article with a plurality of resins in only one step of molding.

To this end, according to the invention, there is provided a plurality of resin charging lines each of which consists of a single space or passage leading from each of a plurality resin sources to each of a plurality of molding cavities.

More specifically, according to the invention, there is provided at transfer molding machine having a plurality of resin charging lines as specified above, in which a pin is provided at a portion of said lines at which they intersect each other, the pin being adapted to temporarily project into the space of intersection so as to temporarily close one of the lines, while keeping the other line opened.

An electronic wrist watch which is a still further embodiment of the invention will be described in detail, hereinafter.

FIG. 100 is a plan view of the electronic wrist watch embodying the present invention, while FIG. 101 is a bottom plan view of the same. FIG. 102 is a plan view of a watch module including a watch case, which is the essential part of the electronic wrist watch, FIG. 103 is a plan view of a decorative plate adapted to be attached to the watch module, and FIG. 104 is a plan view of a rear back lid of the watch module.

A watch case 279 is a body made of a resin, formed unitarily with a block 280 which is also made of a resin and adapted to accomodate electronic parts provided externally of an IC. A decorative plate 281 is a thin plate member 281b having a good appearance. The portion of the decorative plate 281 adapted to lie over the display body of the watch is made of a transparent material such as glass, while other portions are made of a plastic. In case that the display body is constituted by an LCD, this plate plays also the role of a retainer adapted to retain the LDC. This decorative plate is attached to the surface of the watch module by means of, for example, a bonding agent.

A back side lid 283, which is provided as required, has a door 283a for the access to the battery for the purpose of replacement of the latter, and is adapted to be adequately received by and fixed to the back side of the watch module 282. It is possible to neglect this back-side lid. In such a case, a cover member, which plays the role of the door for the access to the battery, is screwed to the back side of the watch module 282. Reference numerals 284 and 285 denote switches, while 286 denotes a wrist band.

The watch module 282 of this embodiment is constituted mainly by a resin-sealed body 287 in which an IC is sealed, a block 280 consisting of a resin accomodating external electronic parts and a watch case 279 which is formed with the same resin as the block 280 unitarily with the latter.

The block 280 and the resin-sealed body 287 are connected through the external lead conductors 288 of the IC. At the same time, the resin-sealed body 287 is made separate from the unitary structure of the block 280 and the watch case 279. The above mentioned external lead conductors 288 are embedded in the block 280, but are exposed at portions of the block body where the external electronic parts are to be installed. The external electronic parts are a quartz oscillator, trimmer condenser, chip condenser, temperature correcting condenser, battery and so forth. Thus, the block 280 has grooves 280a to 280e adapted to receive these electronic parts, in which exposed are portions 280a to 280e of the external lead conductors through which the IC is electrically connected to these electronic parts.

Reference numeral 288f denotes lead conductors adapted to be connected to switches 284 and 285, while reference numeral 280f denotes holes provided around the lead conductors 288f, for bringing the external lead conductors into and out of contact in accordance with the turning of the switches 284 and 285 on and off.

Hereinafter, an example of the process for manufacturing this watch module will be described.

(1) At first, a lead frame is prepared as the starting material. This lead frame consists of a plate made of an ferronickel alloy, having a thickness of about 0.15 mm, on which formed are external lead conductors 288 of the IC and the wiring conductors 288a to 288f of the electronic parts.

(2) Then, the IC chip is attached to the tab of the lead frame by means of die-bonding. Subsequently, the pad electrode on the IC chip surface is electrically connected to the external lead conductor 288, through a fine wire of gold, aluminum or the like metallic material, by means of heat-pressing method, ultrasonic-wave bonding or the like known method.

(3) The IC chip and the periphery of the latter are sealed up by a resin, by means of a transfer molding technique, so as to form the resin-sealed body 287. Epoxy resins or the like resins having equivalent moisture-proof nature and chemical stability to those of the epoxy resins are preferably used as the sealing resin.

(4) The block 280 accomodating the external electronic parts, and the watch case 279 are formed by means of an injection molding or a transfer molding. Such resins as having excellent mechanical strength, moldability, good separation from the mold and smaller thermal deformation are used as the material.

(5) Finally, unnecessary frame portions and burrs of resin are removed to complete the watch module.

Hereinafter, a process of mounting these components on an electronic wrist watch will be described by way of example.

At first, the electronic parts such as the quartz oscillator, trimmer condenser, chip condenser, temperature correcting condenser, battery and the like are placed in respective mounting grooves 288a to 288e of the block 280 of the watch module 282 as shown in FIG. 102. These electronic parts are then fixed to the exposed lead conductors 288a to 288e, by means of soldering, spot welding or sliver paste. Subsequently to or before this fixing step, the lead conductors are bent at the desired portions and the switches 284 and 285 are mounted on the watch module 282, with a certain clearance from the lead conductors 288f.

Then, an LCD is placed on the external lead conductors 288, through a medium of a zebra connector, and, subsequently, the decorative plate 281 adapted to play also the role of the LCD retainer is attached to the watch module 282 by means of a bonding agent. After or before this attaching of this decorative plate 281, the back-side lid 283 is attached to the watch module 282, thus completing the production of the electronic wrist watch.

As has been explained, in this embodiment, the resin-sealed body accomodating the IC or transistors having unstable surface conditions is made separate from the unitary structure of the watch case and the block body which accomodates the external electronic parts such as the quartz oscillator, capacitors, battery and display body such as LED or LCD.

At the same time, the resin-sealed structure is connected to the unitary structure of the watch case and the block, at a suitable distance from the latter, by means of the lead conductors, simultaneously allowing the electric connection between the element accomodated by the resin-sealed body to the electronic parts accomodated by the block.

The electronic wrist watch having the above described construction offers the following advantages, thanks to the fact that the resin-sealed body accomodating the IC is made separate from the unitary structure of the watch case and the block in which the external electronic parts are accomodated.

1. The IC in the resin-sealed body is never adversely affected by the distortion of the block and the watch case, and the deterioration of the characteristics of the IC elements is fairly avoided.

2. The materials for sealing the IC and for the block and the watch body are selected independently of each other, so that they can be formed by the optimum materials.

More specifically, such materials (resin or glass) as are highly resistant to moisture, less likely to be deteriorated, and not rich in undesirable impurities such as sodium and chloride and other impurities which are likely to move as ions, can be selected as the material for the block. On the other hand, such materials (resins or ceramics) as having a good moldability, mold-parting nature, small thermal distortion, good thermal stability and impact strength, small difference of the thermal expansion coefficient from that of the lead conductors and suitable for fine mechanical processing are used as the material for the block, independently of the material for the sealing of the IC. Thus, it is possible to select a cheaper material than that for the sealing of the IC, for the material of the block. In addition, the degree of freedom of selection of the materials for the sealing and for the block, because they are constructed separately from each other.

Thermosetting resins are generally used as the material for sealing the IC, while, for the material of the block, thermoplastic resins may be used as well as the thermosetting resins.

3. The sealed IC solely can be produced and sold as commercial goods. To the contrary, the unitary structure of the watch case and the block devoid of the sealed IC can be solely manufactured and sold as independent commercial goods. Consequently, various designs of the watch cases, such as for male or female use, can be combined with the same IC unit. In addition, when either one of the IC unit or the unitary structure of the watch case and the block is found defective, they are easily separated from each other at the juncture to allow the replacement of only the defective part.

4. Various designs can be made by changing the shape, color and surface conditions of the decorative plate. This effect can suitably be combined with the possibility of various designs of the watch case, to multiply the advantage of the possibility of different design.

5. The decorative plate is adapted to play also the role of the LCD retainer, while the watch case is constructed unitarily with the block accomodating the external electronic parts, as a part of the watch module. In addition, the back-side cover can be suitably received by and fixed to the watch module. Consequently, the fabrication of the watch is considerably reduced and the number of parts is advantageously reduced, contributing greatly to reduce the cost and the size, especially the thickness, of the electronic wrist watch.

What is claimed is:

1. An electronic device comprising:
    a display device for visibly displaying characters on a viewing surface;
    a block having an electrical circuit, including switch terminals extending exteriorly of the block, for driving said display device;
    an electrically conductive fitting frame formed from a single sheet of plate-shaped electrically conductive metal adapted to hold said display device and block together in compression, said frame having front portions which serve to retain the display device and to hold a battery within the block, respectively, fixing fit arm members for providing pressure to hold said display device and block together by engagement with said block, and at least one switch portion adapted to contact with a respective one of said terminals of said electrical circuit; and
    at least one switch member arranged for bringing said switch portion into contact with said respective terminal, whereby said electrically conductive frame serves as a wiring for said electrical circuit.

2. An electronic device according to claim 1, wherein the arm portions of the frame extend from the periphery of front portions of the block, around the block and have claws which hook elastically over edges of the block, thereby to fix the frame to the block.

3. An electronic device according to claim 1 or 2, wherein said switch portion is formed as a plate facing a tip end of the switch member, said switch member being mounted on a case housing said block, and said switch portion extending from an outer edge of the frame.

4. An electronic device according to claim 1, wherein the electrical circuit includes a plurality of electronic parts.

5. An electronic device according to claim 1, further including an enclosure embedding a semiconductor integrated circuit element, the integrated circuit element being electrically connected to the electrical circuit of the block by a plurality of lead conductors.

6. An electronic device according to claim 1, wherein the block is made of resin material.

7. An electronic device according to claim 5, wherein the block and the enclosure are interconnected at least at one portion.

8. An electronic device according to claim 5, wherein the block and the enclosure are spaced from each other, and connected by the plurality of lead conductors.

9. An electronic device according to claim 5, wherein portions of the lead conductors connecting the block and the enclosure are exposed, for connection to the display device.

10. An electronic device according to claim 9, wherein the lead conductors are formed from one sheet of plate-shaped lead frame.

* * * * *